US006919577B2

(12) United States Patent
Watanabe et al.

(10) Patent No.: US 6,919,577 B2
(45) Date of Patent: *Jul. 19, 2005

(54) ELECTRON BEAM EXPOSURE OR SYSTEM INSPECTION OR MEASUREMENT APPARATUS AND ITS METHOD AND HEIGHT DETECTION APPARATUS

(75) Inventors: Masahiro Watanabe, Yokohama (JP); Takashi Hiroi, Yokohama (JP); Maki Tanaka, Yokohama (JP); Hiroyuki Shinada, Chofu (JP); Yasutsugu Usami, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/853,225

(22) Filed: May 26, 2004

(65) Prior Publication Data

US 2004/0217287 A1 Nov. 4, 2004

Related U.S. Application Data

(63) Continuation of application No. 10/012,454, filed on Dec. 12, 2001, now Pat. No. 6,753,518, which is a continuation of application No. 09/642,014, filed on Aug. 21, 2000, now Pat. No. 6,333,510, which is a continuation of application No. 09/132,220, filed on Aug. 11, 1998, now Pat. No. 6,107,637.

(30) Foreign Application Priority Data

Aug. 11, 1997 (JP) ............................................. 9-216604

(51) Int. Cl.[7] .............................................. G01N 21/86
(52) U.S. Cl. .................................. 250/559.4; 250/559.3
(58) Field of Search .......................... 250/559.4, 559.3, 250/559.45, 306, 307, 208.1, 201.3; 356/499, 400, 401

(56) References Cited

U.S. PATENT DOCUMENTS

| 4,468,565 | A |   | 8/1984  | Blair et al.      |           |
|-----------|---|---|---------|-------------------|-----------|
| 4,543,512 | A |   | 9/1985  | Nakasuji et al.   |           |
| 5,125,741 | A | * | 6/1992  | Okada et al.      | 356/237.2 |
| 5,311,288 | A |   | 5/1994  | Shahar            |           |
| 5,598,002 | A |   | 1/1997  | Todokoro et al.   |           |
| 5,614,713 | A |   | 3/1997  | Kobaru et al.     |           |
| 6,107,637 | A |   | 8/2000  | Watanabe et al.   |           |
| 6,333,510 | B1| * | 12/2001 | Watanabe et al.   | 250/559.27|
| 6,753,518 | B2| * | 6/2004  | Watanabe et al.   | 250/201.3 |

FOREIGN PATENT DOCUMENTS

| JP | 58-168906 | 10/1983 |
| JP | 59-195728 | 11/1984 |
| JP | 5-258703  | 10/1993 |

* cited by examiner

Primary Examiner—Que T. Le
(74) Attorney, Agent, or Firm—Antonelli, Terry, Stout & Kraus, LLP

(57) ABSTRACT

An electron beam apparatus including a table which mounts a specimen and is movable in three dimensional directions, an electron beam optical system irradiating an electron beam onto a specimen and for detecting a secondary electron emanated from the specimen by the irradiation of the electron beam, and a surface height detection system for detecting height of the surface of the specimen mounted on the table. A focus control system controls a relative position between a focus position of the electron optical system and the table in accordance with information of the height, and an image processing system obtains an image from the detected secondary electron and processes the obtained image to detect a defect on the surface of the specimen.

17 Claims, 27 Drawing Sheets

Region A (height za)
Region B (height zb)
Region C (height zc)
3 Sample wafer

Electron beam image a of region A (height za)

Electron beam image b of region B (height zb)

Electron beam image c of region C (height zc)

3 Wafer
3a Chip
3e
3d
d1

3c Memory mat portion
3b Peripheral circuit portion 3f  3g
3b
3c
3b
d2

Detected image f1 (x,y)

Compared image g1 (x,y)

Movement stage →

Focus control current

Effective height of sample surface

Detected value of height

Effective height of sample surface

Focus control current

Detected value of height

ELECTRON BEAM EXPOSURE OR SYSTEM INSPECTION OR MEASUREMENT APPARATUS AND ITS METHOD AND HEIGHT DETECTION APPARATUS

CROSS REFERENCE TO RELATED APPLICATION

This is a continuation of U.S. application Ser. No. 10/012,454, filed Dec. 12, 2001, now U.S. Pat. No. 6,753,518, which is a continuation of U.S. application Ser. No. 09/642,014, filed Aug. 21, 2000, now U.S. Pat. No. 6,333,510, which is a continuation of U.S. application Ser. No. 09/132,220, filed Aug. 11, 1998, now U.S. Pat. No. 6,107,637, the subject matter of which is incorporated by reference herein.

BACKGROUND OF THE INVENTION

The present invention relates to an electron beam exposure or system inspection or measurement or processing apparatus having an observation function using charged particle beams such as electron beams or ion beams and its method and an optical height detection apparatus.

Heretofore, a focus of an electron microscope has been adjusted by adjusting a control current of an objective lens while an electron beam image is observed. This process requires a lot of time, and also, a sample surface is scanned by electron beams many times. Accordingly, there is the possibility that a sample will be damaged.

In order to solve the above-mentioned problem, in a prior-art technique (Japanese laid-open patent application No. 5-258703), there is known a method in which a control current of an optimum objective lens relative to a height of a sample surface in several samples are measured in advance before the inspection is started and focuses of respective points are adjusted by interpolating these data when samples are inspected.

In this method, SEM images obtained by changing an objective lens control current at every measurement point are processed, and an objective lens control current by which an image of a highest sharpness is recorded. It takes a lot of time to measure an optimum control current before inspection. Moreover, there is the risk that a sample will be damaged due to the irradiation of electron beams for a long time. Further, there is the problem that a height of a sample surface will be changed depending upon a method of holding a wafer during the inspection.

Moreover, as the prior-art technique of the apparatus for inspecting a height of a sample, there are known Japanese laid-open patent application No. 58-168906 and Japanese laid-open patent application No. 61-74338.

According to the above-mentioned prior art, in the electron beam apparatus, the point in which a clear SEM image without image distortion is detected and a defect of a very small pattern formed on the inspected object like a semiconductor wafer such as ULSI or VLSI is inspected and a dimension of a very small pattern is measured with high accuracy and with high reliability has not been considered sufficiently.

SUMMARY OF THE INVENTION

It is therefore an object of the present invention is to provide an electron beam exposure or system inspection or measurement apparatus and a method thereof in which the image distortion caused by the deflection and the aberration of the electron optical system can be reduced, the decrease of the resolution due to the de-focusing can be reduced so that the quality of the electron beam image (SEM image) can be improved and in which the inspection and the measurement of length based on the electron beam image (SEM image) can be executed with high accuracy and with high reliability.

It is another object of the present invention is to provide an electron beam exposure or system inspection or measurement apparatus and a method thereof in which the height of the surface of the inspected object can be detected real time and the electron optical system can be controlled real time so that an electron beam image (SEM image) of high resolution without image distortion can be obtained by the continuous movement of the stage, an inspection efficiency and its stability can be improved and in which an inspection time can be reduced.

It is a further object of the present invention to provide an electron beam exposure apparatus and a converging ion beam manufacturing apparatus in which very small patterns can be exposed and manufactured without image distortion and with a high resolution.

In order to attain the above-mentioned objects, according to the present invention, there is provided an electron beam system inspection or measurement apparatus which is comprised of a detection apparatus including an electron optical system comprising an electron beam source, a deflection element for deflecting electron beams emitted from the electron beam source, and an objective lens for converging and irradiating electron beams deflected by the deflection element on an inspected object, an electron beam image detection optical system for detecting a secondary electron beam image generated from the inspected object by the electron beams deflected by the electron optical system and converged and irradiated, a projection optical system for projecting a luminous flux of a repetitive light pattern or lattice shape on the inspected object from the oblique upper direction of the inspected object and a detection optical system for detecting the position of an optical image by focusing the luminous flux of the repetitive light pattern which was reflected on the surface of the inspected object by the luminous flux of the repetitive light pattern projected by the projection optical system, an optical height detection apparatus arranged so as to optically detect a height of the surface in an area on the inspected object based on the change of the position of an optical image composed of a luminous flux of the repetitive light pattern detected by the detection optical system, a focus controller for focusing electron beams on the inspected object in a properly-focused state by controlling a current flowed to or a voltage applied to an objective lens of the electron optical system on the basis of the height of the surface on the inspected object detected by the optical height detection apparatus and an image processor for inspecting or measuring a pattern formed on the inspected object on the basis of the secondary electron beam image detected by the electron beam image detection optical system.

In accordance with the present invention, there is provided an electron beam apparatus comprising a pattern writing apparatus including an electron optical system comprising an electron beam source, a deflection element for deflecting electron beams emitted from the electron beam source, and an objective lens for converging and irradiating electron beams deflected by deflection element on a processed object, a projection optical system for projecting a luminous flux a repetitive light pattern on the processed object from an oblique upper direction of the processed object and a detection optical system for detecting the position of an optical image by focusing the luminous flux of the repetitive light pattern which was reflected on a surface of the processed object by the luminous flux of the repetitive light pattern projected by the projection optical system, an optical height detection apparatus arranged so as to optically detect a height of the surface in an area on the processed object based on the change of the position of an optical image composed of the luminous flux of the repetitive light pattern detected by the detection optical system, and a focus controller for focusing electron beams on the processed object in a properly-focused state by controlling a current flowed to or a voltage applied to the objective lens of the electron optical system on the basis of the height of the surface on the inspected object detected by the optical height detection apparatus.

Further, according to the another feature present invention, there is provided an electron beam system inspection or measurement apparatus which is comprised of a detection apparatus including an electron optical system comprising an electron beam source, a deflection element for deflecting electron beams emitted from the electron beam source, and an objective lens for converging and irradiating electron beams deflected by the deflection element on an inspected object, an electron beam image detection optical system for detecting a secondary electron beam image generated from the inspected object by the electron beams deflected by the electron optical system and converged and irradiated, an optical height detection apparatus for optically detecting a height of a surface in an area on the inspected object irradiated by electron beams deflected and converged by the electron optical system, a focus controller for focusing electron beams on the inspected object in a properly-focused state by controlling a current flowed to or a voltage applied to the objective lens of the electron optical system on the basis of the height of the surface on the inspected object detected by the optical height detection apparatus, a deflection controller for correcting an image distortion containing a magnification error of electron beams generated on the basis of the focus control by correcting a deflection amount of the electron optical system to the deflection element on the basis of the height of the surface on the inspected object detected by the optical height detection apparatus, and an image processor for inspecting or measuring a pattern formed on the inspected object on the basis of a secondary electron beam image detected by the electron beam detection optical system.

In accordance with the present invention, there is provided an electron beam system inspection or measurement apparatus which is comprised of an electron optical system including an electron beam source, a deflection element for deflecting electron beams emitted from the electron beam source and an objective lens for converging and irradiating electron beams deflected by the deflection element on the inspected object, an electron beam image detection system for detecting a secondary electron beam image generated from the inspected object by the electron beams deflected and converged by the electron optical system, an optical height detection apparatus for optically detecting a height of a surface in an area on the inspected object irradiated by electron beams deflected and converged by the electron optical system, a focus controller for calculating a focus control current or a focus control voltage based on a correction parameter between a height of a surface on the inspected object and a focus control current or a focus control voltage from a height of a surface on the inspected object detected by the optical height detection apparatus and converging electron beams on the inspected object in a properly-focused state by supplying the calculated focus control current or focus control voltage to an objective lens of the electron optical system, and an image processor for inspecting or measuring a pattern formed on the inspected object on the basis of a secondary electron beam image detected by the electron beams image detection optical system.

The present invention also provides that the electron beam system inspection or measurement apparatus further includes a deflection controller for correcting an image distortion containing a magnification error of an electron beam image generated on the basis of the focus control by correcting a deflection amount of the electron optical system to a deflection element on the basis of a height of a surface on the inspected object detected by the optical height detection apparatus.

According to another feature of the present invention, there is provided an electron beam system inspection or measurement apparatus which is comprised of an electron optical system including an electron beam source, a deflection element for deflecting electron beams emitted from the electron beam source and an objective lens for converging and irradiating electron beams deflected by the deflection element on the inspected object, an electron beam image detection system for detecting a secondary electron beam image generated from the inspected object by the electron beams deflected and converged by the electron optical system, an optical height detection apparatus for optically detecting a height of a surface in a place in which a focus control delay is shifted in an area on the inspected object irradiated with electron beams by the electron optical system, a focus controller for calculating a focus control current or a focus control voltage based on a correction parameter between a height of a surface on the inspected object and a focus control current or a focus control voltage from a height of a surface on the inspected object detected by the optical height detection apparatus and converging electron beams on the inspected object in a properly-focused state by supplying the calculated focus control current or focus control voltage to an objective lens of the electron optical system, and an image processor for inspecting or measuring a pattern formed on the inspected object on the basis of a secondary electron beam image detected by the electron beam image detection optical system.

According to the present invention, the electron beam system inspection or measurement apparatus further includes a deflection controller for correcting an image distortion containing a magnification error of an electron beam image generated on the focus control by correcting a deflection amount of the electron optical system to a deflection element on the basis of a height of a surface in a place in which a focus control delay is shifted on the inspected object detected by the optical height detection apparatus.

Further, according to the present invention, there is provided an electron beam system inspection or measurement apparatus which is comprised of an electron optical system including an electron beam source, a deflection element for deflecting electron beams emitted from the electron beam source and an objective lens for converging and irradiating electron beams deflected by the deflection element on the inspected object, an electron beam image detection system for detecting a secondary electron beam image generated from the inspected object by the electron beams deflected and converged by the electron optical system, an optical height detection apparatus for optically detecting a height of a surface in a place in which a position displacement corrected amount is shifted in an area on the inspected object irradiated with electron beams by the electron optical system, a focus controller for calculating a focus control current or a focus control voltage based on a correction parameter between a height of a surface on the inspected object and a focus control current or a focus control voltage from a height of a surface in which a position displacement corrected amount is shifted in an area on the inspected object detected by the optical height detection apparatus and converging electron beams on the inspected object in a properly-focused state by supplying the calculated focus control current or focus control voltage to an objective lens of the electron optical system, and an image processor for inspecting or measuring a pattern formed on the inspected object on the basis of a secondary electron beam image detected by the electron beams image detection optical system.

According to the present invention, the electron beam system inspection or measurement apparatus further includes deflection controller for correcting an image distortion containing a magnification error of an electron beam image generated on said focus control by correcting a deflection amount of said electron optical system to a deflection element on the basis of a height of a surface in a place in which a position displacement correction amount is shifted on the inspected object detected by the optical height detection apparatus.

Further, according to the present invention, the optical height detection apparatus in the electron beam system inspection or measurement apparatus includes a projection optical system for projecting a luminous flux of linear or lattice shape or a repetitive light pattern on the inspected object from the oblique upper direction of the inspected object and a detection optical system for detecting a position of an optical image by focusing a luminous flux reflected on the surface of the inspected object by the luminous flux projected by the projection optical system, and in which a height of a surface of the inspected object is detected on the basis of the change of the position of an optical image detected by the detection optical system.

Additionally, according to the present invention, the optical height detection apparatus in the electron beam system inspection or measurement apparatus includes a plurality of projection optical systems for projecting a luminous flux of linear or lattice shape or repetitive light pattern on the inspected object from the oblique upper direction of the inspected object and detection optical systems for detecting a position of an optical image by focusing a luminous flux reflected on the surface of the inspected object by the luminous flux projected by the projection optical systems disposed symmetrically with respect to an optical axis of the electron optical system, and in which position changes of optical images detected by the respective detection optical systems are synthesized and a height of a surface of the inspected object is detected on the basis of the position change of the synthesized optical image.

Further, according to the present invention, white light is used as the luminous flux projected by the projection optical system in the optical height detection apparatus of the electron beam system inspection or measurement apparatus. Further, according to the present invention, S-polarized light is used as the luminous flux projected by the projection optical system in the optical height detection apparatus of the electron beam system inspection or measurement apparatus.

According to the present invention, there is also provided an electron beam system inspection or measurement apparatus which is comprised of a detection apparatus including an electron optical system comprising an electron beam source, a deflection element for deflecting electron beams emitted from the electron beam source, and an objective lens for converging and irradiating electron beams deflected by the deflection element on an inspected object, an electron beam image detection optical system for detecting a secondary electron beam image generated from the inspected object by the electron beams deflected by the electron optical system and converged and irradiated, a projection optical system for projecting a luminous flux of lattice shape or a repetitive light pattern on the inspected object from the oblique upper direction of the inspected object and a detection optical system for detecting the position of an optical image by focusing the luminous flux of lattice shape or repetitive light pattern which was reflected on the surface of the inspected object by the luminous flux of lattice shape or repetitive light pattern projected by the projection optical system, an optical height detection apparatus arranged so as to optically detect a height of the surface in an area on the inspected object based on the change of the position of an optical image composed of a luminous flux of lattice shape or repetitive light pattern detected by the detection optical system, a focus controller for focusing electron beams on the inspected object in a properly-focused state by controlling a relative position of a height direction between a focus position obtained by the electron optical system and a table for holding the inspected object on the basis of the height of the surface on the inspected object detected by the optical height detection apparatus and an image processor for inspecting or measuring a pattern formed on the inspected object on the basis of the secondary electron beam image detected by the electron beam image detection optical system.

According to other features of the present invention, there is provided an electron beam system inspection or measurement method which is comprised of the steps of moving an inspected object at least in a predetermined direction, optically detecting a height of a surface in an area on the inspected object irradiated with electron beams from an optical height detection apparatus on the basis of the change of the position of an optical image composed of a luminous flux of a repetitive light pattern or lattice shape, deflecting electron beams emitted from an electron beam source by a deflection element of an electron optical system and focusing the same on the inspected object by controlling a current flowed to or a voltage applied to an objective lens of the electron optical system based on the height of the surface on the detected inspected object in a properly-focused state, detecting a secondary electron beam image generated from the inspected object by irradiated electron beams deflected and focused in a properly-focused state by an electron beam image detection optical system, and inspecting or measuring a pattern formed on the inspected object based on the detected secondary electron beam image.

Further, according to additional features the present invention, there is provided an electron beam system inspection or measurement method comprising the steps of moving an inspected object at least in a predetermined direction, optically detecting a height of a surface in an area on the inspected object irradiated with electron beams by an optical height detection apparatus, deflecting election beams emitted from an electron beams source by a deflection element of an electron optical system by controlling a current flowed to or a voltage applied to an objective lens of the electron optical system on the basis of the height of the surface on the detected inspected object such that the election beams are converged on the inspected object in a properly-focused state, correcting an image distortion containing a magnification error of an electron beam image generated based on the focus control by correcting a deflection amount to a deflection element of the electron optical system, detecting a secondary electron beam image generated from the inspected object by electron beams corrected, deflected, converged in a properly-focused state and irradiated by means of an electron beam detection optical system, and inspecting or measuring a pattern formed on the inspected object on the basis of the detected secondary electron beam image.

According to the present invention, there is provided an electron beam system inspection or measurement method which is comprised of the steps of moving the inspected object at least in a predetermined direction, optically detecting a height of a surface in an area on an inspected object irradiated with electron beams from an optical height detection apparatus, calculating a focus control current or a focus control voltage on the basis of a correction parameter between the height of the surface on the inspected object and a focus control current or a focus control voltage, deflecting electron beams emitted from the electron beam source and focusing the same on the inspected object in a properly-focused state by supplying the calculated focus control current or focus control voltage to an objective lens of the electron optical system, detecting a secondary electron beam image generated from the inspected object by irradiated electron beams deflected and focused in a properly-focused state by an electron beam image detection optical system, and inspecting or measuring a pattern formed on the inspected object on the basis of the detected secondary electron beam image.

Further, according to the present invention, the electron beam system inspection or measurement method further includes the step of correcting an image distortion containing a magnification error of an electron beam image generated on the basis of the focus control by correcting a deflection amount of a deflection element of the electron optical system on the basis of a height of a surface on the detected inspected object.

Additionally, according to the present invention, there is provided an electron beam system inspection or measurement method which is comprised of the steps of moving an inspected object at least in a predetermined direction, optically detecting a height of a surface in an area on the inspected object irradiated with electron beams by an optical height detection apparatus, calculating a focus control current or a focus control voltage on basis of a correction parameter between the height of the surface on the inspected object and a focus control current or a focus control voltage from a height of a surface in a place in which a focus control delay on the detected inspected object is shifted, deflecting electron beams emitted from an electron beam source by a deflection element of an electron optical system and focusing the same on the inspected object in a properly-focused state by supplying the calculated focus control current or focus control voltage to an objective lens of the electron optical system, detecting a secondary electron beam image generated from the inspected object with irradiated electron beams deflected and focused in a properly-focused state by an electron beam image detection optical system, and inspecting or measuring a pattern formed on the inspected object on the basis of the detected secondary electron beam image.

There is provided an electron beam system inspection or measurement method which is comprised of the steps of moving an inspected object at least in a predetermined direction, optically detecting a height of a surface in an area on the inspected object irradiated with electron beams by an optical height detection apparatus, calculating a focus control current or a focus control voltage on basis of a correction parameter between the height of the surface on the inspected object and a focus control current or a focus control voltage from a height of a surface in a place in which a position displacement corrected amount on the detected inspected object is shifted, deflecting electron beams emitted from an electron beam source by a deflection element of an electron optical system and focusing the same on the inspected object in a properly-focused state by supplying the calculated focus control current or focus control voltage to an objective lens of the electron optical system, detecting a secondary electron beam image generated from the inspected object with irradiated electron beams deflected and focused in a properly-focused state by an electron beam image detection optical system, and inspecting or measuring a pattern formed on the inspected object on the basis of the detected secondary electron beam image.

In accordance with the present invention, there is also provided an electron beam system inspection or measurement method which is comprised of the steps of moving an inspected object at least in a predetermined direction, optically detecting a height of a surface in an area on the inspected object irradiated with electron beams from an optical height detection apparatus, deflecting electron beams emitted from an electron beam source by a deflection element of an electron optical system and focusing the same on the inspected object in a properly-focused state by controlling a relative position of a height direction between a focus position of an electron optical system and a table for holding the inspected object on the basis of a height of a surface on the detected inspected object, detecting a secondary electron beam image generated from the inspected object by irradiated electron beams deflected and focused in a properly-focused state by an electron beam image detection optical system, and inspecting or measuring a pattern formed on the inspected object on the basis of the detected secondary electron beam image.

Further, according to the present invention, there is provided an optical height detection apparatus which is comprised of a plurality of projection optical systems for projecting a luminous flux of linear or lattice shape or repetitive light pattern on the inspected object from the oblique upper direction of the inspected object and detection optical systems for detecting a position of an optical image by focusing a luminous flux reflected on the surface of the inspected object by the luminous flux projected by the projection optical systems disposed symmetrically with respect to a predetermined optical axis, and in which position changes of optical images detected by the respective detection optical systems are synthesized and a height of a surface of the inspected object is detected on the basis of the position change of the synthesized optical image.

Other features of the present invention include that in the optical height detection apparatus, a one-dimensional or two-dimensional image sensor is used as a detector for detecting the change of the position of the optical image. Further, as the detector for detecting the change of the position of the optical image, a mask having a transmission pattern similar to a projection pattern is vibrated and a photoelectric detector such as a photodiode is disposed behind the mask, whereby the change of the position is detected by a synchronizing-detection. Additionally, a shape formed by repeatedly arranging a plurality of rectangular patterns is used as a shape of luminous flux projected onto an object. Also, white light is used as a luminous flux projected onto an object. Further, a luminous flux is projected onto an object with an angle greater than 60 degrees and S-polarized light is used as a luminous flux projected onto an object. Further, the optical height detection apparatus includes two height detectors, and the two height detectors are disposed symmetrically with respect to a normal from a measured position on an object. Height detection values of the two height detectors are combined so that a height of the same observation position on the object can be constantly detected with high accuracy regardless of the change of the height of the object, the change of the inclination or the surface state of the object. Also, in the optical height detection apparatus, one or a plurality of height measurement patterns are selected from a plurality of pattern images and a height is measured by using these patterns, whereby a height measurement position on the object can be selected. Further, not only a height of an object but also an inclination thereof is detected by an image formed by arranging a plurality of rectangular patterns, and at least one of a height measurement position on the object and a detection error caused by the inclination of the object is corrected by using this information. Additionally, a height distribution on the cross-section of the object is detected by using an image formed by arranging a plurality of rectangular patterns. Further, the image in which a plurality of rectangular patterns are arranged is detected and processed by a two-dimensional image sensor or an arrangement in which a plurality of one-dimensional image sensors are disposed in parallel, whereby a height distribution of a two-dimensional surface of an object can be detected.

According to the present invention, there is also provided an electron beam system automatic inspection apparatus which is comprised of an electron optical system for converging electrons emitted from an electron source on a focus, an observer for observing an arbitrary position at which an inspected object is brought by a stage for holding the inspected object and which can be moved within a plane through the electron optical system, a detector for continuously detecting a height of the inspected object in an observation area of the electron optical system by an optical method, and a positioner for constantly maintaining a relative position between a focus position of an electron beam image and the inspected object by using a result of height detection and wherein an automatic inspection can be executed by processing the resultant properly-focused electron beam image to detect a defect.

Further, according to the present invention, there is provided an electron beam system automatic inspection method which is comprised of an electron optical system for converging electrons emitted from an electron source on a focus, an observer for observing an arbitrary position at which an inspected object is brought by a stage for holding the inspected object and which can be moved within a plane through the electron optical system, a detector for continuously detecting a height of the inspected object in an observation area of the electron optical system by an optical method, and a positioner for constantly maintaining a relative position between a focus position of an electron beam image and the inspected object by using a result of height detection and wherein an automatic inspection can be executed by processing the resultant properly-focused electron beam image to detect a defect.

In accordance with the present invention, the electron beam system automatic inspection apparatus also includes two height detectors. The two height detectors are disposed symmetrical with respect to a normal from an observation position of an electron optical system on an object. Height detection values of the two height detectors are synthesized so that the height of the observation position of the electron optical system on the object can constantly be detected with high accuracy regardless of the change of the height of the object, the change of the inclination, or the surface state of the object. The electron beam system automatic inspection apparatus includes a positioner for constantly maintaining a relative position between the focus position of the electron beam image and the inspected object by using a result of height detection, and in which the automatic inspection can be executed by processing the resultant properly-focused electron beam to detect a defect. Further, according to the present invention, in the electron beam system automatic inspection apparatus, one or a plurality of slits used to measure a height are selected from a plurality of rectangular pattern images and a height is measured by using these slits to thereby select the height measurement position on the object. Thus, the stage scanning and a detection time delay of a height detector or a measurement position displacement caused by an adjustment error of an optical system can be corrected. Further, according to the present invention, in the electron beam system automatic inspection apparatus, not only a height of an object but also an inclination thereof is detected by an image formed by arranging a plurality of rectangular patterns, and at least one of a height measurement position on the object and a detection error caused by the inclination of the object is corrected by using this information. Further, according to the present invention, in the electron beam system automatic inspection apparatus, a height distribution on the cross-section of the object is detected by using an image formed by arranging a plurality of rectangular patterns, and electron beams are properly focused on an arbitrary area of the object by using this information. Further, according to the present invention, in the electron beam system automatic inspection apparatus, the image in which a plurality of rectangular patterns are arranged is detected and processed by a two-dimensional image sensor or an arrangement in which a plurality of one-dimensional image sensors are disposed in parallel, whereby a height distribution of a two-dimensional surface of an object can be detected, and electron beams are properly focused by using this information. Further, according to the present invention, the electron beam system automatic inspection apparatus has a function to control the focus position of the electron beams relative to the scanning of the stage at a sufficiently high speed by the arrangement of the electron optical system, an objective lens or an electrostatic lens or a condenser lens or a combination of one or a plurality of means of a deflection system. By using the inspected object surface height obtained from the optical height detection apparatus, an electron beam image can be obtained under the condition that the relative position between the surface of the inspected object and the focus position of the electron beam can be maintained constant. Further, according to the present invention, the electron beam system automatic inspection apparatus has a function to control the focus position of the electron beams relative to the scanning of the stage at a sufficiently high speed by the arrangement of the electron optical system, an objective lens or an electrostatic lens or a condenser lens or a combination of one or a plurality of means of a deflection system. By using the inspected object surface shape distribution obtained from the optical height detection apparatus, an electron beam image can be obtained under the condition that the relative position between the inspected object surface shape and the orbit of the focus position of the electron beam can be maintained constant. Further, according to the present invention, the electron beam system automatic inspection apparatus includes a Z stage which can finely adjust the height of the surface of the inspected object at a sufficiently high speed, and an electron beam image in which the relative position between the surface of the inspected object and the focus position of the electron beam can be maintained constant can be constantly obtained by using the inspected surface height obtained from the optical height detection apparatus.

Further, the present invention utilizes a correction standard pattern made of a stable material which can be prevented from being affected with the irradiation of charged particle beams, the surface of which has a pattern that can be observed by a charged particle optical system and which has at least more than two stepped differences or inclinations of which height differences are clear. Further, the present invention is a height detection apparatus and a charged particle optical system correction method using the above-mentioned standard pattern fixed to a stage for holding an inspected object. Further, the present invention is an electron beam system automatic inspection apparatus capable of correcting a height detection apparatus and an electron optical system by using the above-mentioned standard pattern fixed to a stage for moving an inspected object. Furthermore, the present invention is an electron beam system automatic inspection apparatus including an electron optical system capable of changing a deflection amount of electron beams in real time in response to a fluctuation of a height of a sample surface and which has a function to correct a magnification based on a fluctuation of an inspected object surface as well as to adjust the focus of electron beams. Furthermore, the present invention is characterized by the application to apparatus (electron beam system length measuring apparatus, scanning electron microscope, electron beam exposing apparatus, converging ion beam manufacturing apparatus) using a charged particle optical system of the above-mentioned height detection apparatus.

As described above, according to the above-mentioned arrangement, without being affected by the surface state of the inspected object, the image distortion caused by the deflection and the aberration of the electron optical system can be reduced and the decrease of the resolution due to the de-focusing can be reduced so that the quality of the electron beam image (SEM image) can be improved. Thus, the inspection and the measurement of length based on the electron beam image (SEM image) can be executed with high accuracy and with high reliability.

Furthermore, according to the above-mentioned arrangement, since the height of the surface of the inspected object can be detected in real time and the electron optical system can be controlled in real time, an electron beam image (SEM image) of high resolution without image distortion can be obtained by the continuous movement of the stage, and the inspection can be executed. Hence, an inspection efficiency and its stability can be improved. In addition, an inspection time can be reduced.

These and other objects, features and advantages of the present invention will become more apparent from the following description when taken in conjunction with the accompanying drawings.

BRIEF DESCRIPTION OF THE DRAWINGS

FIG. 12 is a diagram used to explain a detection error caused by a multiple reflection on a transparent film such as an insulating film existing on a semiconductor wafer or the like.

FIG. 13 shows a graph graphing the change of a reflectance versus an incident angle in silicon and resist (a transparent film such as an insulating film) existing on a semiconductor wafer or the like.

DESCRIPTION OF THE PREFERRED EMBODIMENTS

An embodiment of an automatic inspection system for inspecting/measuring a micro-circuit pattern formed on a semiconductor wafer which is an inspected object according to the present invention will be described. A defect inspection of the micro-circuit pattern formed on the semiconductor wafer or the like is executed by comparing inspected patterns and good pattern and patterns of the same kind on the inspected wafer. Also in the case of an appearance inspection using an electron microscope image (SEM image), a defect inspection is executed by comparing pattern images. Furthermore, also in the case of the length measurement (SEM length measurement) executed by a scanning-type electron microscope which measures a line width or a hole diameter of a micro-circuit pattern used to set or monitor a manufacturing process condition of semiconductor devices, the length measurement can be automatically executed by the image processing.

In the comparison inspection for detecting a defect by comparing electron beam images of a similar pattern or when a line width of a pattern is measured by processing an electron beam image, a quality of an obtained electron beam image exerts a serious influence upon the reliability of the inspected results. The quality of electron beam image is deteriorated by an image distortion caused by deflection and aberration of an electron optical system and is also deteriorated as resolution is lowered by a de-focusing. The deterioration of the image quality lowers a comparison and inspection efficiency and a length measurement efficiency.

Figure 1A:
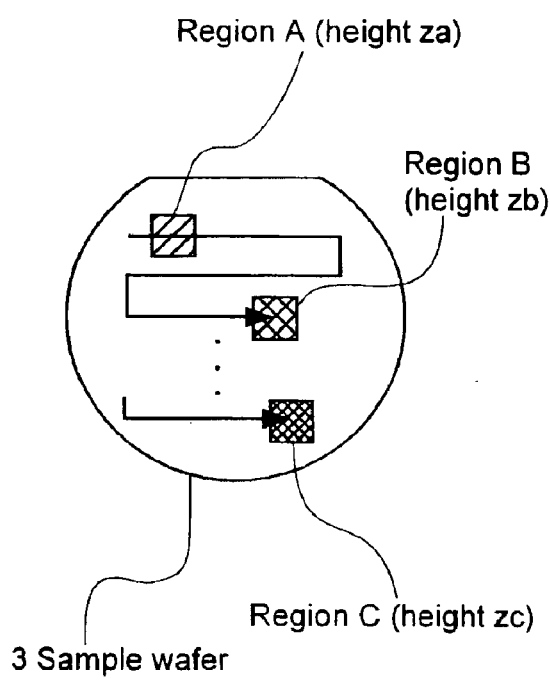
FIGS. 1(a)–1(d) show a semiconductor wafer and image obtained at different areas thereof so as to explain that electron beams need be focused on an inspected object such as a semiconductor wafer in an electron beam inspection according to the present invention.
Figure 1B:
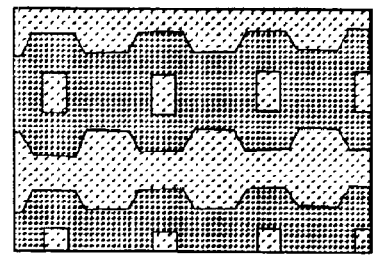
Figure 1C:
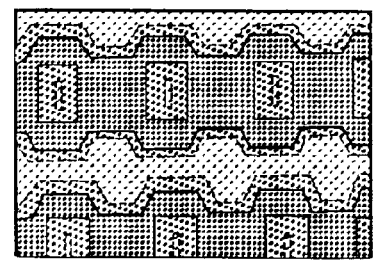
Figure 1D:
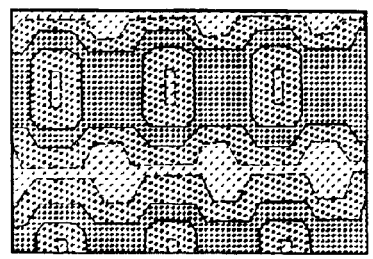

Referring now to the drawings, a height of a surface of an inspected object is not even and an inspection is executed over the whole range of heights under the same condition for a wafer as shown in FIG. 1(a), then as shown in FIGS. 1(b)–(d), electron beam images (SEM images) are changed in accordance with the inspection portions (area A, area B, area C). As a result, if an inspection is carried out by comparing an image (electron beam image of area A (height za) of a properly-focused point shown in FIG. 1(b), a de-focused image (electron beam image of area B (height zb) shown in FIG. 1(c), and a defocused image (electron beam image of area C (height zc) shown in FIG. 1(d), then a correct inspected result cannot be obtained. Moreover, in these images, the width of the pattern is changed, and an edge detected result of an image cannot be obtained stably so that the line width and the hole diameter of the pattern also cannot be measured stably.

Figure 2:
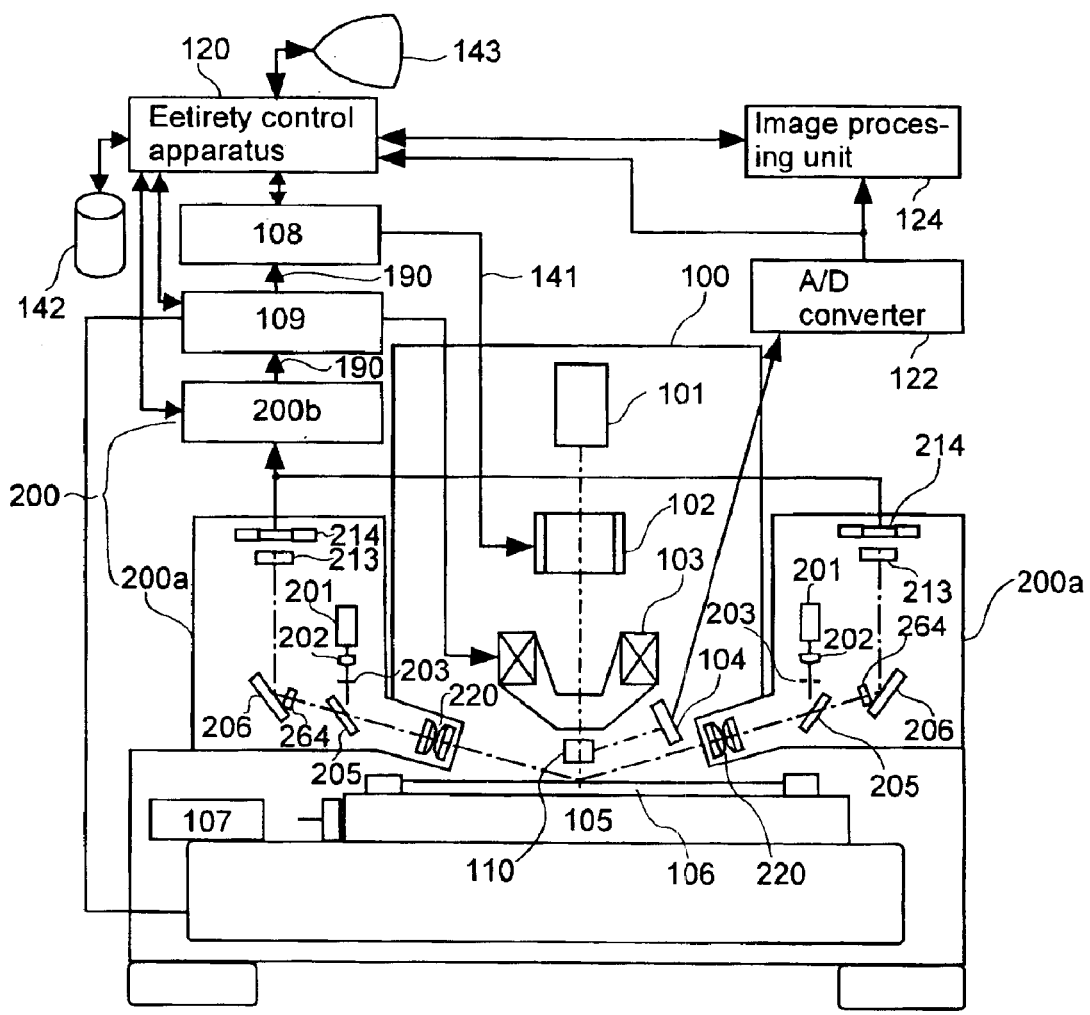
FIG. 2 is a schematic diagram of an electron beam apparatus (SEM apparatus) according to an embodiment of the present invention.

An electron beam apparatus according to an embodiment of the present invention will be described with reference to FIG. 2. An electron beam apparatus 100 composed of an electron beam column for irradiating electron beams on an inspected object (sample) 106 comprises an electron beam source 101 for emitting electron beams, a deflection element 102 for deflecting electron beams emitted from the electron beam source 101 in a two-dimensional fashion, and an objective lens 103 which is controlled so as to focus the electron beam on the sample 106. Specifically, the electron beam emitted from the electron beam source 101 is passed through the deflection element 102 and the objective lens 103 and focused on the sample 106. The sample 106 rests on an XY stage 105 and the position thereof is measured by a laser length measuring system 107. Further, in the case of an SEM apparatus, a secondary electron emitted from the sample 106 is detected by a secondary electron detector 104, and a detected secondary electron signal is converted by an A/D converter 122 into an SEM image. The SEM image thus converted is processed by an image processing unit 124. In the case of the length measuring SEM, for example, the image processing unit 124 measures a distance between patterns of a designated image. Also, in the case of an observation SEM (appearance inspection based on the SEM image), the image processing unit 124 executes a processing such as emphasis of the image or the like. The secondary electron includes a secondary electron with a higher energy level which is sometimes called a back-scattered electron. From the viewpoint of forming scanning electron images, it is not meaningful to discriminate between the back-scattered electron and the secondary electron.

In accordance with the present invention, an electron beam image is prevented from being deteriorated in the above-mentioned electron beam apparatus (observation SEM apparatus, length measuring SEM apparatus).

The quality of the electron beam image is deteriorated due to image distortion caused by deflection and aberration of the electron optical system, and a resolution is lowered by de-focusing. For preventing the image quality from being deteriorated, the present invention provides, as shown in FIG. 2, a height detection apparatus 200 composed of a height detection optical apparatus 200a and a height calculating unit 200b, a focus control apparatus 109, a deflection signal generating apparatus 108, and an entirety control apparatus 120.

The height detection apparatus 200 composed of the height detection optical apparatus 200a and the height calculating unit 200b is arranged substantially similarly to a second embodiment which will be described later, and is installed about an optical axis 110 of an electron beam symmetrically with respect to the sample 106. An illumination optical system of each height detection optical apparatus 200a comprises a light source 201, a condenser lens 202, a mask 203 with a multi-slit pattern, a half mirror 205, and a projection/detection lens 220. A detection optical system of each height detection optical apparatus 200a comprises a projection/detection lens 220, a magnifying lens 264 for focusing an intermediate multi-slit image focused by the projection/detection lens 220 on a line image sensor 214 in an enlarged scale, a mirror 206, a cylindrical lens (cylindrical lens) 213, and a line image sensor 214.

By the illumination optical system of the respective height detection optical apparatus which is installed symmetrically, a multi-slit shaped pattern is projected at the measurement position on the sample 106 for detecting an SEM image with the above-mentioned irradiation of electron beams. This regularly-reflected image is focused by the detection optical system of each height detection optical apparatus 200a and thereby detected as a multi-slit image. Specifically, since the height detection optical apparatus 200a projects and detects patterns of multi-slit shape from the left and right symmetrical directions and the height calculating unit 200b constantly obtains a height of a constant point 110 by averaging both detected values, it is necessary to locate a pair of height detection optical apparatus 200a in the left and right directions. Initially, a light beam emitted from the light source 201 is converged by the condenser lens 202 in such a manner that a light source image is focused at the pupil of the projection/detection lens. This light beam further illuminates the mask 203 on which the multi-slit shaped pattern is formed. Of the light beams, the light beam that was reflected on the half mirror 205 is projected by the projection/detection lens 220 onto the sample 106. The multi-slit pattern that was projected onto the sample is regularly reflected and passed through the projection/detection lens 220 of the opposite side. Then, the light beam passed through the half mirror 205 is focused in front of the magnifying lens 264. This intermediate image is focused on the line image sensor 214 by the magnifying lens 264. At that time, of the luminous flux, the portion that was passed through the half mirror 205 is focused on the line image sensor 214. In this embodiment, the cylindrical lens 213 is disposed ahead of the line image sensor 214 to compress the longitudinal direction of the slit and thereby the light beam is converged on the line image sensor 214. Assuming that m is a magnification of the detection optical system, then when the height of the sample is changed by z, a multi-slit image is shifted by 2 mz·sin θ on the whole. By utilizing this fact, the height calculating unit 200b calculates a shift amount of the multi-slit image from a signal of a multi-slit image detected from the detection optical system of each height detection optical apparatus 200a, calculates a height of a sample from the calculated shift amount of the multi-slit image, and obtains a height on the electron beam optical axis 110 on the sample by averaging these calculated heights of the sample. Specifically, the height calculating means 200b calculates the height of the sample 106 from the shift amounts of the right and left multi-slit images. Here, an average value therebetween is calculated by using the height detected values obtained from the right and left detection system 200a, and is set to a height detection value at the final point 110. The position 110 at which the height is to be detected becomes an optical axis of the upper observation system.

Figure 10:
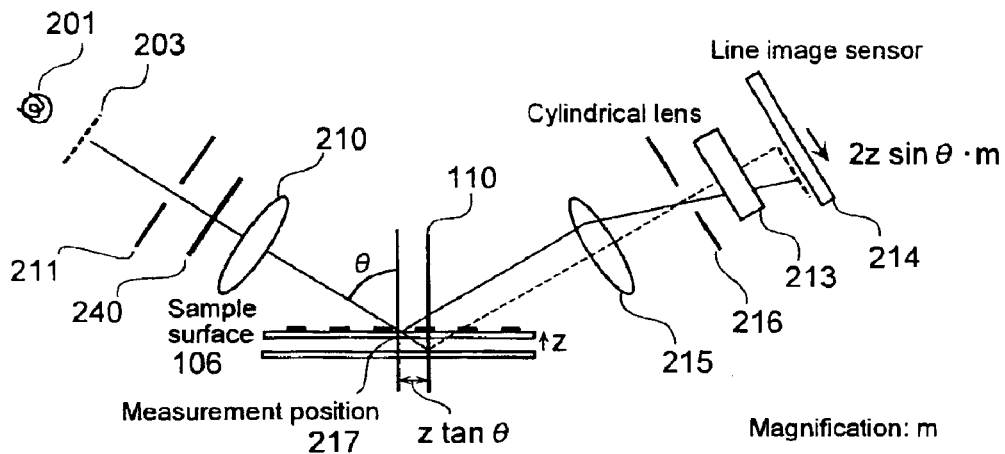
FIG. 10 shows a height detection optical apparatus according to an embodiment of the present invention.
Figure 15:
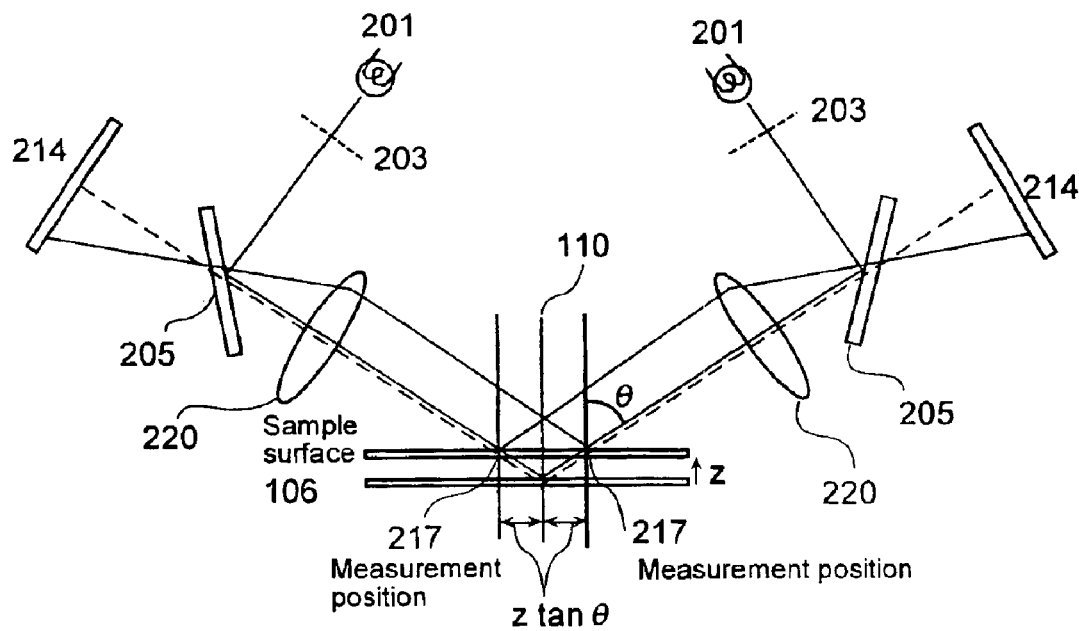
FIG. 15 shows an arrangement in which a measured position displacement is canceled out by both-side projections of a height detection optical apparatus in a height detection apparatus according to a second embodiment of the present invention.
Figure 16:
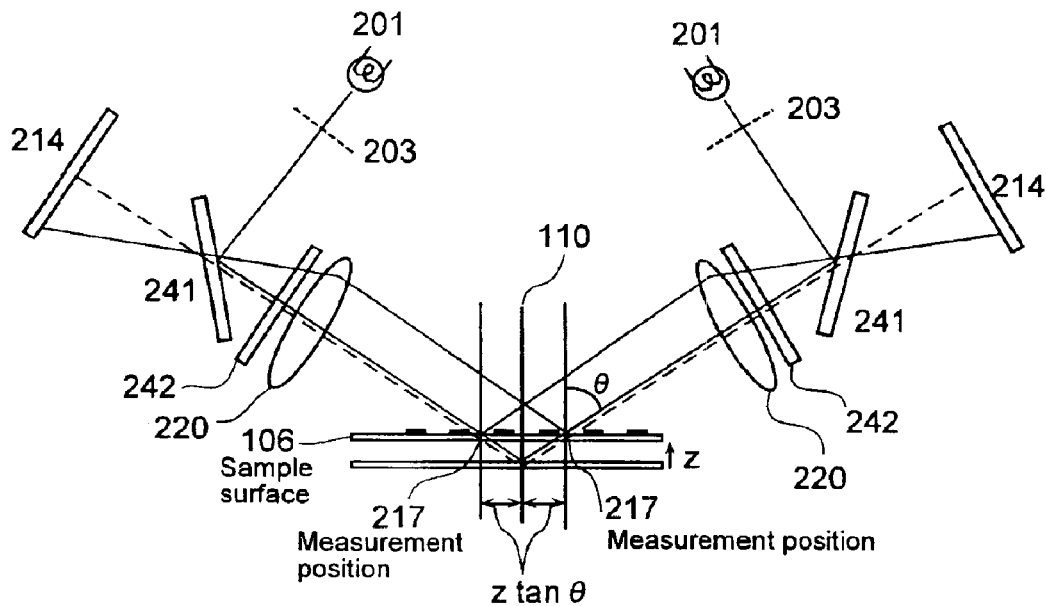
FIG. 16 shows an arrangement in which a detection error is reduced by a polarizing plate of a height detection optical apparatus in a height detection apparatus according to a third embodiment of the present invention.
Figure 17:
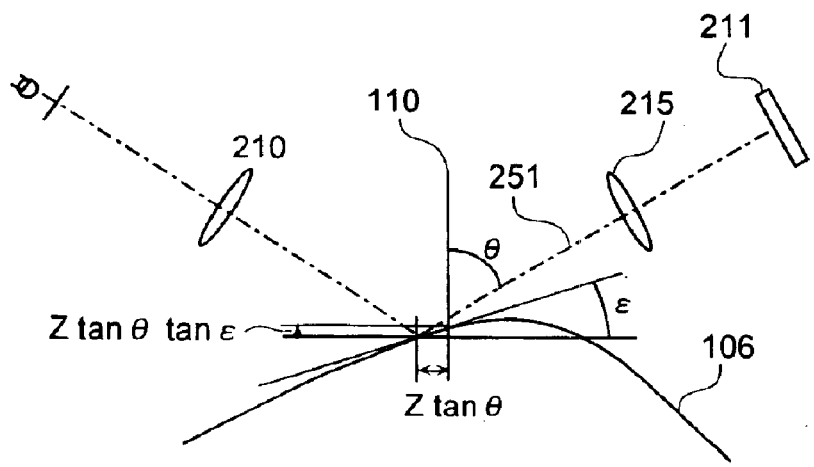
FIG. 17 is a diagram used to explain the manner in which a detection error caused by a detection position displacement when a sample is inclined in the height detection optical apparatus according to the present invention.

Incidentally, while the height detection optical apparatus 200a is arranged substantially similarly to a second embodiment as shown in FIG. 15 as described above, it is apparent that the optical system according to the first embodiment as shown in FIG. 10 or an optical system according to a third embodiment as shown in FIG. 16 or optical systems according to embodiments as shown in FIGS. 25, 26, 27, 30 may be used.

The focus control apparatus 109 drives and controls an electromagnetic lens or an electrostatic lens on the basis of height data 190 obtained from the height calculating unit 200b to thereby focus an electron beam on the surface of the sample 106.

A deflection signal generating apparatus 108 generates the deflection signal 141 to the deflection element 102. At that time, the deflection signal generating apparatus 108 corrects the deflection signal 141 on the basis of the height data obtained from the height calculating unit 200b in such a manner as to compensate for an image magnification fluctuation caused by the fluctuation of the height of the surface of the sample 106 and an image rotation caused by the control of the electromagnetic lens 103. Incidentally, if an electrostatic lens is used as the objective lens 103 instead of the electromagnetic lens, then the image rotation caused when the focus is controlled does not occur so that the image rotation need not be corrected by the height data 190. Further, if lens 103 is comprised of a combination of an electromagnetic lens and an electrostatic lens, the electromagnetic lens has a main converging action and the electrostatic lens adjusts the focus position, then the image rotation, of course, need not be corrected by the height data 190.

Further, instead of directly controlling the focus position of the electromagnetic lens or the electrostatic lens 103 by the focus control apparatus 109 under the condition that the stage 105 is used as an XYZ stage, the height of the stage 105 may be controlled.

The entirety control apparatus 120 controls the whole of the electron beam apparatus (SEM apparatus), displays a processed result processed by the image processing apparatus 124 on a display 143 or stores the same in a memory 142 together with coordinate data for the sample. Also, the entirety control apparatus 120 controls the height calculating unit 200b, the focus control apparatus 109 and the deflection signal generating apparatus 108 thereby to realize a high-speed auto focus control in the electron beam apparatus and an image magnification correction and an image rotation correction caused by this focus control. Furthermore, the entirety control apparatus 120 executes a correction of a height detected value, which will be described later.

Figure 3:
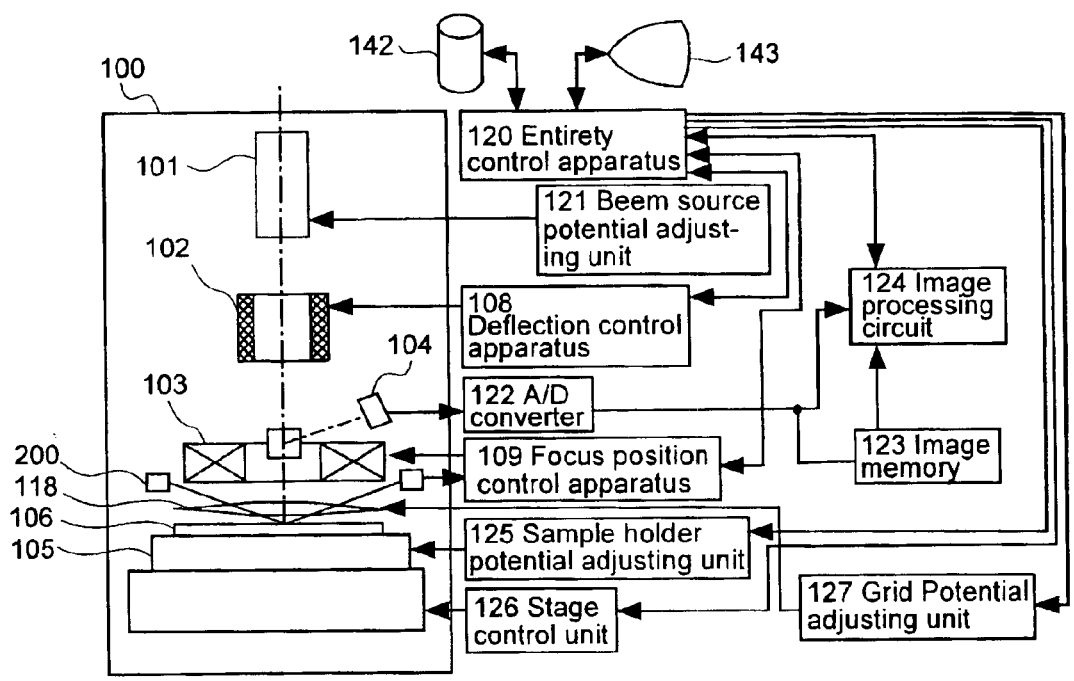
FIG. 3 is a schematic diagram showing an electron beam inspection apparatus (SEM inspection apparatus) according to an embodiment of the present invention.

FIG. 3 shows a defect detection apparatus using an SEM image according to an embodiment of the present invention. Specifically, the appearance inspection apparatus using an SEM image comprises an electron beam source 101 for generating electron beams, a beam deflector 102 for forming an image by scanning beams, an objective lens 103 for focusing electron beams on an inspected object 106 formed of a wafer or the like, a grid 118 disposed between the objective lens 103 and an inspected object 106, a stage 105 for holding, scanning or positioning the inspected object 106, a secondary electron detector 104 for detecting secondary electrons generated from the inspected object 106, a height detection optical apparatus 200a, a focus position control apparatus 109 for adjusting a focus position of the objective lens 103, an electron beam source potential adjusting unit 121 for controlling a voltage of the electron beam source, a deflection control apparatus (deflection signal generating apparatus) 108 for realizing a beam scanning by controlling the beam deflector 102, a grid potential adjusting unit 127 for controlling a potential of the grid 118, a sample holder potential adjusting unit 125 for adjusting a potential of a sample holder, an A/D converter 122 for A/D-converting a signal from the secondary electron detector 104, an image processing circuit 124 for processing a digital image thus A/D-converted, an image memory 123 therefor, a stage control unit 126 for controlling the stage, an entirety control unit 120 for controlling the entirety, and a vacuum sample chamber (vacuum reservoir) 100. A height detection value 190 of the height detection sensor 200 is constantly fed back to the focus position control apparatus 109 and a deflection control apparatus (deflection signal generating apparatus) 108. When the inspected object 106 is inspected, the entirety control unit 120 continuously moves the stage 105 by issuing a command to the stage control apparatus 126. Concurrently therewith, the entirety control unit 120 issues a command to the deflection control apparatus (deflection signal generating apparatus) 108, and the deflection control apparatus 108 drives the beam deflector 102 to scan electron beams in the direction perpendicular thereto. Simultaneously, the deflection control apparatus 108 receives the height detection value 190 obtained from the height calculating unit 200b and corrects a deflection direction and a deflection width. The focus position control apparatus 109 drives the electromagnetic lens or electrostatic lens 103 in accordance with the height detection value 190 obtained from the calculating unit 200b, and corrects a properly-focused height of electron beam. At that time, the secondary electron detector 104 detects secondary electrons generated from the sample 106 and enters the detected secondary electron into the A/D converter 122 to thereby continuously obtain SEM images.

When the appearance of the inspected object is inspected based on the SEM image, a two-dimensional SEM image should be obtained over a certain wide area. As a result, driving the beam deflector 102 to scan electron beams in the direction substantially perpendicular to the movement direction of the stage 105 while the stage 105 is being continuously moved, it is necessary to detect a two-dimensional secondary electron image signal by the secondary electron detector 104. Specifically, while the stage 105 is being continuously moved in the X direction, for example, the beam deflector 102 is moved to scan electron beams in the Y direction substantially perpendicular to the movement direction of the stage 105, and then the stage 105 is moved in a stepwise fashion in the Y direction. Thereafter, while the stage 105 is being continuously moved in the X direction, the beam deflector 102 is driven to scan electron beams in the Y direction substantially perpendicular to the movement direction of the stage 105, and a two-dimensional secondary electron image signal has to be detected by the secondary electron detector 104. The processes of (1) continuous movement of the stage, (2) beam scanning, (3) optical height detection, (4) focus control and/or deflection direction and width correction, and (5) secondary electron image acquisition should be executed simultaneously. In this way, the acquired SEM image is kept focused and distortion-corrected while the image is being acquired continuously and speedily. By this control, fast and high-sensitivity defect detection can be achieved. Then, the image processing circuit 124 compares corresponding images or repetitive patterns by comparing an electron beam image delayed by the image memory and an image directly inputted from the A/D converter 124, thereby resulting in the comparison inspection being realized. The entirety control unit 120 receives the inspected result at the same time it controls the image processing circuit 124, and then displays the inspected result on the display 143 or stores the same in the memory 142. Incidentally, in the embodiment shown in FIG. 3, while a focus is adjusted by controlling a control current flowing to the objective lens 103 having an excellent responsiveness, the present invention is not limited thereto, and the stage 105 may be elevated and lowered. However, if the focus is adjusted by elevating and lowering the stage 105, then responsiveness is deteriorated.

Figure 4:
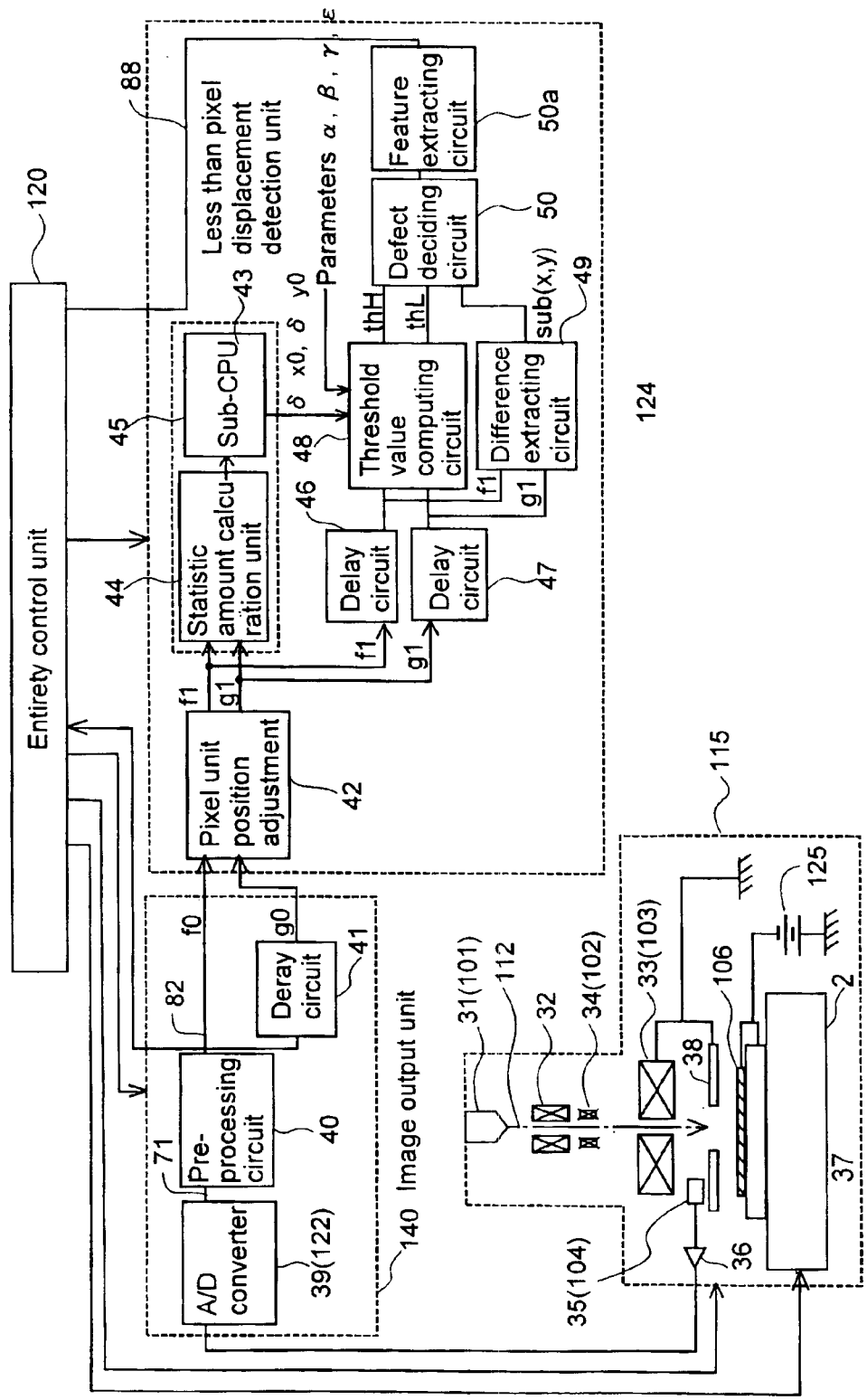
FIG. 4 shows an electron beam inspection apparatus (SEM inspection apparatus) according to an embodiment of the present invention.

Further, the appearance inspection apparatus using an SEM image will be described with reference to FIGS. 4 to 9. FIG. 4 shows the appearance inspection apparatus using an SEM image according to an embodiment of the present invention. In this embodiment, an electron beam 112 scans the inspected object 106 such as a wafer and electrons generated from the inspected object 106 are detected by the irradiation of electron beams. Then, an electronic beam image at the scanning portion is obtained on the basis of the change of intensity, and the pattern is inspected by using the electron beam image.

Figure 5A:
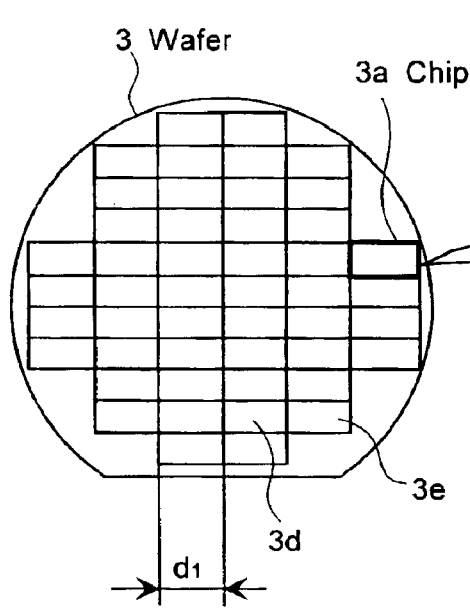
FIGS. 5(a)–5(c) show a semiconductor wafer in which a semiconductor memory is formed according to the present invention and enlarged portions thereof.
Figure 5B:
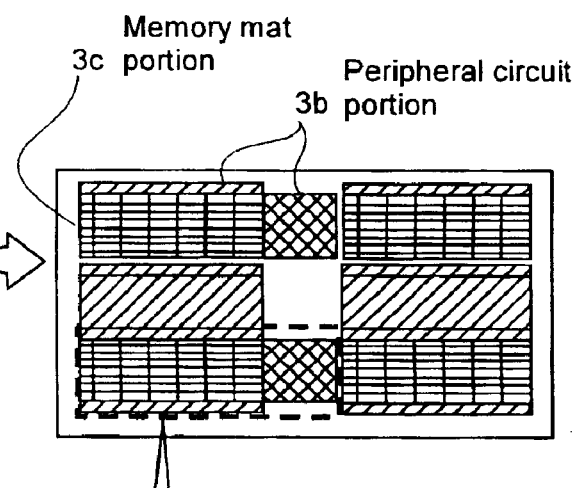
Figure 5C:
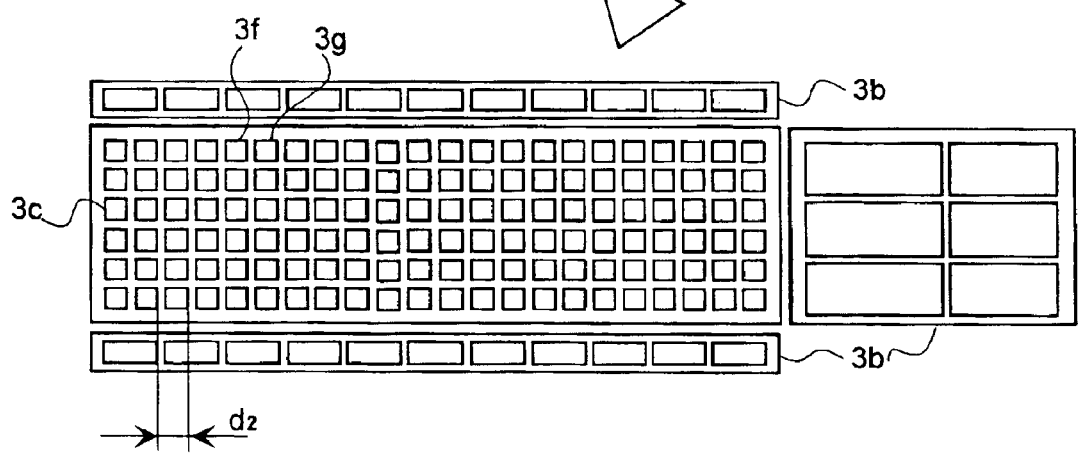

As the inspected object 106, there is the semiconductor wafer 3 as shown in FIGS. 5(a)–5(c), for example. On this semiconductor wafer 3, there are arrayed a number of chips 3a which form the same product finally as shown in FIG. 5(a). An inside pattern layout of the chip 3a comprises a memory mat portion 3c in which memory cells are regularly arranged at the same pitch in a two-dimensional fashion and a peripheral circuit portion 3b as shown by an enlarged view in FIG. 5(b). When the present invention is applied to the inspection of the pattern of this semiconductor wafer 3, a detected image at a certain chip (e.g. chip 3d) is memorized in advance, and then compared with a detected image of another chip (e.g. 3e) (hereinafter referred to as "chip comparison"). Alternatively, a detected image at a certain memory cell (e.g. memory cell 3f) is memorized in advance, and then compared with a detected image of other cell (e.g. cell 3g) (hereinafter referred to as "cell comparison") as shown in FIG. 5(c), thereby resulting in a defect being recognized.

If the repetitive patterns (chips or cells of the semiconductor wafer, by way of example) of the inspected object 106 are equal to each other strictly and if equal detected images are obtained, then only defects cannot agree with each other when images are compared with each other. Thus, it is possible to recognize a defect.

However, in actual practice, a disagreement between images exists in the normal portion. As a disagreement at the normal portion, there are a disagreement caused by the inspected object, and a disagreement caused by the image detection system. The disagreement caused by the inspected object is based on a subtle difference caused between the repetitive patterns by a wafer manufacturing process such as exposure, development or etching. This disagreement appears as a subtle difference of pattern shape and a difference of gradation value. The disagreement caused by the image detection system is based on a fluctuation of a quantity of illumination light, a vibration of stage, various electrical noises, and a disagreement between detection positions of two images or the like. These disagreements appear as a difference of gradation value of a partial image, a distortion of pattern, and a positional displacement of an image on the detected image.

In the embodiment according to the present invention, a detection image (first two-dimensional image) in which gradation values of coordinates (x, y) aligned at the pixel unit are f1(x, y) and a compared image (second two-dimensional image) in which gradation values of coordinates (x, y) are g1(x, y) are compared with each other, a threshold value (allowance value) used when a defect is determined is set at every pixel considering the positional displacement of pattern and a difference between the gradation values, and a defect is determined on the basis of a threshold value (allowance value set at every pixel.

Figure 7:
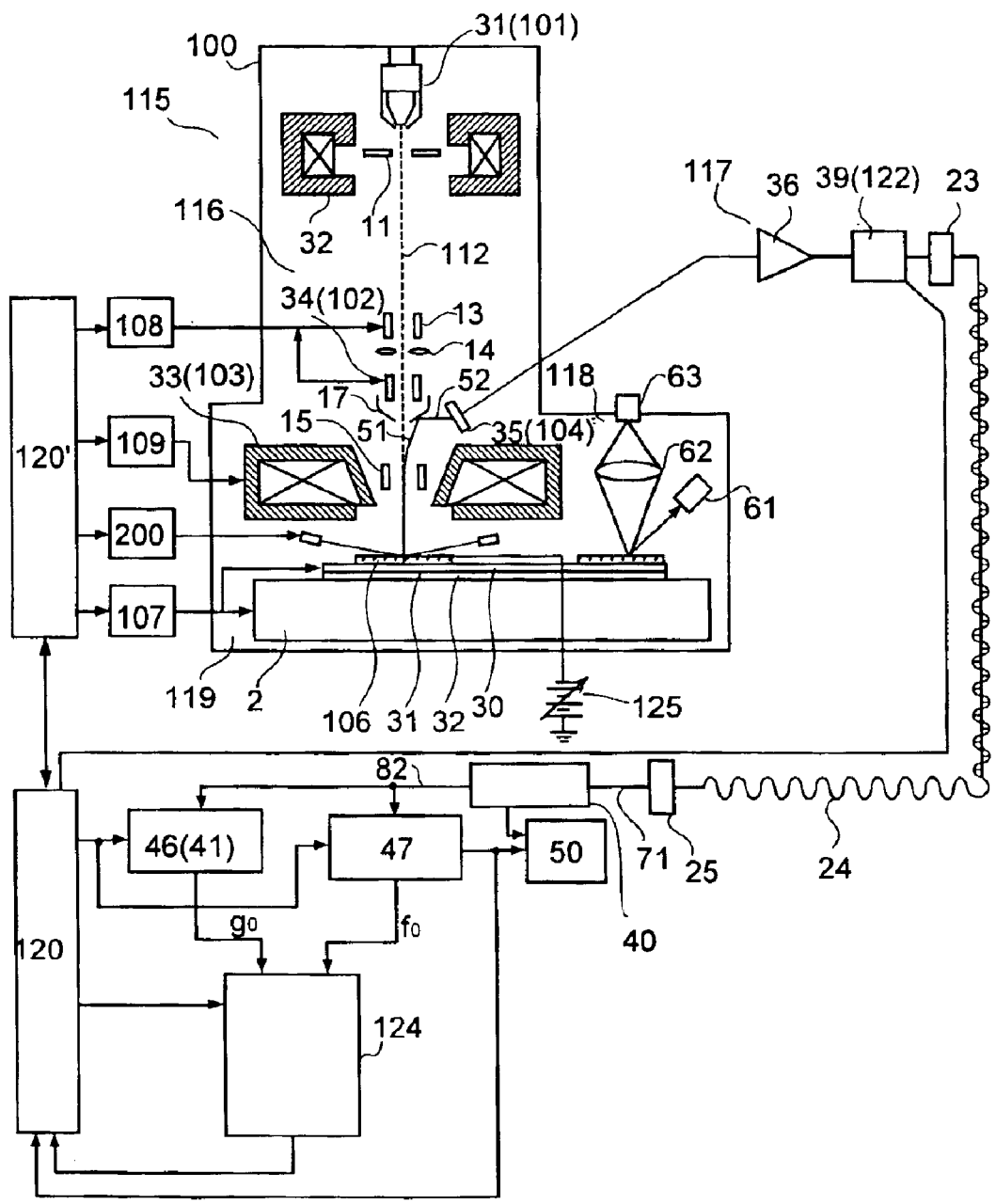
FIG. 7 shows an electron beam inspection apparatus (SEM inspection apparatus) according to another embodiment of the present invention.

A pattern inspection system according to the present invention comprises, as shown in FIGS. 4 and 7, a detection unit 115, an image output unit 140, an image processing unit 124 and an entirety control unit 120 for controlling the entire system. Incidentally, the present pattern inspection system includes an inspection chamber 100 whose inside is vacated and exhausted by vacuum and a reserve chamber (not shown) for inserting and ejecting the inspected object 106 into and from the inspection chamber 100. This reserve chamber can be vacated and exhausted by vacuum independently of the inspection chamber 100.

Initially, the inspection unit 115 will be described with reference to FIGS. 4 and 7. Specifically, the inside of the inspection chamber 100 in the detection unit 115 generally comprises, as shown in FIG. 7, an electron optical system 116, an electron detection unit 117, a sample chamber 119, and an optical microscope unit 118. The electron optical system 116 comprises an electron gun 31 (101), an electron beam deriving electrode 11, a condenser lens 32, a blanking deflector 13, a scanning deflector 34 (102), an iris 14, an objective lens 33 (103), a reflecting plate 17, an ExB deflector 15, and a Faraday cup (not shown) for detecting a beam current. The reflecting plate 17 is shaped as a circular cone in order to achieve a secondary electron amplification effect.

Of the electron detection unit 117, the electron detector 35 (104) for detecting electrons such as secondary electrons or reflection electrons is installed above the objective lens 33 (103), for example, within the inspection chamber 100. An output signal from the electron detector 35 is amplified by an amplifier 36 installed outside the inspection chamber 100.

The sample chamber 119 comprises a sample holder 30, an X stage 31 and a Y stage 32 previously referred to as stage 105, a position monitoring length measuring device 107 and a height measuring apparatus 200 such as an inspected based plate height measuring device. Incidentally, there may be provided a rotary stage on the stage.

The position monitoring length measuring device 107 monitors a position such as the stages 31, 32 (stage 105), and transfers a monitored result to the entirety control unit 120. The driving systems of the stages 31, 32 also are controlled by the entirety control unit 120. As a result, the entirety control unit 120 is able to precisely understand the area and the position irradiated with electron beams 112 on the basis of such data.

The inspected base plate height measuring device is adapted to measure the height of the inspected object 106 resting on the stages 31, 32. Then, a focal length of the objective lens 33 (103) for converging the electron beam 112 is dynamically corrected on the basis of measured data measured by the inspected base plate height measuring device 200 so that electron beams can be irradiated under the condition that electron beams are constantly properly-focused on the inspected area. Incidentally, in FIG. 7, although the height measuring apparatus 200 is installed within the inspection chamber 100, the present invention is not limited thereto, and there may used a system in which the height measuring device is installed outside the inspection chamber 100 and light is projected into the inside of the inspection chamber 100 through a glass window or the like.

The optical microscope unit 118 is located at the position near the electron optical system 116 within the room of the inspection chamber 100 and which position is distant to the extent that the optical microscope unit and the electron optical system cannot affect each other. A distance between the electron optical system 116 and the optical microscope unit 118 should naturally be a known value. Then, the X stage 31 or the Y stage 32 is reciprocally moved between the electron optical system 116 and the optical microscope unit 118. The optical microscope unit 118 comprises a light source 61, an optical lens 62, and a CCD camera 63. The optical microscope unit 118 detects the inspected object 106, e.g. an optical image of a circuit pattern formed on the semiconductor wafer 3, calculates a rotation displacement amount of circuit patterns based on the optical image thus detected, and transmits the rotation displacement amount thus calculated to the entirety control unit 120. Then, the entirety control unit 120 becomes able to correct this rotation displacement amount by rotating a rotating stage forming a part of stage 2 (105) which includes stages 31 and 32, for example. Also, the entirety control unit 120 sends this rotation displacement amount to a correction control circuit 120', and the correction control circuit 120' becomes able to correct the rotation displacement by correcting the scanning deflection position of electron beams caused by the scanning deflector 34, for example, on the basis of this rotation displacement amount. Moreover, the optical microscope unit 118 detects the inspected object 106, e.g. the optical image of the circuit pattern formed on the semiconductor wafer 3, observes this optical image, for example, displayed on the monitor 50, and sets the inspection area on the entirety control unit 120 by entering the coordinates of the inspection area into the entirety control unit 120 by using an input based on the optical image thus observed. Furthermore, the pitch between the chips on the circuit pattern formed on the semiconductor wafer 3, for example, or the repetitive pitch of the repetitive pattern such as the memory cell can be measured in advance and can be inputted to the entirety control unit 120. Incidentally, while the optical microscope unit 118 is located within the inspection chamber 100 in FIG. 7, the present invention is not limited thereto, and the optical microscope unit may be located outside the inspection chamber 100 to thereby detect the optical image of the semiconductor wafer 3 through a glass window or the like.

As shown in FIGS. 4 and 7, the electron beam emitted from the electron gun 31 (101) travels through the condenser lens 32 and the objective lens 33 (103) and is converged to a beam diameter of about pixel size on the sample surface. In that case, a negative potential is applied to the sample by the ground electrode 38 (118) and the retarding electrode 37 and the electron beam between the objective lens 33 (103) and the inspected object (sample) 106 is decelerated, whereby a resolution can be improved in a low acceleration voltage area. When irradiated with electron beams, the inspected object (wafer 3) 106 generates electrons. The scanning deflector 34 (102) scans repeatedly electron beams in the X direction and electrons generated from the inspected object 106 in synchronism with the continuous movement of the inspected object (sample) 106 in the X direction by the stage 2 (105) are detected, thereby obtaining a two-dimensional electron beam image of the inspected object. The electrons generated from the inspected object are detected by the detector 35 (104), and amplified by the amplifier 36. In order to make the high-speed scanning possible, an electrostatic deflector of which deflection speed is high should preferably be used as the deflector 34 (102) for repeatedly scanning electron beams in the X direction. Moreover, a thermal electric field radiation type electron gun should preferably be used as the electron gun 31 (101) because it can reduce the irradiation time by increasing the electron beam current. Further, a semiconductor detector which can be driven at a high speed should preferably be used as the detector 35 (104).

Next, the image output unit 140 will be described with reference to FIGS. 4, 7, and 8. Specifically, an electron detection signal detected by the electron detector 35 (104) in the electron detection unit 117 is amplified by the amplifier 36, and then converted by the A/D converter 39 (122) into digital image data (gradation image data). Then, the output from the A/D converter 39 (122) is transmitted by an optical converter (light-emitting element) 23, a transmission device (optical fiber cable) 24, and an electric converter (light-receiving device) 25. According to this arrangement, the transmission device 24 may have the same transmission speed as the clock frequency of the A/D converter 39 (122). The output from the A/D converter 39 is converted by the optical converter (light-emitting element) 23 into an optical digital signal, optically transmitted by the transmission device (optical fiber cable) 24 and then converted by the electric converter (light-receiver) 25 into digital image data (gradation image data). The reason that the output signal is converted into the optical signal and then transmitted is that, in order to supply electrons 52 from the reflection plate 17 into the semiconductor detector 35 (104), constituents (semiconductor detector 35, amplifier 36, A/D converter 39, and optical converter (light-emitting element) 23 from the semiconductor detector 35 to the optical converter 23 should be floated at a positive high potential by a high-voltage power supply source (not shown). More precisely, only the semiconductor detector 35 need be floated to the positive high potential. However, the amplifier 36 and the A/D converter 39 should preferably be located near the semiconductor detector in order to prevent noise from being mixed and a signal from being deteriorated. It is difficult to maintain only the semiconductor detector 35 at the positive high voltage, and hence all of the above-mentioned constituents should be held at the high voltage. Specifically, since the transmission device (optical fiber cable) 24 is made of a high insulating material, after the image signal which is held at the positive high potential level in the optical converter (light-emitting element) 23 is passed through the transmission device (optical fiber cable) 24, the electric converter (light-receiver) 25 outputs an image signal of earth level.

Figure 8:
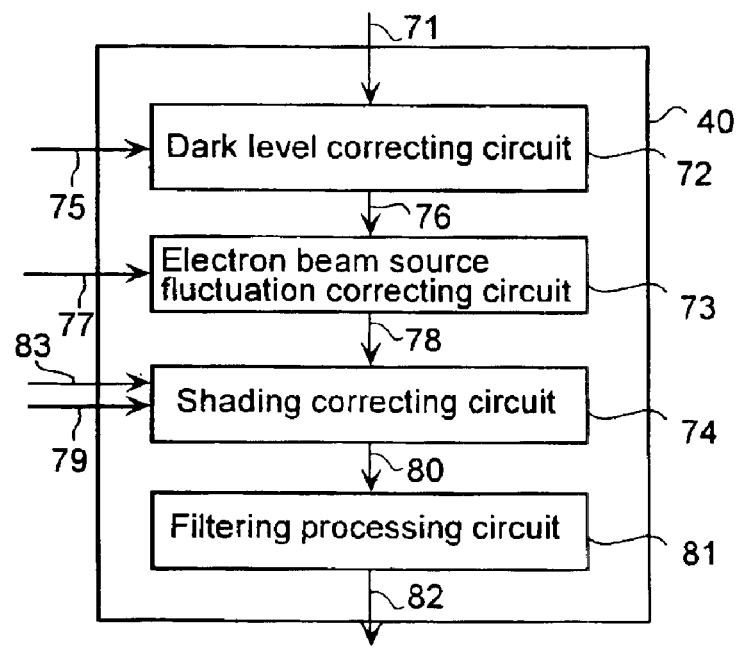
FIG. 8 shows a pre-processing circuit forming a part of FIGS. 4 and 7.
Figure 9:
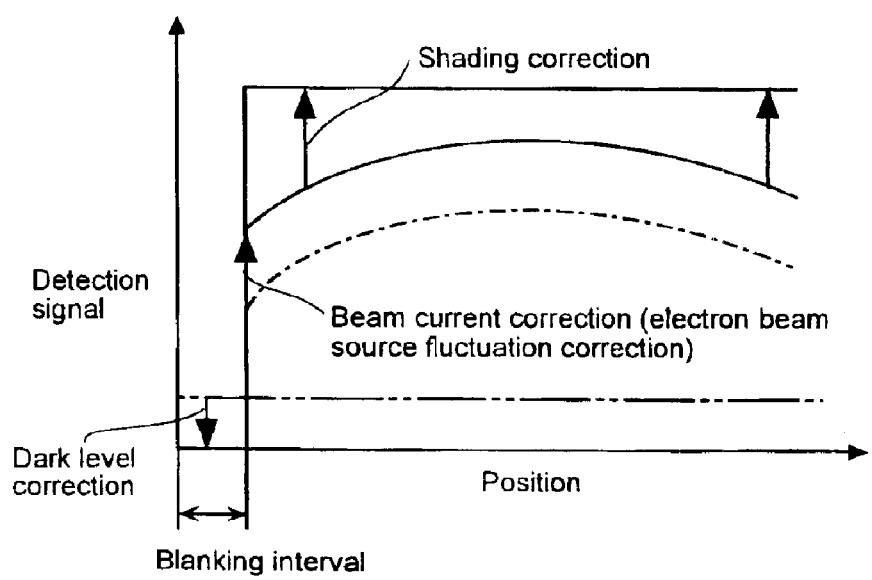
FIG. 9 shows curves for explaining the contents that are corrected by the pre-processing circuit shown in FIG. 8.

The pre-processing circuit (image correcting circuit) 40 comprises, as shown in FIG. 8, a dark level correcting circuit 72, an electron beam source fluctuation correcting circuit 73, a shading correcting circuit 74 and the like. Digital image data (gradation image data) 71 obtained from the electric converter (light-receiving element) 25 is supplied to the pre-processing circuit (image correcting circuit) 40, in which it is image-corrected such as a dark level correction, an electron beam source fluctuation correction or a shading correction. In the dark level correction in the dark level correcting circuit 72, as shown in FIG. 9, a dark level is corrected on the basis of a detection signal 71 in a beam blanking period extracted based on a scanning line synchronizing signal 75 obtained from the entirety control unit 120. Specifically, the reference signal for correcting the dark level sets an average of a gradation value of a specific number of pixels in a particular position during the beam blanking period to the dark level, and updates the dark level at every scanning line. As described above, in the dark level correcting circuit 72, the detection signal detected during the beam blanking period is dark-level-corrected to the reference signal which is updated at every line. When the electron beam source fluctuation is corrected by the electron beam source fluctuation correcting circuit 73, as shown in FIG. 9, a detection signal 76 of which the dark level is corrected is normalized by a beam current 77 monitored by the Faraday cup (not shown) which detects the above-mentioned beam current at a correction cycle (e.g. line unit of 100 kHz). Since the fluctuation of the electron beam source is not rapid, it is possible to use a beam current that was detected one to several lines before. When a shading is corrected by the shading correcting circuit 74, as shown in FIG. 9, the fluctuation of the quantity of light caused in a detection signal 78 in which the electron beam source fluctuation was corrected at the beam scanning position 79 obtained from the entirety control unit 120 is corrected. Specifically, the shading correction executes the correction (normalization) at every pixel on the basis of reference brightness data 83 which is previously detected. The shading correction reference data 83 is previously detected, the detected image data is temporarily stored in an image memory, the image data thus stored is transmitted to a computer disposed within the entirety control unit 120 or a high-order computer connected to the entirety control unit 120 through a network, and processed by software in the computer disposed within the entirety control unit 120 or the high-order computer connected through the network to the entirety control unit 120, thereby resulting in the shading correction reference data being created. Moreover, the shading correction reference data 83 is calculated in advance and held by the high-order computer connected to the entirety control unit 120 through the network. When the inspection is started, the data is downloaded, and this downloaded data may be latched in a CPU in the shading correcting circuit 74. To cope with a full visual field width, the shading correcting circuit 74 includes two correction memories having pixel number (e.g. 1024 pixels) of an amplitude of an ordinary electron beam, and the memories are switched during a time (time from the end of one visual field inspection to the start of the next one visual field inspection) outside the inspection area. The correction data may have pixel number (e.g. 5000 pixels) of a maximum amplitude of an electron beam, and the CPU may rewritten such data in each correction memory till the end of the next one visual field inspection.

As described above, after the dark level correction (dark level is corrected on the basis of the detection signal 71 during the beam blanking period), the electron beam current fluctuation correction (beam current intensity is monitored and a signal is normalized by a beam current) and the shading correction (fluctuation of quantity of light at the beam scanning position is corrected) are effected on the digital image data (gradation image data) 71 obtained from the electric converter (light-receiving element) 25, the filtering processing is effected on the corrected digital image data (gradation image data) 80 by a Gaussian filter, a mean value filter or an edge-emphasizing filter in the filtering processing circuit 81, thereby resulting a digital image signal 82 with an image quality being improved. If necessary, a distortion of an image is corrected. These pre-processings are executed in order to convert a detected image so as to become advantageous in the later defect judgment processing.

Although the delay circuit 41 formed of a shift register or the like delays the digital image signal 82 (gradation image signal) with an improved image quality from the pre-processing circuit 40 by a constant time, if a delay time is obtained from the entirety control unit 120 and set to a time during which the stage 2 is moved by a chip pitch amount (d1 in FIG. 5(*a*)), then a delayed signal g0 and a signal f0 which is not delayed become image signals obtained at the same position of the adjacent chips, thereby resulting in the aforementioned chip comparison inspection being realized. Alternatively, if the delay time is obtained from the entirety control unit 120 and set to a time during which the stage 2 is moved by a pitch amount (d2 in FIG. 5(*c*)) of the memory cell, then the delayed signal g0 and the signal f0 which is not delayed become image signals obtained at the same position of the adjacent memory cells, thereby resulting in the aforementioned cell comparison inspection being realized. As described above, the delay circuit 41 is able to select an arbitrary delay time by controlling a read-out pixel position based on information obtained from the entirety control unit 120. As described above, compared digital image signals (gradation image signals) f0 and g0 are outputted from the image output unit 140. Hereinafter, f0 will be referred to as a detection image and g0 will be referred to as a comparison image. Incidentally, as shown in FIG. 7, the comparison image signal f0 may be stored in a first image memory unit 46 composed of a shift register and an image memory and the detection image signal f0 may be stored in a second image memory unit 47 composed of a shift register and an image memory. As described above, the first image memory unit 46 may comprise the delay circuit 41, and the second image memory unit 47 is not necessarily required.

Moreover, an electron beam image latched within the pre-processing circuit 40 and the second image memory unit 47 or the like or the optical image detected by the optical microscope unit 118 may be displayed on the monitor and can be observed.

The image processing unit 124 will be described with reference to FIG. 4. The pre-processing circuit 40 outputs a detection image f0(x, y) expressed by a gradation value (light and shade value) with respect to a certain inspection area on the inspected object 106, and the delay circuit 41 outputs a comparison image (standard image:reference image) g0(x, y) expressed by a gradation value (light and shade value) with respect to a certain area on the inspected object 106 which becomes a standard to be compared.

Figure 6A:
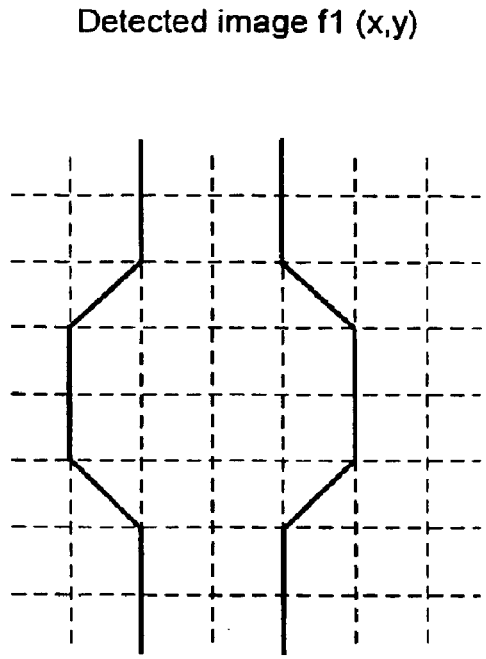
FIGS. 6(a) and 6(b) show a detection image f1(x, y) and a comparison image g1(x, y) which are compared and inspected in the electron beam inspection apparatus (SEM inspection apparatus) according to the present invention.
Figure 6B:
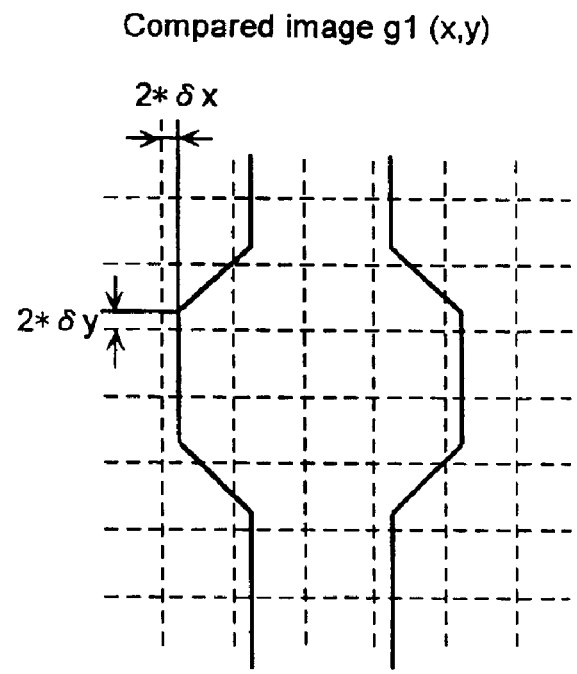

The pixel unit position alignment unit 42 of image processing unit 124 displaces the position of comparison image, for example, in such a manner that the position displacement amount of the comparison image g0(x, y) relative to the above-mentioned detection image f0(x, y) falls in a range of from 0 to 1 pixel, in other words, the position at which a "matching degree" between f0(x, y) and g0(x, y) becomes maximum falls within a range of from 0 to 1 pixel. As a consequence, as shown in FIGS. 6(*a*) and 6(*b*), for example, the detection image f0(x, y) and the comparison image g0(x, y) are aligned with an alignment accuracy of less than one pixel. A square portion shown by dotted lines in FIG. 6 denotes a pixel. This pixel is a unit detected by the electron detector 35, sampled by the A/D converter 39 (122), and converted into a digital value (gradation value light and shade value). That is, the pixel unit denotes a minimum unit detected by the electron detector 35. Incidentally, as the above-mentioned "matching degree", there may be considered the following equation (expression 1):

$$\max |f0-g0|, \Sigma\Sigma|f0-g0|, \Sigma\Sigma(f0-g0)2 \qquad \text{(expression 1)}$$

max |f0−g0| shows a maximum value of an absolute value of a difference between the detection image f0(x, y) and the comparison image g0(x, y). ΣΣ|f0−g0| shows a total of absolute value of a difference between the detection image f0(x, y) and the comparison image g0(x, y) within the image. ΣΣ(f0−g0) shows a value which results from squaring a difference between the detection image f0(x, y) and the comparison image g0(x, y) and integrating the squared result in the x direction and the y direction.

Although the processed content is changed depending upon the adoption of any one of the above-mentioned (expression 1), the case that ΣΣ|f0−g0| is adopted will be described below.

Mx assumes the displacement amount of the comparison image g0(x, y) in the x direction, and my assumes the displacement in the y direction (mx, my are integers). Then, e1(mx, my) and s1(mx, my) are defined by equations of (expression 2) and (expression 3), respectively:

$$e1(mx, my)=\Sigma\Sigma|f0(x, y)-g0(x+mx, y+my)| \qquad \text{(expression 2)}$$

$$s1(mx, my)=e1(mx, my)+e1(mx+1, my)+e1(mx, my+1)+e1(mx+1, my+1) \qquad \text{(expression 3)}$$

In the expression 2, ΣΣ shows a total within the image. Since what is required to calculate is a value obtained when mx assumes the displacement amount of the x direction in which s1(mx, my) becomes minimum and a value obtained when my assumes the displacement amount of the y direction, by changing mx and my as ±0, 1, 2, 3, 4, . . . n, in other words, by changing the comparison image g0(x, y) with a pixel pitch, there is calculated s1(mx, my) of each time. Then, a value mx0 of mx in which the calculated value becomes minimum and a value my0 of my in which the calculated value becomes minimum are calculated. Incidentally, the maximum displacement amount n of the comparison image should be increased as the positional accuracy is lowered in response to the positional accuracy of the detection unit 115. The pixel unit position alignment unit 42 outputs the detection image f0(x, y) at it is, and outputs the comparison image g0(x, y) with a displacement of (mx0, my0). That is, f1(x, y)=f0(x, y), g1(x, y)=g0(x+mx0, y+my0).

A positional displacement detection unit (not shown) for detecting a positional displacement of less than a pixel divides the images f1(x, y), g(x, y) aligned at the pixel unit into small areas (e.g. partial images composed of 128*256 pixels), and calculates positional displacement amounts (positional displacement amounts become real number of 0 to 1) of less than the pixel at every divided area (partial image). The reason that the images are divided into small areas is in order to cope with a distortion of an image, and hence should be set to a small area to the extent that a distortion can be neglected. As a measure for measuring a matching degree, there are the selection branches shown in the expression 1. An example is shown in which the third "sum of squares of difference" ($\Sigma\Sigma$(f0−g0)2) is adopted.

Let it be assumed that an intermediate position between f1(x, y) and g1(x, y) is held at the positional displacement amount 0 and that, as shown in FIG. 6, f1 is displaced y−$\delta$x in the x direction, f1 is displaced by −$\delta$y in the by direction, g1 is displaced by +$\delta$x in the x direction, and that g1 is displaced by +$\delta$y in the y direction. That is, the displacement amounts of f1 and g1 are 2*$\delta$x in the x direction and 2*$\delta$y in the y direction. Since $\delta$x, $\delta$y are not integers, in order to displace f1 and g1 by $\delta$x, $\delta$y, it is necessary to define a value between the pixels. An image f2 in which f1 is displaced by +$\delta$x in the x direction and by +$\delta$y in the y direction and an image g2 in which g1 is displaced by −$\delta$x in the x direction and by −$\delta$y in the y direction are defined as the following equations of (expression 4) and (expression 5):

$$f2(x, y)=f1(x+\delta x, y+\delta y)=f1(x, y)+\delta x(f1(x+1, y)-f1(x, y))+\delta y(f1(x, y+1)-f1(x, y)) \quad \text{(expression 4)}$$

$$g2(x, y)=g1(x-\delta x, y-\delta y)=g1(x, y)+\delta x(g1(x-1, y)-g1(x, y))+\delta y(g1(x, y-1)-g1(x, y)) \quad \text{(expression 5)}$$

The expression 4 and the expression 5 are what might be called linear interpolations. A matching degree e2($\delta$x, $\delta$y) of f2 and g2 is represented by the following equation of (expression 6) if "sum of squares of difference" is adopted.

$$e2(\delta x, \delta y)=\Sigma\Sigma(f2(x, y)-g2(x, y))2 \quad \text{(expression 6)}$$

$\Sigma\Sigma$ denotes a total within small areas (partial images). The object of the positional displacement detection unit (not shown) for detecting a positional displacement of less than the pixel unit is to obtain a value $\delta$x0 of $\delta$x and a value $\delta$y0 of $\delta$y in which e2($\delta$x, $\delta$y) takes the minimum value. To this end, an equation which results from partially differentiating the above-mentioned expression 6 by $\delta$x, $\delta$y is set to 0 and may be solved. The results are obtained as shown by the following equations of (expression 7) and (expression 8):

$$\delta x=\{(\Sigma\Sigma C0*Cy)*(\Sigma\Sigma Cx*Cy)\Sigma\Sigma C0*Cx)*(\Sigma\Sigma Cy*Cy)\}/$$

$$\{(\Sigma\Sigma Cx*Cx)*(\Sigma\Sigma Cy*Cy)-(\Sigma\Sigma Cx*Cy)*(\Sigma\Sigma Cx*Cy)\} \quad \text{(expression 7)}$$

$$\delta x=\{(\Sigma\Sigma C0*Cx)*(\Sigma\Sigma Cx*Cy)\Sigma\Sigma C0*Cy)*(\Sigma\Sigma Cx*Cx)\}/$$

$$\{(\Sigma\Sigma Cx*Cx)*(\Sigma\Sigma Cy*Cy)-(\Sigma\Sigma Cx*Cy)*(\Sigma\Sigma Cx*Cy)\} \quad \text{(expression 8)}$$

However, respective ones of C0, Cx, Cy establish relationships shown by the following equations of (expression 9), (expression 10) and (expression 11):

$$C0=f1(x, y)-g1(x, y) \quad \text{(expression 9)}$$

$$Cx=\{f1(x+1, y)-f1(x, y)\}-\{g1(x-1, y)-g1(x, y) \quad \text{(expression 10)}$$

$$Cy=\{f1(x, y+1)-f1(x, y)\}-\{g1(x, y-1)-g1(x, y)\} \quad \text{(expression 11)}$$

In order to obtain $\delta$x0, $\delta$y0, respectively, as shown by the (expression 7) and the (expression 8), it is necessary to obtain a variety of statistic amounts $\Sigma\Sigma$Ck*Ck (Ck=C0, Cx, Cy). The statistic amount calculating unit 44 calculates a variety of statistic amount $\Sigma\Sigma$Ck*Ck on the basis of the detection image f1(x, y) composed of the gradation value (light and shade value) aligned at the pixel unit obtained from the pixel unit position alignment unit 42 and the comparison image g1(x, y).

The sub-CPU 45 obtains $\delta$x0, $\delta$y0 by calculating the (expression 7) and the (expression 8) by using the $\Sigma\Sigma$Ck*Ck which was calculated in the statistic amount calculating unit 44.

The delay circuits 46, 47 formed of the shift register or the like are adapted to delay the image signals f1 and g1 by the time which is required by the less than pixel positional displacement unit (not shown) to calculate $\delta$x0, $\delta$y0.

The difference image extracting circuit (difference extracting circuit:distance extracting unit) 49 is adapted to obtain a difference image (distance image) sub(x, y) between f1 and g1 having positional displacements 2*$\delta$x0, 2*$\delta$y0 from a calculation standpoint. This difference image (distance image) sub(x, y) is expressed by the equation of (expression 12) as follows:

$$\text{sub}(x, y)=g1(x, y)-f1(x, y) \quad \text{(expression 12)}$$

The threshold value computing circuit (allowance range computing unit) 48 is adapted to calculate by using the image signals f1, g1 from the delay circuits 46, 47 and the positional displacement amounts $\delta$x0, $\delta$y0 of less than the pixel obtained from the less than pixel positional displacement detection unit (not shown) two threshold values (allowance values indicative of allowance ranges) thH(x, y) and thL(x, y) which are used by the defect deciding circuit (defect judgment unit) 50 to determine in response to the value of the difference image (distance image) sub(x, y) obtained from the difference image extracting circuit (difference extracting circuit:distance extracting unit) 49 whether or not the inspected object is the nominated defect. ThH(x, y) is the threshold value (allowance value indicative of allowance range) which determines the upper limit of the difference image (distance image) sub(x, y), and thL(x, y) is the threshold value (allowance value indicative of allowance range) which determines the lower limit of the difference image (distance image) sub(x, y). Contents of the computation in the threshold value computing circuit 48 are expressed by the equations of (expression 13) and (expression 14) as follows:

$$thH(x, y)=A(x, y)+B(x, y)+C(x, y) \quad \text{(expression 13)}$$

$$thL(x, y)=A(x, y)-B(x, y)-C(x, y) \quad \text{(expression 14)}$$

However, A(x, y) is a term expressed by a relationship of the following equation of (expression 16) and which is used to correct the threshold values by using the less than pixel positional displacement amounts δx0, δy0 in response to the value of the difference image (distance image) sub(x, y) substantially.

Also, B(x, y) is a term expressed by a relationship of the equation of the (expression 16) and which is used to allow a very small positional displacement of a pattern edge (very small difference of pattern shape, pattern distortion also returns to a very small positional displacement of pattern edge from a local standpoint) between the detection image f1 and the comparison image g1.

Also, C(x, y) is a term expressed by a relationship of the equation of (expression 17) and which is used to allow a very small difference of gradation value (light and shade value) between the detection image f1 and the comparison image g1).

$$A(x, y) = \{dx1(x, y)*\delta x0 - dx2(x, y)*(-\delta x0)\} + \{dy1(x, y)*\delta y0 - dy2(x, y)*(-\delta y0)\} = \{dx1(x, y) + dx2(x, y)\}*\delta x0 + \{dy1(x, y) + dy2(x, y)\}*\delta y0 \quad \text{(expression 15)}$$

$$B(x, y) = |\{dx1(x, y)*\alpha - dx2(x, y)*(-\alpha)\}| + |\{dy1(x, y)*\beta - dy2(x, y)*(-\beta)\}| = |\{dx1(x, y) + dx2(x, y)\}*\alpha| + |\{dy1(x, y) + dy2(x, y)\}*\beta| \quad \text{(expression 16)}$$

$$C(x, y) = ((max1 + max2)/2)*\gamma + \epsilon \quad \text{(expression 17)}$$

where α, β are the real numbers ranging from 0 to 0.5, γ is the real number greater than 0, and ε is the integer greater than 0.

dx1(x, y) is expressed by a relationship of the equation of (expression 18), and indicates a changed amount of a gradation value (light and shade value) with respect to the x direction+1 adjacent image in the detection image f1(x, y).

dy2(x, y) is expressed by a relationship of the equation of (expression 19), and indicates a changed amount of a gradation value (light and shade value) with respect to the x direction−1 adjacent image in the comparison image g1(x, y).

dy1(x, y) is expressed by a relationship of the equation of (expression 20), and indicates a changed amount of a gradation value (light and shade value) with respect to the y direction+1 adjacent image in the detection image f1(x, y).

dy2(x, y) is expressed by a relationship of the equation of (expression 21), and indicates a changed amount of a gradation value (light and shade value) with respect to the y direction−1 adjacent image in the comparison image $$g1(x, y) = dx1(x, y) = f1(x+1, y) - f1(x, y) \quad \text{(expression 18)}$$

$$dx2(x, y) = g1(x, y) - g1(x-1, y) \quad \text{(expression 19)}$$

$$dy1(x, y) = f1(x, y+1) - f1(x, y) \quad \text{(expression 20)}$$

$$dy2(x, y) = g1(x, y) - g1(x, y-1) \quad \text{(expression 21)}$$

max1 is expressed by a relationship of the equation of (expression 22), and indicates maximum gradation values (light and shade values) of x direction+1 adjacent image and y direction+1 adjacent image including itself in the detection image f1(x, y).

max2 is expressed by a relationship of the equation of (expression 23), and indicates maximum gradation values (light and shade values) of x direction−1 adjacent image and y direction−adjacent image including itself in the comparison image g1(x, y).

$$max1 = max\{f1(x, y), f1(x+1, y), f1(x, y+1), f1(x+1, y+1)\} \quad \text{(expression 22)}$$

$$max2 = max\{g1(x, y), g1(x-1, y), g1(x, y-1), g(x-1, y-1)\} \quad \text{(expression 23)}$$

First, the first term A(x, y) in the equations of (expression 13) and (expression 14) for calculating the threshold values thH(x, y), thL(x, y) will be described. Specifically, the first term A(x, y) in the equations of (expression 13) and (expression 14) for calculating the threshold values thH(x, y) and thL(x, y) is the term used to correct the threshold values in response to the less than pixel positional displacement amounts δx0, δy0 which were calculated by the positional displacement detection unit 43. Since dx1 expressed by (expression 18), for example, is a local changing rate of a gradation value of f1 in the x direction, dx1(x, y)*δx0 expressed by (expression 15) can be regarded as a predicted value of the change of the gradation value (light and shade value) of f1 obtained when the position is shifted by δx0. Therefore, the first term {dx1(x, y)*δx0−dx2(x, y)*(−δx0)} can be regarded as a value which predict at every pixel a changing rate of a gradation value (light and shade value) of the difference image (distance image) of f1 and g1 obtained when the position of f1 is displaced by δx0 in the x direction and the position of g1 is displaced by −δx0 in the x direction. Similarly, the second term can be regarded as the value which predicts a changing rate with respect to the y direction. Specifically, {dx1(x, y)+dx2(x, y)}*δx0 is a value which can predict a changing rate of a gradation value (light and shade value of difference image (distance image) of f1 and g1 in the x direction by multiplying a local changing rate {dx1(x, y)+dx2(x, y)} of the difference image (distance image) between the detection image f1 and the comparison image g1 in the x direction with the positional displacement δx0. Also, {dy1(x, y)+dy2(x, y)}*δy0 is a value which predicts at every pixel a changing rate of a gradation value (light and shade value) of the difference image (distance image) of f1 and g1 by multiplying a local changing rate {dy1(x, y)+dy2(x, y) of the difference image (distance image) between the detection image f1 and the comparison image g1 in the y direction with the positional displacement δy0.

As described above, the first term A)x, y) in the threshold values thH(x, y) and thL(x, y) is the term used to cancel the known positional displacements δx0, δy0.

The second term B(x, y) in the equations of (expression 13) and (expression 14) for calculating the threshold values thH(x, y) and thL(x, y) will be described. Specifically, the second term B(x, y) in the equations of (expression 13) and (expression 14) for calculating the threshold values thH(x, y) and thL(x, y) is the term used to allow a very small positional displacement of pattern edge (very small difference of pattern shape and pattern distortion also are returned to very small positional displacements of pattern edge from a local standpoint). As will be clear from the comparison of the (expression 15) for calculating A(x, y) and the (expression 16) for calculating B(x, y), B(x, y) is an absolute value of a change prediction of a gradation value (light and shade value) of the difference image (distance image) brought about by the positional displacements α, β. If the positional displacement is canceled by A(x, y), then the addition of B(x, y) to A(x, y) means that the position aligned state is further displaced by α in the x direction and by β in the y direction considering a very small positional displacement of pattern edge caused by a very small difference based on the pattern shape and the pattern distortion. That is, +B(x, y) expressed by the equation of (expression 13) is to allow the positional displacement of +α in the x direction and the positional displacement of +β in the y direction as the very small positional displacements of the pattern edge caused by the very small differences based on the pattern shape and the pattern distortion. Further, the subtraction of B(x, y) from A(x, y) in the equation of (expression 14) means that the positional aligned state is positionally displaced by −α in the x direction and by $-\beta$ in the y direction. $-B(x, y)$ expressed by the equation of (expression 14) is adapted to allow the positional displacement of $-\alpha$ in the x direction and $-\beta$ in the y direction. As shown by the equations of (expression 13) and (expression 14), if the threshold value includes the upper limit thH(x, y) and the lower limit thL(x, y), then it is possible to allow the positional displacements of $\pm\alpha$, $\pm\beta$. Then, if the threshold value computing circuit 48 sets the values of the inputted parameters $\alpha$, $\beta$ to proper values, then it becomes possible to freely control the allowable positional displacement amounts (very small positional displacement amounts of pattern edge) caused by the very small difference based on the pattern shape and the pattern distortion.

Next, the third term C(x, y) in the equations of (expression 13) and (expression 14) for calculating the threshold values thH(x, y) and thL(x, y) will be described. The third term C(x, y) in the equations of (expression 13) and (expression 14) for calculating the threshold values thH(x, y) and thL(x, y) is a term used to allow a very small difference of a gradation value (light and shade value) between the detection image f1 and the comparison image g1. As shown by the equation of (expression 13), the addition of C(x, y) means that the gradation value (light and shade value) of the comparison image g1 is larger than the gradation value (light and shade value) of the detection image f1 by C(x, y). As shown by the equation of (expression 14), the subtraction of C(x, y) means that the gradation value (light and shade value) of the comparison value g1 is smaller than the gradation value (light and shade value) of the detection image by C(x, y). While C(x, y) is a sum of a value which results from multiplying a representing value (max value) of a gradation value at the local area with the proportional constant $\gamma$ and the constant $\epsilon$ as shown by the equation of (expression 17), the present invention is not limited to the above-mentioned function. If the manner in which the gradation value is fluctuated is already known, then it is possible to use a function which can cope with such manner. For example, if it is clear that a fluctuation width is proportional to a square root of a gradation value, then the equation of (expression 17) should be replaced with C(x, y)=(square root of (max1+max2))*$\gamma$+$\epsilon$. Thus, the threshold value computing circuit 48 becomes able to freely control a difference of allowable gradation value (light and shade value) by the inputted parameters $\gamma$, $\epsilon$ similarly to B(x, y).

Specifically, the threshold value computing circuit (allowable range computing unit) 48 includes a computing circuit for computing {dx1(x, y)+dx2(x, y)} by the equations of (expression 18) and (expression 19) based on the detection image f1(x, y) composed of a gradation value (light and shade value) inputted from the delay circuit 46 and the comparison image g1(x, y) composed of a gradation value (light and shade value) inputted from the delay circuit 47, a computing circuit for computing {dy1(x, y)+dy2(x, y)} by the equations of (expression 20) and (expression 21) and a computing circuit for computing (max1+max2) by the equations of (expression 22) and (expression 23). Further, the threshold value computing circuit 48 includes a computing circuit for computing ({dx1(x, y)+dx2(x, y)}*$\delta$x0±|{dx1(x, y)+dx2(x, y)}|*$\alpha$) which is a part of (expression 15) and a part of (expression 16) on the basis of {dx1(x, y)+dx2(x, y)} obtained from the computing circuit, $\delta$x0 obtained from the less than pixel displacement detection unit 43 and the inputted $\alpha$ parameter, a computing circuit for computing (dy1(x, y)+dy2(x, y))*$\delta$y0±|{dy1(x, y)+dy2(x, y)}|*$\beta$) which is a part of (expression 15) and a part of (expression 16) on the basis of {dy1(x, y)+dy2(x, y)} obtained from the computing circuit, $\delta$y0 obtained from the less than pixel displacement detection unit 43 and the inputted $\beta$ parameter and a computing circuit for computing ((max1+max2)/2)*$\gamma$+$\epsilon$) in accordance with the equation of (expression 17), for example, on the basis of (max1+max2) obtained from the computing circuit and the inputted $\gamma$, $\epsilon$ parameters. Further, the threshold value computing circuit 48 includes an adding circuit for positively adding ({dx1(x, y)+dx2(x, y)}*$\delta$x0+|{dx1(x, y)+dx2(x, y)}|*$\alpha$), ({dy1(x, y)+dy2(x, y)}*$\delta$y0+|{dy1(x, y)+dy2(x, y)}|*$\beta$) obtained from the computing circuit and ((max1+max2)/2)*$\gamma$+$\epsilon$) obtained from the computing circuit to output the threshold value thH(x, y) of the upper limit, a subtracting circuit for negatively computing (((max1+max2)/2)*$\gamma$+$\epsilon$) obtained from the computing circuit and an adding circuit for positively computing ({dx1(x, y)+dx2(x, y)}*$\delta$x0−|{dx1(x, y)+dx2(x, y)|*$\alpha$} obtained from the computing circuit, ({dy1(x, y)+dy2(x, y)}*$\delta$y0−|{dy1(x, y)+dy2(x, y)}|*$\beta$) obtained from the computing circuit and −((max1+max2)/2*$\gamma$+$\epsilon$) obtained from the subtracting circuit to output the threshold value thL(x, y) of the lower limit.

Incidentally, the threshold value computing circuit 48 may be realized by a CPU by software processing. Further, the parameters $\alpha$, $\beta$, $\gamma$, $\epsilon$ inputted to the threshold value computing circuit 48 may be entered by an input means (e.g. keyboard, recording medium, network or the like) disposed in the entirety control unit 120.

The defect deciding circuit (defect judgment unit) 50 decides by using the difference image (distance image) sub(x, y) obtained from the difference image extracting circuit (difference extracting circuit) 49, the threshold value of the lower limit (allowable value indicating the allowable range of lower limit) thL(x, y) obtained from the threshold value computing circuit 48 and the threshold value of the upper limit (allowable value indicating the allowable range of upper limit) thH(x, y) that the pixel at the position (x, y) is a non-defect nominated pixel of the following equation of (expression 24) is satisfied and that the pixel at the position (x, y) is a defect nominated pixel if it is not satisfied. The defect deciding circuit 50 outputs def(x, y) which takes a value of 0, for example, with respect to the non-defect nominated pixel and which takes a value greater than 1, for example, the defect-nominated pixel indicating a disagreement amount.

$$thL(x, y) \leq sub(x, y) \leq thH(x, y) \quad \text{(expression 24)}$$

The feature extracting circuit 50a executes a noise elimination processing (e.g. contracts/expands def(x, y). When all of 3×3 pixels are not simultaneously the defect-nominated pixels, the center pixel is set to 0 (non-defect nominated pixel), for example, and eliminated by a contraction processing, and is returned to the original one by an expansion processing. After a noise-like output (e.g. all 3×3 pixels are not simultaneously the defect-nominated pixels) is deleted, there is executed a defect-nominated pixel merge processing in which nearby defect-nominated pixels are collected into one. Thereafter, barycentric coordinates and XY projection lengths (maximum lengths in the x direction and the y direction) are demonstrated at the above-mentioned unit. Incidentally, the feature extracting circuit 50a calculates a feature amount 88 such as a square root of (square of X projection length+square of Y projection length) or an area, and outputs the calculated result.

As described above, the image processing unit 124 controlled by the entirety control unit 120 outputs the feature amount (e.g. barycentric coordinates, XY projection lengths, area, etc.) of the defect-nominated portion in response to coordinates on the inspected object (sample) 106 which is detected with the irradiation of electron beams by the electron detector 35 (104).

The entirety control unit 120 converts position coordinates of the defect-nominated portion on the detected image into the coordinate system on the inspected object (sample) 106, deletes a pseudo-defect, and finally forms defect data composed of the position on the inspected object (sample) 106 and the feature amount calculated from the feature extracting circuit 50a of the image processing unit 124.

According to the embodiment of the present invention, since the whole positional displacement of the small areas (partial images), the very small positional displacements of individual pattern edges and the very small differences of gradation values (light and shade values) are allowed, the normal portion can be prevented from being inadvertently recognized as the defect. Moreover, by setting the parameters α, β, γ, ε to proper values, it becomes possible to easily control the positional displacement and the allowance amount of the fluctuation of the gradation values.

Further, according to the embodiment of the present invention, since an image which is position-aligned by the interpolation in a pseudo-fashion, an image can be prevented from being affected by a smoothing effect which is unavoidable in the interpolation. There is then the advantage that the present invention is advantageous in detecting a very small defect portion. In actual practice, according to the experiments done by the inventors of the present invention, having compared the result in which the defect is decided by calculating the threshold value allowing the positional displacement and the fluctuation of the gradation value similarly to this embodiment after an image which is position-aligned by the interpolation in a pseudo-fashion by using the result of the positional displacement detection of less than pixel and the result obtained by the defect judgment according to this embodiment, the defect detection efficiency can be improved by greater than 5% according to the embodiment of the present invention.

The arrangement for preventing the electron beam image in the aforementioned electron beam apparatus (observation SEM apparatus, length-measuring SEM apparatus) from being deteriorated will be described further. Specifically, the quality of the electron beam image is deteriorated by the image distortion caused by the deflection and the aberration of the electron optical system and by the resolution lowered by the de-focusing. The arrangement for preventing the image quality from being deteriorated is comprised of the height detection apparatus 200 composed of the height detection optical apparatus 200a and the height calculating unit 200b, the focus control apparatus 109, the deflection signal generating apparatus 108, and the entirety control apparatus 120.

Figure 11A:
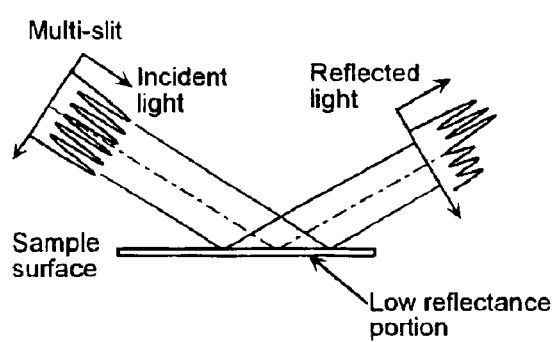
FIGS. 11(a) and 11(b) are used to explain a principle in which a detection error is reduced by a multi-slit.
Figure 11B:
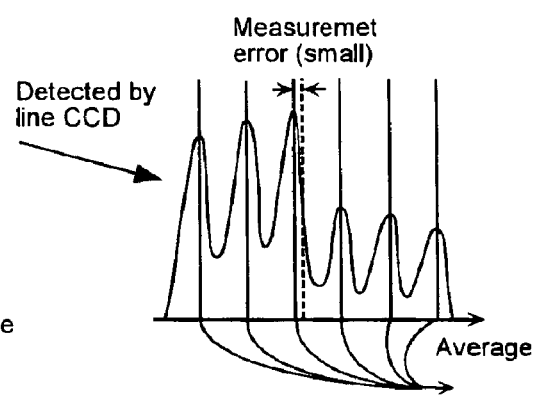

FIGS. 10 and 11(a)–11(b) show the height detection optical apparatus 200a according to a first embodiment of the present invention. Specifically, the height detection optical apparatus 200a according to the present invention comprises an illumination optical system formed of a light source 201, a mask 203 in which the same pattern irradiated with light from the light source 201, e.g. the pattern composed of repetitive (repeated) rectangular patterns, a projection stop 211, a polarizing filter 240 for emitting S-polarized light and a projection lens 210 and which illuminates the multi-slit shaped pattern with the S-polarized light at an angle (θ=greater than 60 degrees) vertically inclined from the sample surface 106 by an angle θ and a detection optical system composed of a detection lens 215 for focusing regularly-reflected light from the sample surface 106 on the light-receiving surface of a line image sensor 214, a cylindrical lens 213 and a detection lens 216 for converging the longitudinal direction of the multi-slit shaped pattern on the light-receiving pixels of the line image sensor 214 and the line image sensor and which is used to detect a height of the sample surface 106 from the shift amount of the multi-slit image detected by the line image sensor 214.

Light emitted from the light source 201 irradiates the mask 203 on which there is drawn the multi-slit shaped pattern which results from repeating the rectangular-shaped pattern, for example. As a result, the multi-slit-shaped pattern is projected by the projection lens 210 onto the height measuring position 217 on the sample surface 106. The multi-slit-shaped pattern drawn on the mask 203 is not limited to the slit-shaped pattern, and may be shaped as any shape such as an ellipse or a square so long as it is formed by the repetition of the same pattern. Generally, it can be a pattern that comprises a row of patterns with different shapes. Moreover, the spacing between the neighboring patterns can be different from each other. What is essential, as will be described later in detail using FIG. 11, is that by averaging the multiple height estimations computed from the movements of the multiple patterns, a more precise height estimation can be obtained. Therefore, hereinafter, the word "multi-slit-shaped pattern" or "luminous flux of repetitive light pattern" defines a pattern which comprises multiple arranged patterns with either different shapes or the same shape, whose spacing between the neighboring patterns are either different or the same. The multi-slit-shaped pattern projected onto the sample surface 106 is focused by the detection lens 215 on the line image sensor 214 such as a CCD. Assuming that m is the magnification of this detection optical system, then when the height of the sample surface 106 is changed by z, the multi-slit image is shifted by $2z \cdot \sin\theta \cdot m$ on the whole. By using this fact, it is possible to detect the height of the sample surface 106 from the shift amount of the multi-slit image obtained based on the signal received by the line image sensor 214.

Reference numeral 110 denotes the optical axis of the upper observation system, i.e. the height detection position. Specifically, when the above-mentioned height detection apparatus is used as an auto focus height sensor, reference numeral 110 becomes the optical axis of the upper observation system. Incidentally, assuming that p is the pitch of the multi-slit-shaped pattern of the projected image of the projection lens 210, then the pitch of the pattern projected onto the sample surface 106 becomes p/cos θ, and the pitch of the pattern on the image sensor 214 becomes pm. Also, assuming that m' is the magnification of the illumination projection system, then the pitch of the pattern on the mask 203 becomes p/m'. That is, the pitch of the multi-slit-shaped pattern formed on the mask 203 becomes p/m'.

As shown in FIGS. 11(a), 11(b), when a height is detected on the sample 106 at its boundaries having different reflectances, an intensity distribution of a signal detected on the line image sensor 214 is affected by a reflectance distribution of a sample. However, if the multi-slit-shaped pattern is as thin as possible so long as a clear image can be maintained within a height detection range, then it is possible to suppress a detection error caused by a reflectance distribution on the surface of the object. Because, the detection error is caused as a center of gravity of a slit image is deviated due to a reflectance distribution of a sample, and an absolute value of this deviation increases in proportion to the width of the slit. In the embodiment as shown in FIG. 11(b), the third slit from left is affected by an influence of a fluctuation of a reflectance on the boundary of the sample, but the slit width is narrow so that the detection error is small. Furthermore, it is possible to reduce a detection error caused by the object and the detection fluctuation by averaging the height detected values of a plurality of slits.

Although the detection error decreases as the slit width is reduced, this has a limitation. Thus, even when the slit width is reduced over a certain limit, no slit is clearly focused on the image sensor 214, and a contrast is lowered. This has the following relationship.

Specifically, assuming that ±zmax is a target height detection range, then at that time, the multi-slit image on the image sensor 214 is de-focused by ±2zmax·cos θ. On the other hand, assuming that p is the cycle of the multi-slit-shaped pattern on the projection side and that NA is an NA (Numerical Aperture) of the detection lens 215, then this focal depth becomes ±a·0.61 p/NA. That is, the condition that the slit cycle p satisfies (2zmax·cos θ)<(a·0.61 p/NA) is the condition under which the multi-slit image can be constantly detected clearly. In the above, a is the constant determined by defining the focus depth such that its amplitude is lowered. When the focus depth is defined under the condition that the amplitude is lowered to ½, a is about 0.6.

Figure 41A:
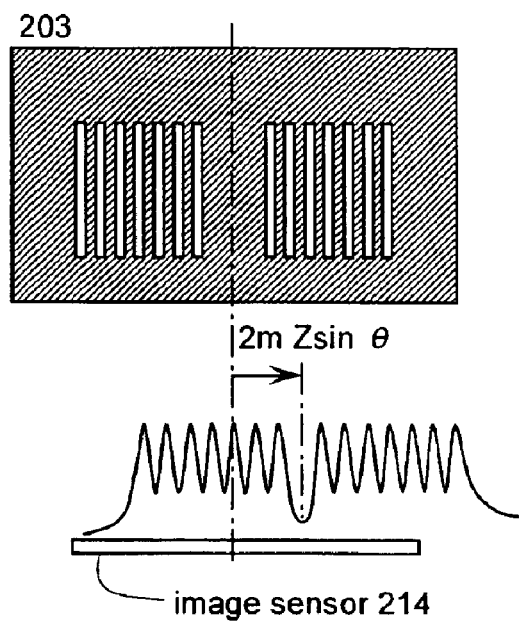
FIGS. 41(a) and 41(b) show multi-slit patterns in which the center spacing between the multi-slit patterns is increased and in which the center slit is made wider, respectively.
Figure 41B:
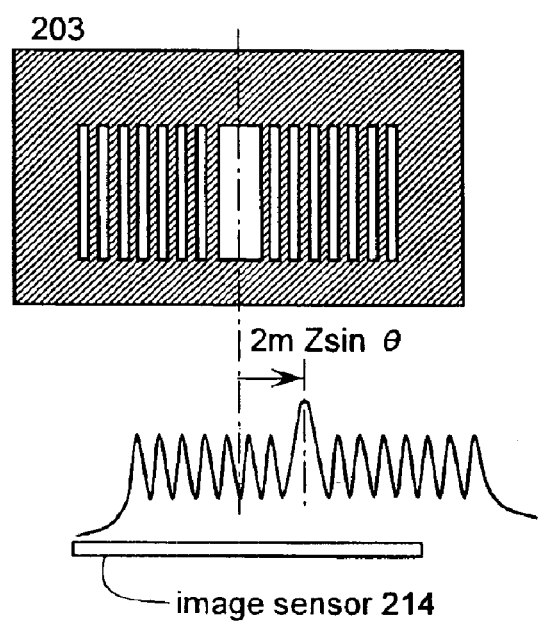

In the embodiment shown in FIG. 10, the projection stop 211 is placed at the front focus position of the projection lens 210, and the detection stop 216 is located at the rear focus position of the detection lens 215. It is for the purpose of eliminating fluctuations of magnifications caused when the sample 106 is elevated or lowered by placing the projection lens 210 and the detection lens 215 to the sample side tele-centric state. This embodiment shows the effect of making the shape and/or the spacing of the multi-slit-shaped pattern non-uniform. In order to enlarge the height detection range of the height detector 200 in this invention, using as many slits as possible is effective. By using many slits, a slit that is projected onto the sample 106 close to the optical axis of the upper observation system 110 is always found even if the height of the sample 106 changes greatly. However, in this case, when too many slits are used in the multi-slit-shaped pattern, the slits around the both ends can go outside the view area of the lens 210 or 215 or the image sensor 214, making it impossible to identify each slit, hence, making it impossible to estimate the movement (2 mZ sin θ) of each slit. As illustrated in FIGS. 41(a) and 41(b), by making the center spacing of the multi-slit larger or by making the center slit wider, it becomes possible to identify each slit as long as the center spacing or the center slit is within the viewing area of the height detector 200. With this embodiment, the height detectable range becomes larger. Many variations of the multi-slit-shaped pattern can be easily analogized in which the shape of each slit and/or the spacing between the neighboring slits are made different in order to identify each slit.

Also, in the embodiment shown in FIG. 10, the polarizing filter 240 is placed in front of the projection lens 210 to selectively project S-polarized light. This can achieve an effect for suppressing a positional shift caused by a multi-path reflection in a transparent film and an effect for suppressing a difference of reflectances between the areas.

Figure 12:
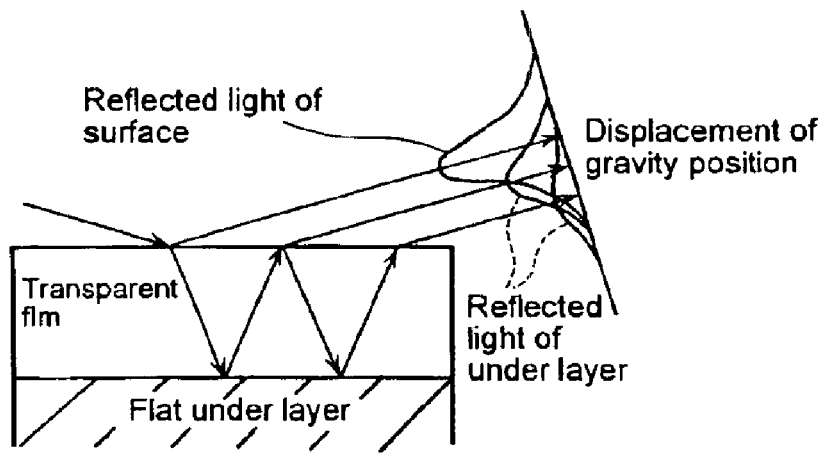
Figure 13:
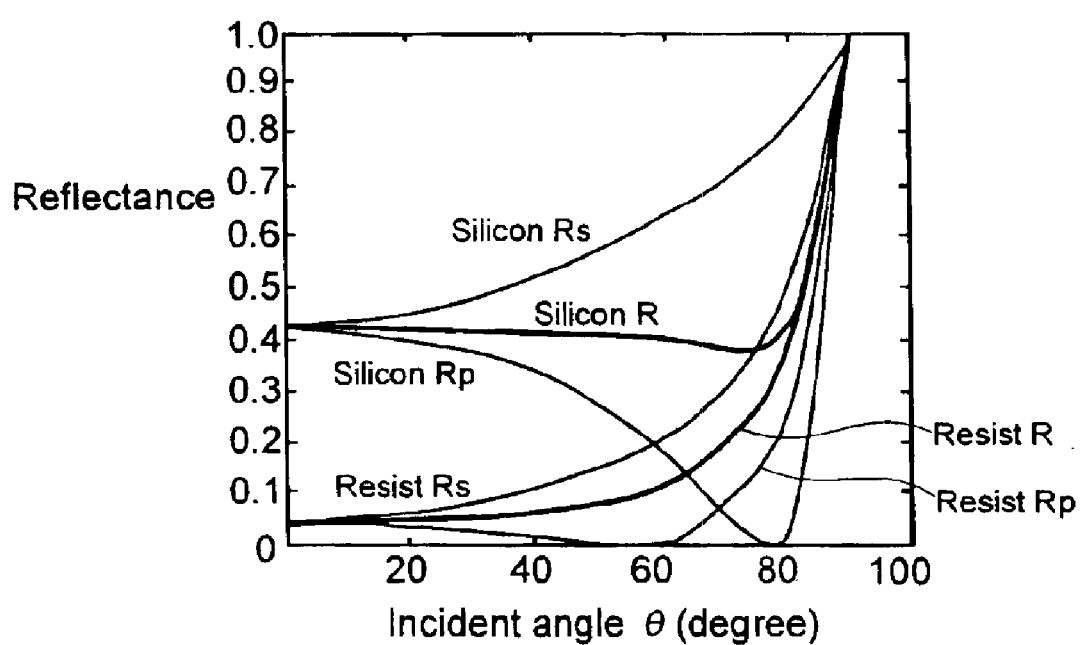

As shown in FIG. 12, when the surface of the sample is covered with a transparent film such as an insulating film for light, there occurs a phenomenon that projected light causes a multi-path reflection in the transparent film to thereby shift the position of projected light. Since S-polarized light is more easily shifted on the surface of the transparent film than P-polarized light, if the polarizing filter 240 is inserted, then S-polarized light becomes difficult to cause a multi-path reflection. On the other hand, FIG. 13 shows a graph graphing reflectances of resist and silicon which are examples of transparent films. Rs represents a reflectance of S-polarized light, Rp represents a reflectance of P-polarized light, and R represents a reflectance of randomly-polarized light. As described above, the S-polarized light has a smaller difference of reflectances between the materials. Further, a study of this graph reveals that the reflectance increases as the incident angle increases and that a difference between the materials decreases. Specifically, an error becomes difficult to occur at the pattern boundary. Therefore, the incident angle θ should preferably as large as possible. The incident angle should preferably become greater than 80° ideally, and it is preferable to use an incident angle of at least greater than 60°. Incidentally, the position of the polarizing filter 240 is not limited to the front of the projection lens 210, and may be interposed at any position between the light source 201 and the detector 214 with substantially similar effects being achieved. Although the light source 201 may be a laser light source or a light-emitting diode, it should preferably be a lamp of a wide zone such as a halogen lamp, a metal halide lamp or a mercury lamp. Alternatively, a laser or a light-emitting diode having a plurality of wavelengths may be used, and such a plurality of wavelengths may be mixed by a dichroic mirror. The reason for this is that single light tends to cause a multi-path interference within the transparent film to thereby shift projected light or a difference of reflectances due to a material or a pattern on the sample tends to increase so that a large error tends to occur.

In the embodiment shown in FIG. 10, the cylindrical lens 213 is located in front of the line image sensor 214. The reason for this is that light is focused on the line image sensor 214 to increase a quantity of detected light and that an error is decreased by averaging reflected light from a wide area on the sample. However, the use of the cylindrical lens 213 is not an indispensable condition, and should be determined in response to the necessity.

Figure 14:
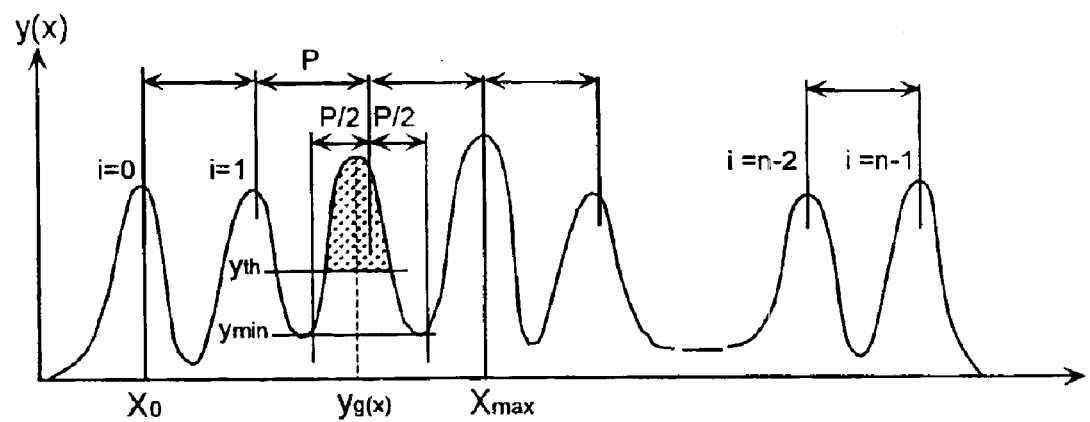
FIG. 14 shows waveforms used to explain a height detection algorithm processed by a height calculating unit of a height detection apparatus according to an embodiment of the present invention.

A height detection algorithm of the sample surface 106 according to an embodiment will be described next with reference to FIG. 14. Let it be assumed that n is the total number of slits, p is the pitch and y(x) is the detection waveform. Also, let it be assumed that ygo(i) (i=0, ..., n−1) represents the position of the peak corresponding to each slit obtained when the height z=0 (relationship of ygo(i)=ygo (0)+p*i is satisfied).

1. Scan y(x) and calculate a position xmax of maximum value.
2. Calculate the substantial position of the peak i by searching left and right directions from xmax by each pitch
3. Assuming that xo represents the peak position of the left end, then the substantial position of the peak i becomes xo+p*i. The positions of the left and right troughs xo+p*i−p/2, xo+p*i+p/2.
4. Set ymin=max(y(xo+p*i−p/2), y(xo+p*i+p/2). That is, a larger one of left and right troughs is set to ymin.
5. Set k to a constant of about 0.3, and set yth=ymin+k* (y(xo+p*i)−ymin). That is, set amplitude (y(xo+p*i)−ymin) *k to a range value (threshold value) yth.
6. Calculate a center of gravity of y(x)−yth relative to a point at which y(x)>yth is satisfied between xo+p*i−p/2 and xo+p*i+p/2, and set the value thus calculated to yg(i).
7. Calculate weighted mean of yg(i)−ygo(i), and set the calculated weighted mean to image shift.
8. Calculate the height z by adding an offset to a value which results from multiplying the image shift with a detection gain (1/(2 m·sin θ)).

In this manner, there is realized the height detection which is difficult to be affected by the surface state of the sample 106. Incidentally, in this embodiment, the peak of the slit image is used but instead a trough between the slit images may be used. Specifically, a center of gravity of yth–y(x) is calculated with respect to a point of y(x)<yth and set to a center of gravity of each trough. Then, the shifted amount of the whole image is obtained by averaging the movement amount of these trough images. Thus, there can be achieved the following effects. Since the detection waveform is determined based on the product of the projection waveform and the reflectance of the sample surface, the bright portion of the slit image is largely affected by the fluctuation of the reflectance, and the shape of the detection waveform tends to change. On the other hand, the trough portion of the waveform is difficult to be affected by the reflectance of the sample surface. Therefore, by the height detection algorithm based on the measurement of the movement amount of the trough between the slit images, it is possible to reduce the detection error caused by the surface state of the object much more.

The height detection optical apparatus 200a according to a second embodiment according to the present invention will be described next with reference to FIG. 15. In the first embodiment shown in FIG. 10, since the multi-slit-shaped pattern 203 is projected from the oblique upper direction, when the sample surface 106 is elevated and lowered, the position at which the pattern is projected on the sample, i.e. the sample measurement position 217 is shifted and displaced from the detection center 110. Assuming that Z is the height of the sample and θ is the projection angle, then this shift amount is represented by Z tan θ. At that time, if the sample surface 106 is inclined by ε, then there occurs a detection error. The magnitude of this detection error is Z·tan θ·tan ε. For example, when Z is 200 μm, θ is 70 degrees and tanε is 0.005, the above-mentioned detection error becomes 2.7 μm. When this problem arises, the arrangement of the second embodiment shown in FIG. 15 can achieve the effects. Specifically, the pattern projection/detection are carried out from the left and right symmetrical directions, and the two detected values are averaged, whereby the height of the constant point 110 can be obtained.

The second embodiment shown in FIG. 15 will hereinafter be described in detail. Since the arrangement is symmetrical, the same constituents are constantly located at the corresponding positions, and hence the other side of the constituents need not be described. It is to be appreciated that the projection and detection from the symmetrical direction are also the same. Light emitted from the light source 201 illuminates the mask 203 on which the multi-slit-shaped pattern is drawn. Of the light, light reflected by the half-mirror 205 is projected by the projection/detection lens 220 onto the sample 106 at its position 217. The multi-slit-shaped pattern projected on the sample 106 is regularly reflected and focused on the line image sensor 214 by the projection/detection lens 220 disposed on the opposite side. At that time, a luminous flux that has passed through the half mirror 205 is focused on the line image sensor 214. Assuming that m is the magnification of the detection optical system, when the height of the sample is changed by z, the multi-slit image is shifted by 2 mz·sin θ on the whole. By using this fact, the height of the sample 106 is calculated from the shifted amounts of the left and right multi-slit images. Then, an average value is calculated by using the height detection values of the left and right detection systems, and the average value thus calculated is obtained as a height detected value at the final point 110. When the above-mentioned height detection apparatus is used as the auto focus height sensor, the height detection position becomes the optical axis of the upper observation system. Incidentally, it is needless to say that the half mirror 205 may be replaced with a beam splitter of cube configuration as long as the beam splitter passes a part of light and reflects a part of light. Moreover, similarly to the first embodiment shown in FIG. 10, by using the cylindrical lens 213, the longitudinal direction of the slit may be contracted and focused on the line sensor 214.

The height detection optical apparatus 200a according to a third embodiment of the present invention will be described next with reference to FIG. 16. Although this arrangement is able to constantly obtain the height of the constant point 110 similarly to FIG. 15, in FIG. 15, a quantity of light is reduced to ½ by the half mirror 205 so that, when light is passed through or reflected by the half mirror 205 twice, a quantity of light is reduced to ¼. Therefore, if a polarizing beam splitter 241 is inserted instead of the half mirror 205 and a quarter-wave plate is interposed between the polarizing beam splitter 241 and the sample 106 as shown in FIG. 16, then it becomes possible to suppress the reduction of the quantity of light to ½. Specifically, light emitted from the light source 201 illuminates the mask 203 having the multi-slit-shaped pattern formed thereon. Of the light, S-polarized component reflected by the polarizing beam splitter 241 is passed through the quarter-wave plate 242 and thereby converted into circularly-polarized light. This light is projected by the projection/detection lens 220 onto the sample 106 at its position 217. The multi-slit pattern projected onto the sample is regularly reflected, and then focused on the line image sensor 214 by the projection/detection lens 220 disposed on the opposite side. At that time, the circularly-polarized light is converted by the quarter-wave plate 242 into P-polarized light. This light is passed through the polarizing beam splitter 242 without being substantially lost, and then focused on the line image sensor 214, thereby making it possible to reduce the loss of the quantity of light. Moreover, if a laser for generating polarized light is used as the light source 201 to enable S-polarized light to pass the first polarizing beam splitter 241, then it becomes possible to substantially suppress the loss of the quantity of light. Assuming that m is the magnification of the detection optical system, then when the height of the sample is changed by z, the multi-slit image is shifted by 2 mz·sin θ on the whole. By using this fact, the height of the sample 106 is calculated from the shift amounts of the left and right multi-slit images. An average value is calculated by using the two height detected values of the left and right detection systems, and the average value thus calculated is determined as a height detected value at the final point 110. When the height detection optical apparatus is used as the auto focus height sensor, the height detection position 110 becomes the optical axis of the upper observation system. It is needless to say that the longitudinal direction of the slit may be contracted by using the cylindrical lens 213 and focused on the line image sensor 214 similarly to the first embodiment shown in FIG. 10.

Figure 18:
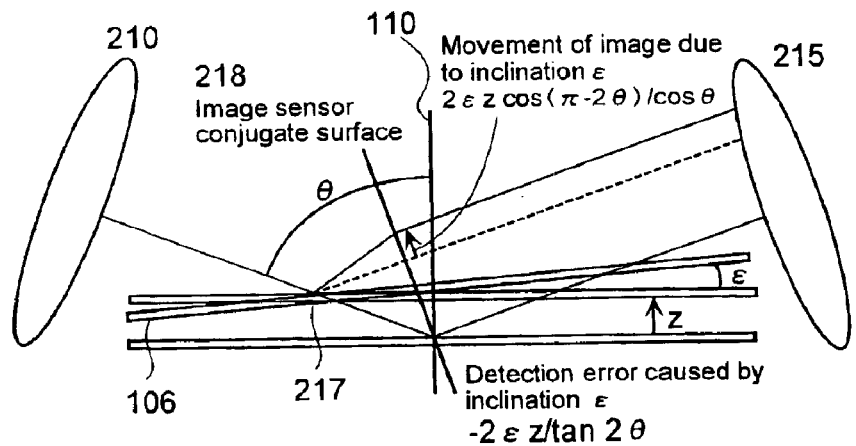
FIG. 18 is a diagram used to explain the manner in which a detection error caused by the inclination of a sample is eliminated in the height detection optical apparatus according to the present invention.

Further, the manner in which an error caused by another cause can be canceled out by using the arrangement of the second or third embodiment shown in FIG. 15 or 16 will be described with reference to FIG. 18. FIG. 18 is a partly enlarged view of FIG. 10, in which reference numeral 210 denotes a projection lens and reference numeral 215 denotes a detection lens. If reference numeral 218 denotes a conjugation surface or focusing surface formed on the image sensor 214 by the detection lens 215, then the shift amount of projected light on this conjugation surface 218 is detected on the image sensor 214. When the height of the sample 106 is increased by z, the detection light reflection position 217 is shifted from the height detection position 110 by z·tan θ. Further, when the sample surface 106 is inclined by an angle εrad, the detection light reflected on the reflection position 217 is inclined by an extra angle of 2εrad due to a so-called optical lever effect. Then, the detection light position on the conjugation surface 218 is shifted by 2εz·cos(π−2θ)/cos θ. Since a height detection error results from multiplying this shifted amount with ½ sin θ, the detection error caused by the inclination of εrad of the sample 106 is represented by −2εz/tan 2θ. For example, assuming that z is 200 μm, θ is 70 degrees and tan ε is 0.005, then the above-mentioned detection error becomes 2.4 μm. When this problem arises, the arrangement of the second or third embodiment shown in FIG. 15 or 16 can achieve the effects. Specifically, the error caused by the above-mentioned optical lever effect becomes the same magnitude and becomes opposite in sign when the projection or detection is carried out from the opposite direction as shown in FIG. 15 or 16. Therefore, when height detection values from the left and right image sensors are averaged, an error can be canceled out. Thus, it becomes possible to carry out the height detection which is free from the error caused by the inclination of the sample surface 106.

Figure 19A:
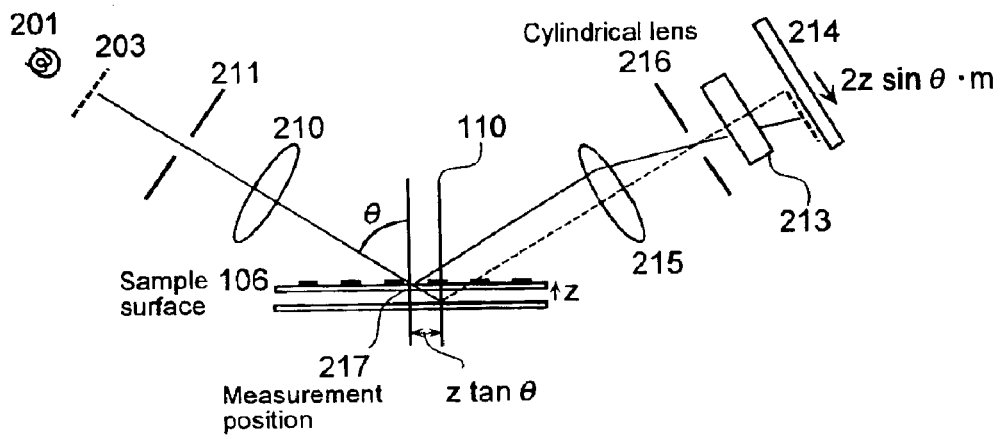
FIGS. 19(a) and 19(b) are diagrams used to explain the manner in which a height is detected by the selection of the slit under the condition that a detection position is not displaced by a height of a sample surface in the height detection apparatus according to the present invention.
Figure 19B:
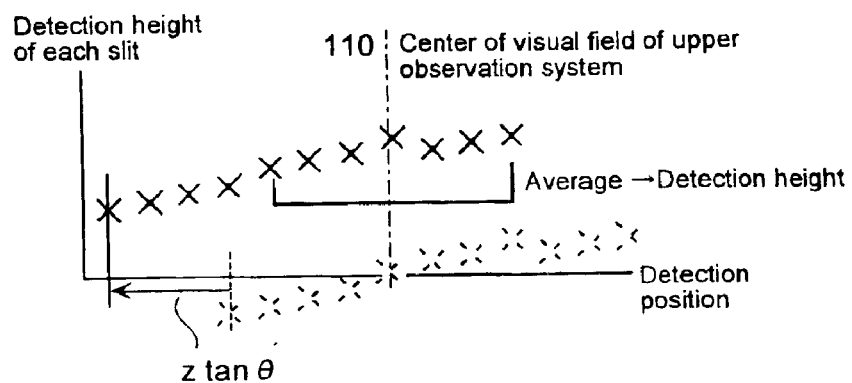

Next, the manner in which the height of the sample surface 106 can be obtained accurately by the height calculating unit 200b even when the height z of the sample surface 106 is changed will be described with reference to FIGS. 19(a)–19(b). Although the optical system shown in FIG. 19(a) is identical to that shown in FIG. 10, if the height of the sample surface 106 is changed by z, then the detection position of the slit image is changed by z·tan θ. Since the pattern of the multi-slit shape is projected and the respective slits are reflected at different positions on the sample, the shift amount of each slit image reflects a height corresponding to each reflected position on the sample. Specifically, as shown in FIG. 19(b), there is obtained surface-shaped data of the sample 106. FIG. 19(b) shows a detection height of each slit with respect to the detection position corresponding to the height of the sample surface 106. A measurement point shown by a dotted line indicates measured data obtained when the sample 106 is located at the reference height. When the sample 106 is elevated by z, as shown by a solid line, the sample detection position corresponding to each slit is shifted to the left by z·tan θ. As is defined in the description of the embodiment shown in FIG. 10, assuming that p/cos θ is the pitch of the multi-slit-shaped pattern on the sample surface 106, then the slit corresponding to the visual field center 110 of the upper observation system is shifted to the right by z·tan θ/(p/cos θ)=z·sin θ/p.

Therefore, the height calculating unit 200b can select a plurality of slits containing this slit at the center, average height detection values from these slits, determine the value thus averaged as a final height detection value, and can accurately obtain the height at the visual field center 110 of the upper observation system. In order for the height calculating unit 200b to calculate z·sin θ/p, it is necessary to know the height z. Since the z required may be an approximate value for selecting the slit, the height that was calculated previously or the detection height obtained before the detection position displacement is corrected may be used as the height z. Incidentally, the position equivalent to the visual field center 110 is shifted on the image sensor by zm·sin θ as the height of the sample 106 is changed by z.

Further, when the appearance is inspected on the basis of the SEM image shown in FIGS. 3 and 4, the two-dimensional SEM images of a certain wide area should be latched. To this end, while the stage 105 is moved continuously, the beam deflector 102 should be driven to scan electron beams in the direction substantially perpendicular to the direction in which the stage 105 is moved, and the secondary electron detector 104 need detect the two-dimensional secondary electron image signal. Specifically, while the stage 105 is moved continuously in the X direction, for example, the beam deflector 102 should be driven to scan electron beams in the Y direction substantially perpendicular to the direction in which the stage 105 is moved, and then the stage 105 is moved stepwise in the Y direction. Thereafter, while the stage 105 is continuously moved in the X direction, the beam deflector 102 should be driven to scan electron beams in the Y direction substantially perpendicular to the direction in which the stage 105 is moved, and the secondary electron detector 104 should detect the two-dimensional secondary electron image signal.

Also in this embodiment, the height detection apparatus 200 should constantly detect the height of the surface of the inspected object 106 from which the secondary electron image signal is detected and obtain the correct inspected result by executing the automatic focus control.

Figure 20:
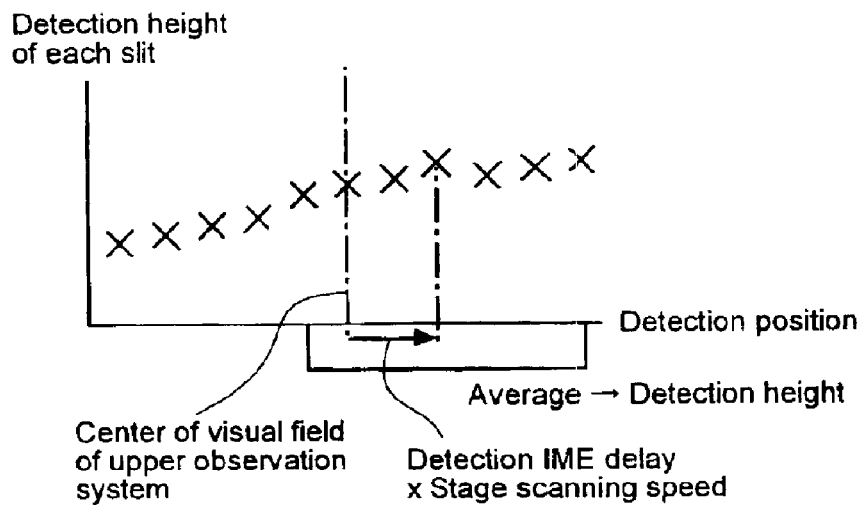
FIG. 20 is a diagram used to explain a height detection which can correct a detection position displacement caused by a detection time delay and a sample scanning on the basis of the selection of the slit in the height detection apparatus according to the present invention.

However, due to an image accumulation time of the image sensor 214 in the height detection optical apparatus 200a, a calculation time in the height calculating unit 200b, the responsiveness of the focus position control apparatus 109 or the like, it is frequently observed that a focus control is delayed. Therefore, even when the focus control is delayed, light should be accurately focused on the surface of the inspected object 106 from which the secondary electron image signal is detected. In FIG. 20, let it be assumed that the stage 105 is continuously moved from right to left. In this case, taking the above-mentioned delay time into consideration, the height calculating unit 200b may calculate the height slightly shifted right from the visual field center 110 of the upper observation system, and the focus control apparatus 109 may control the focusing by controlling the focus control current or the focus control voltage to the objective lens 103. The shift amount of the necessary detection position becomes a product VT of the above-mentioned delay time T and the scanning speed (moving speed) V of the stage 105. Specifically, as shown in FIG. 20, the height calculating unit 200b can obtain the values corresponding to the heights by using signals from images of slit groups shifted to the right by VT/(p/cos θ) from the upper observation system visual field center 110 detected from the image sensor 214, average the values thus obtained, and can detect the height in which the delay time is corrected by determining the averaged value as the final height detection value. Incidentally, the measurement position shift amount VT on the sample corresponds to VTm·cos θ on the image sensor 214. As described above, even when the focus control is delayed, since the height calculating unit 200b can calculate the height of the surface of the inspected object 106 from which the secondary electron image signal is detected, the focus control apparatus 109 can accurately focus light on the surface of the inspected object 106 from which the secondary electron image signal is detected by controlling the focus control current or the focus control voltage to the objective lens 103.

In this embodiment, the detection position displacement caused by the change of the height of the sample surface 106 shown in FIG. 19(b) and the time delay shown in FIG. 20 are both corrected. When the two-side projection shown in FIGS. 15 and 16 is used, the detection position displacement caused by the change of the height of the sample surface 106 is canceled out automatically so that only the time delay may be corrected.

Figure 21:
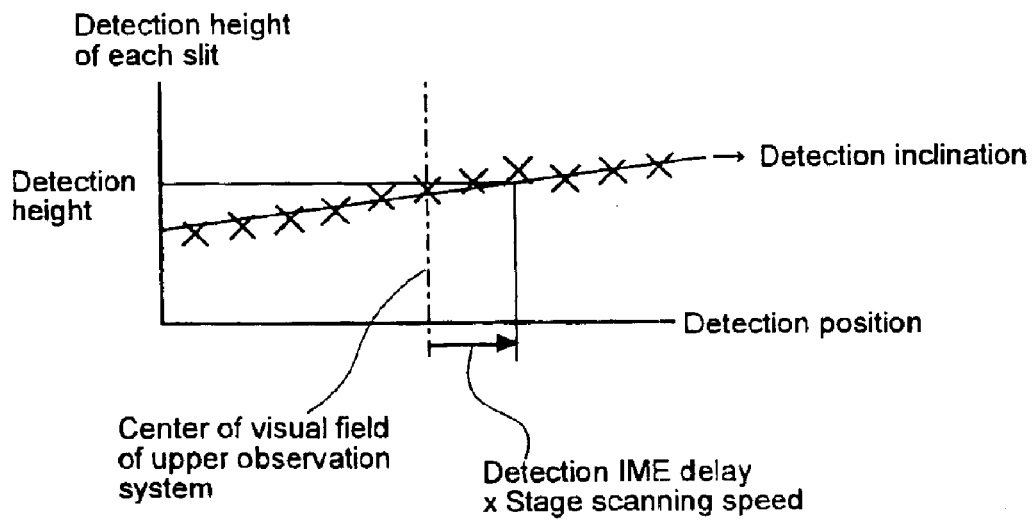
FIG. 21 is a diagram used to explain the manner in which a height of an arbitrary point can be detected by using detected surface-shape data in the height detection apparatus according to the present invention.

FIG. 21 shows an embodiment in which the time delay is corrected not by using the averaged value of the height detection values as shown in FIG. 20, but the final height detection value is calculated by applying a straight line to the surface shape of the detected sample surface 106. In this fashion, the height calculating unit 200b may apply a straight line to detected height data obtained from the position of each slit according to the method of least squares, for example, calculate the height of the position shifted by $-zm \cdot \sin \theta + VTm \cdot \cos \theta$ on the image sensor (CCD) 214 by using the resultant straight line, and may determine the height thus obtained as the final detected height. As shown in FIGS. 5(a)–5(c), when the surface shape of the sample surface is partly uneven like the semiconductor memory comprising the memory cell portion 3c and the peripheral circuit portion 3b, it is possible to selectively detect only the height of the high portion of the surface shape of the sample surface by using a suitable method such as a Hough transform instead of the method of least squares. As described above, even when the focus control is delayed, since the height calculating unit 200b calculates the height in accordance with the surface shape of the inspected object 106 from which the secondary electron image signal is detected, the focus control apparatus 109 can precisely focus light on the surface shape of the inspected object 106 from which the secondary electron image signal is detected by controlling the focus control current or the focus control voltage to the objective lens 103. Also, as shown in FIGS. 5(a)–5(c), in the case of the semiconductor memory comprising the memory cell portion 3c and the peripheral circuit portion 3b which are different in height on the surfaces, it becomes possible to accurately focus light on the surface shape.

Figure 22:
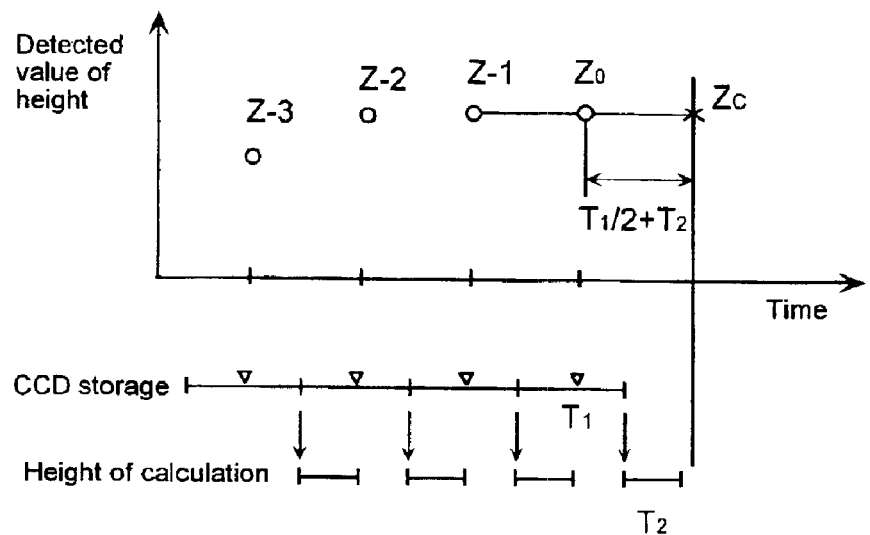
FIG. 22 is a diagram used to explain a detection time delay correction method that can be used regardless of a scanning direction of a stage and a projection-detection direction of a multi-slit in the height detection apparatus according to the present invention.

In the embodiment shown in FIGS. 19, 20, 21, there is illustrated the detection time delay correction method obtained on the assumption that the scanning direction of the stage 2 and the projection-detection direction of multi-slit are substantially parallel to each other. A detection time delay correction method that can be used regardless of the scanning direction of stage and the projection-detection direction of multi-slit will be described next. Since the line image sensor 214 outputs image signals accumulated during a certain time T1, it can be considered that the line image sensor may obtain an average image of the period T1. Specifically, data obtained from the line image sensor 214 has a time delay of T1/2. Further, in order for the height calculating unit 200b formed of the computer, a constant time T2 is required. Thus, the height detection value indicates past information by a time of (T1/2)+2 in total. As shown in FIG. 22, assuming that detection values obtained at a constant interval are Z-m, Z-(m-1), ..., Z-2, Z-1, Z0, then the height calculating unit 200b can estimate a present time Zc from these data. As shown in FIG. 22, for example, it is possible to obtain the present height Zc by extrapolating the latest detection value Z0 and a preceding detection value with straight lines as in the following equation of (expression 25):

$$Zc = Z0 + ((Z0) - (Z-1)) \times ((T1/2) + T2)/T1 \qquad \text{(expression 25)}$$

Extrapolation straight lines may of course be applied to more than three points Z-m, Z-(m-1), ... Z-2, Z-1, Z0 so as to reduce an error or a quadratic function, a cubic function or the like may be applied to these points. These extrapolation methods are mathematically well known, and when in use, the most suitable one may be selected in accordance with the magnitude of the change of the height detection value and the magnitude of the fluctuations.

Figure 23:
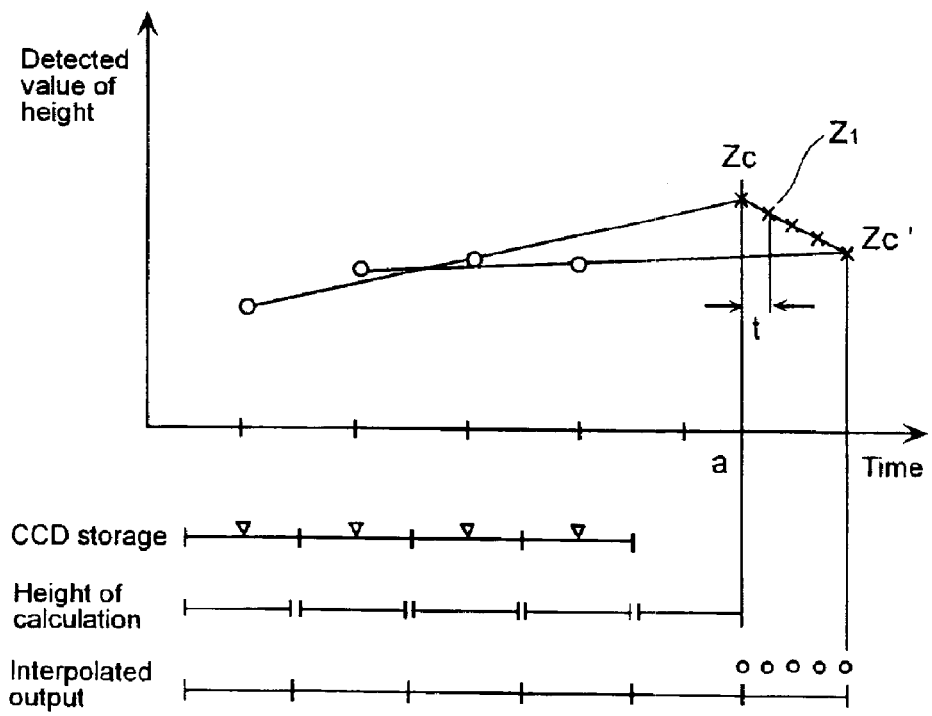
FIG. 23 is a diagram used to explain a detection time delay correction method that can be used regardless of a scanning direction of a stage and a projection-detection direction of a multi-slit in the height detection apparatus according to the present invention.

As another embodiment, the manner in which the height detection value is corrected and outputted will be described. When the height detection value changes stepwise at the interval T1, if the feedback is applied to electron beams by using such stepwise height detection values, then it is not preferable that the quality of electron beam image is changed rapidly at the interval T1. In this case, in addition to the extrapolation height detection value Zc, an extrapolation height detection value Zc' which is delayed by a time T1 from a time a is calculated similarly. In the embodiment shown in FIG. 23, the extrapolation height detection values Zc and Zc' are calculated by the following equation of (expression 26):

$$Zc = (Z-1) + (((Z-1) - (Z-3))/(2T1)) \times 2.5T1$$

$$Zc' = (Z0) + (((Z0) - (Z-2))/(2T1)) \times 2.5T1 \qquad \text{(expression 26)}$$

On the basis of these Zc and Zc', the height Z1 which is delayed by t from the time a can be calculated by interpolation as in the following equation of (expression 27):

$$Z1 = Zc + (Zc' - Zc)t/T1 \qquad \text{(expression 27)}$$

As described above, the detection time delay caused by the CCD storage time and the height calculation time can be corrected. Thus, even when height of the inspected object 106 is change every moment, a height detection value with a small error can be obtained, and a feedback can be stably applied to the electron optical system which controls electron beams.

Figure 24:
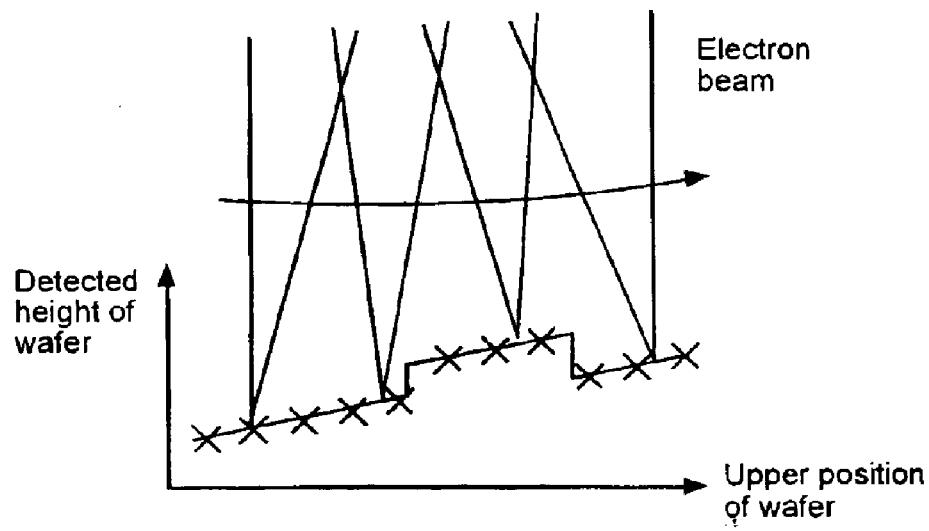
FIG. 24 is a diagram used to explain the manner in which a dynamic focus adjustment of electron beam is executed by using surface shape data detected from the height detection apparatus according to the present invention.

Further, in the electron optical system shown in FIGS. 2, 3, 4 and 7, since the focus position thereof can be controlled at a high speed by a focus control current or a focus control voltage, the focusing can be made by an embodiment shown in FIG. 24. Specifically, while electron beams are scanned once, the focus control apparatus 109 dynamically changes the focus position by controlling the focus control current or the focus control voltage to the objective lens 103 such that the position thus changed may agree with the surface shape of the sample surface 106 detected by the height detection optical apparatus 200a and which is calculated by the height calculating unit 200b. Since the height calculating unit 200b is able to calculate the surface shape of the sample surface 106 from the image signal of the multi-slit-shaped pattern obtained from the image sensor 214 of the height detection optical apparatus 200a, while electron beams are scanned once, the focus control apparatus 109 can realize the properly-focused state by controlling the focus control current or the focus control voltage to the objective lens 103 in accordance with the surface shape of the sample surface 106 thus calculated. Thus, when an inspected object has a large stepped structure like a semiconductor memory, it becomes possible to accurately focus light on the inspected object constantly.

Figure 25:
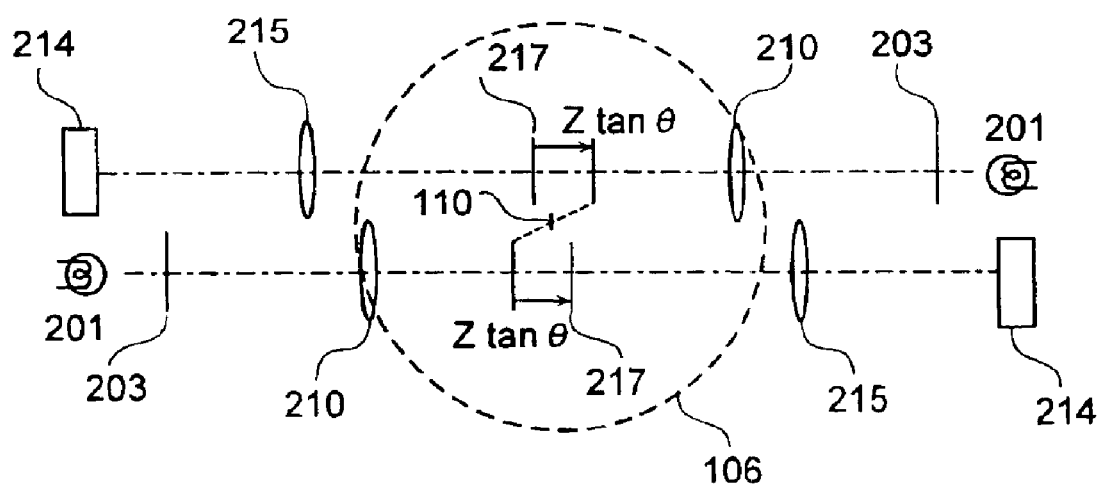
FIG. 25 shows an arrangement in which a measured position displacement is canceled out by both-side projections in a height detection optical apparatus according to another embodiment of the present invention.

FIG. 25 shows another embodiment of the two-side projection system shown in FIGS. 15 and 16. Specifically, in the embodiment shown in FIG. 25, two optical systems according to the embodiment shown in FIG. 10 are prepared and disposed side by side in which the detection directions are made opposite to each other. As shown in FIGS. 15 and 16, it is possible to realize a function equivalent to that of the arrangement which makes the left and right optical system common by using the half mirror 205. Specifically, also in the embodiment shown in FIG. 25, as the sample surface 106 is elevated and lowered, the detection apparatus 217 is moved right and left with the result that the position of the center of the detection apparatus 217 composed of the two optical systems can always be made constant. Therefore, it is possible to detect the height at the constant position 110 by averaging the height detection values obtained from these optical systems. Thus, it is possible to construct a height detector which can prevent a detection error from being caused when the detection position is displaced by the fluctuation of the height. However, since the patterns of multi-slit shape are projected at different positions, when the surface of the inspected object 106 has steps and undulations, detection light is not irradiated on the point 110 and a detection error occurs. Accordingly, the present invention is applicable when the surface of the inspected object has small steps and undulations.

Figure 26:
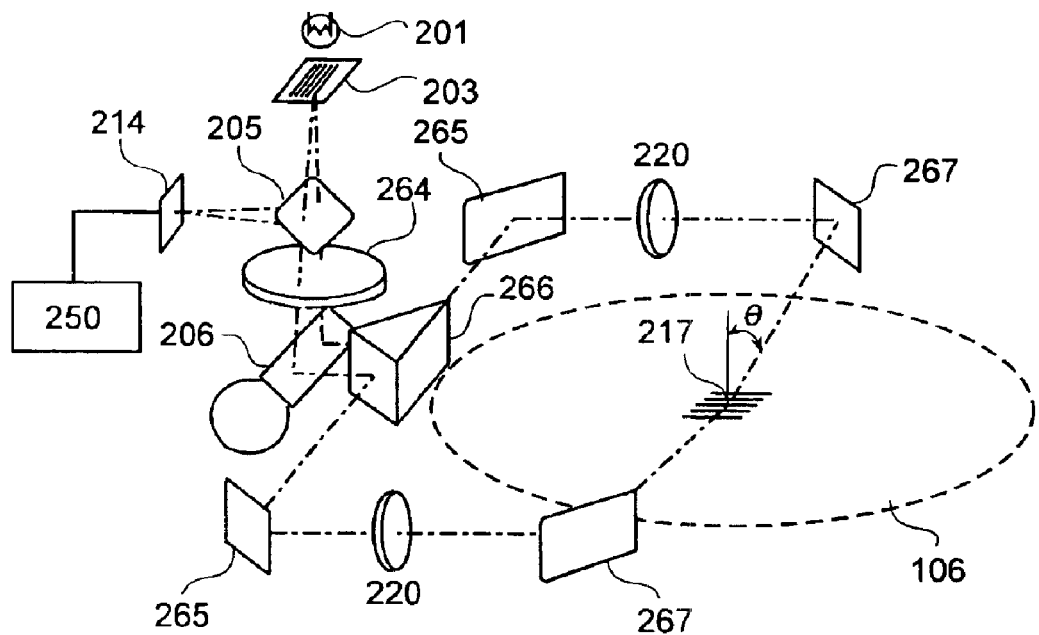
FIG. 26 shows an arrangement in which a measured position displacement is canceled out by both-side projections in a height detection optical apparatus according to another embodiment of the present invention.

Furthermore, FIG. 26 shows another embodiment of the two-side projection system shown in FIGS. 15 and 16. Specifically, in the embodiment shown in FIG. 26, two optical system use an illumination and an image sensor. Light emitted from a light source 201 illuminates a mask pattern 203 of multi-slit shape. Light passed through a multi-slit 203 is traveled through a half mirror 205, converted by a lens 264 into parallel light, reflected by a mirror 206, and branched by a branching optical system (roof mirror) 266 into two multi-slit light beams. The multi-slit light beams thus branched are projected by a projection/detection lens 220 through a mirror 267 to thereby focus an image of a mask pattern 203 at the measurement position 217 on the sample 106. An incident angle obtained at that time is assumed as θ. A pair of multi-slit light beams reflected on the surface of the sample 106 are returned through the same light paths as those of projected light and reached to the half mirror 205. Specifically, a pair of multi-slit light beams reflected on the surface of the sample 106 are reflected on the respective mirrors 267, traveled through the respective projection/detection lenses 220, reflected on the respective mirrors 265, reflected on the branching optical system 266, reflected on the mirror 206, synthesized by the lens 264 and reached to the half mirror 205. Light reflected on the half mirror 205 is focused on the image sensor 214. On the sensor 214, light beams that were branched into two directions by the branching optical system 266 are synthesized one more time so that only one illumination system and one image sensor 214 are sufficient. Moreover, since the height calculating unit 200b may process only one waveform, a load may be decreased. Therefore, it is possible to inexpensively realize a height detection apparatus which can prevent a detection position from being displaced by the two-side projection system.

As another embodiment, instead of an arrangement for controlling an angle of the mirror 206 electrically, if the mirror 206 is controlled in such a manner that the position at which the slit-shaped pattern image is focused on the image sensor 214 always becomes constant, then the irradiated position 217 of detection light on the sample can be maintained constant regardless of the height z of the sample 106. When the mirror is controlled as described above, the rotation angle of the mirror 206 and the height z are in proportion to each other so that the height z of the sample can be detected by detecting the rotation angle of the mirror 206.

Figure 27:
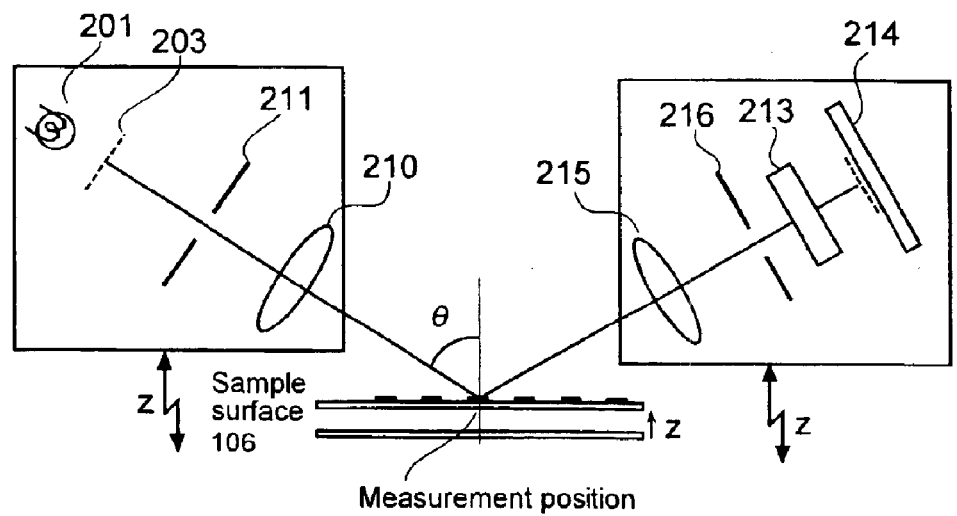
FIG. 27 shows an embodiment in which the same position is constantly detected by elevating and lowering a detector in a height detection optical apparatus according to the present invention.

FIG. 27 shows an embodiment of another arrangement in which the detection position can be prevented from being displaced. Although the layout of the optical system is the same as that of the embodiment shown in FIG. 10, the whole of the detector can be elevated and lowered. If the height of the whole of the detector is controlled such that the position of the slit on the image sensor 214 always becomes constant, then the detection light irradiated position 217 can be maintained constant regardless of the height z of the sample 106. The height z of the whole of the detector presented at that time agrees with the height z of the sample 106. Another advantage of this arrangement will be described. In the embodiment shown in FIG. 10, if a magnification color aberration exists in the lens 215, the position of the multi-slit image on the image sensor 214 is displaced by the color of the sample surface 217. That is, an error occurs in the detection height. As a result, it is necessary to suppress the color aberration of the lens 215. On the other hand, in the arrangement shown in FIG. 27, the center of the multi-slit pattern is constantly located on the optical axis under control. Since the color aberration does not occur on the optical axis, the color aberration of the lens and the distortion of image do not cause the detection error. Therefore, it becomes possible to construct a height detector of a small detection error by an inexpensive lens. Further, since the detection multi-slit pattern is not de-focused as the height of the sample is changed, the size of each slit can be reduced to approximately the limit of resolution of lens. Furthermore, there is the advantage that a height detection error caused by the reflectance distribution of the sample can be reduced.

Figure 28:
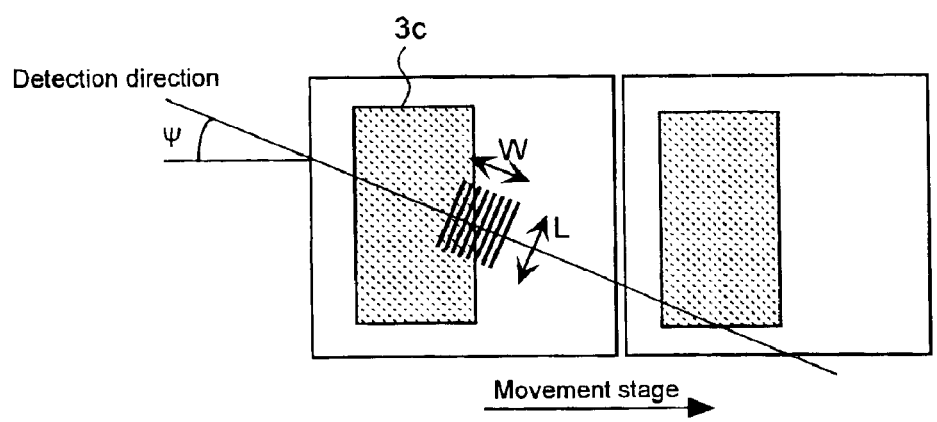
FIG. 28 is a diagram showing a direction of a projection slit and a pattern on a sample in a height detection optical apparatus according to the present invention.

A method of further decreasing a detection error by properly selecting the slit direction will be described next with reference to FIG. 28. When a semiconductor apparatus is inspected or observed as a sample, the semiconductor apparatus usually has a pattern such that an area such as a memory mat portion 3c is formed in each rectangular chip as shown in FIG. 28. Since it is customary that the memory mat portion has small patterns formed thereon, light tends to scatter/diffracted, thereby resulting in a low reflectance portion being formed. When the slit is irradiated on this boundary portion, a symmetry of a detection pattern obtained as a reflected light image is broken, and hence there occurs a detection error. On the other hand, when the longitudinal direction of the slit is irradiated on the pattern with an inclination angle φ relative to the pattern as shown in FIG. 28, a ratio of the portion in which the border line of the pattern crosses the slit relative to the length L of the slit is reduced so that an amount in which a symmetry of a detection pattern is fluctuated by a difference of reflectances at the boundary portion of the pattern can be decreased. That is, a detection error can be reduced. Thus, in addition to the error reduction achieved by the multi-slit, it is possible to achieve a further error reduction effect. In the embodiment shown in FIG. 28, the projection & detection direction and the longitudinal direction of the slit are perpendicular to each other, which is not always necessary. Specifically, the angle of the longitudinal direction of the slit projected on the sample 106 can be controlled by rotating the mask 203 on which there is formed the multi-slit like pattern. At that time, the cylindrical lens 213 and the line image sensor 214 also should be rotated in the direction opposing the sample 106 by the same angle as that of the mask 203. Assuming that η is this angle, then the direction of the slit projected on the sample 106 is rotated by arc tan(sin η/(cos η cos θ)) in the projection direction.

Figure 29A:
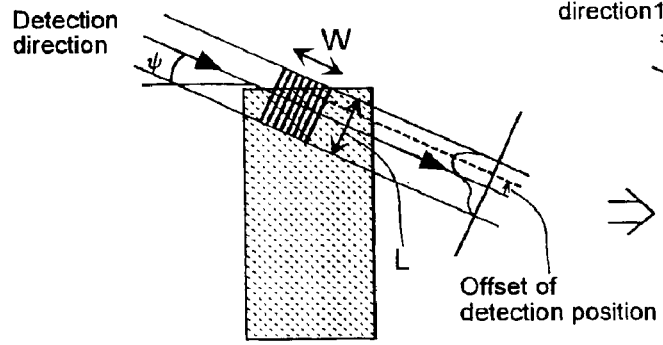
FIGS. 29(a) and 29(b) are diagrams showing a detection position displacement and the manner in which a detection position displacement is decreased in a height detection optical apparatus according to the present invention.
Figure 29B:
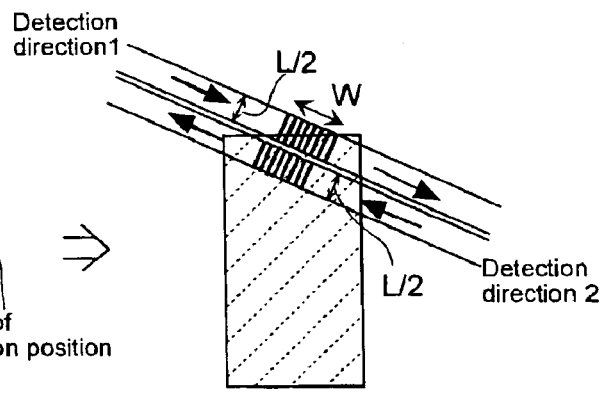

While the method of correcting the detection position of the projection direction by the multi-slit and the method of canceling out the positional displacement by the two-side projection have been described so far with respect to the phenomenon in which the detection position is displaced by the height z of the sample surface 106, a method of reducing a displacement of a detection position in the longitudinal direction of the slit, i.e. in the direction perpendicular to the projection direction will be described. When the longitudinal direction of the slit is projected across areas having different reflectances on the sample as shown in FIG. 29(a), detection light is given an intensity distribution in the longitudinal direction of the slit. In this case, the height distribution of the sample is reflected on the height detection value with a weighting corresponding to the light quantity distribution of this detected light. Specifically, the height detection value considerably reflects information of the area having the high reflectance with the result that a height of a point displaced from the height measurement point 110 is unavoidably measured. The resultant detection error is reduced as the size L of the longitudinal direction of the slit is reduced. However, the detection light quantity is decreased and is easily affected by a local fluctuation of the reflectance on the surface of the sample. Therefore, the size of the slit cannot be reduced freely. Accordingly, as is seen in the embodiments shown in FIGS. 15, 16, 26, 27, in the arrangement in which detection light is projected from both sides, the projection positions are displaced in the longitudinal direction of the slit in such a manner that the projection positions of the right and left slits may not overlap as shown in FIG. 29(*b*). Then, in the case of this embodiment, only the multi-slit pattern of a direction 1 is projected across the two areas so that a height detection value based on a detection direction 2 does not cause an error. Thus, it is possible to reduce an error to ½ by averaging height detection values of the detection direction 1 and the detection direction 2. In the embodiment shown in FIG. 29(*b*), the length of the slit is reduced to L/2 such that the total width of the projection areas of the projection direction 1 and the projection direction 2 may become L. Consequently, as compared with FIG. 29(*a*), the detection position displacement of the longitudinal direction of the slit can be reduced to ¼ on the whole.

An embodiment in which a two-dimensional distribution of the height of the sample 106 is obtained will be described next with reference to FIG. 30. Light emitted from the light source 201 illuminates the mask 203 with the pattern composed of rectangular repeated patterns, for example. This light is projected by the projection lens 210 at the position 217 on the sample 106. The multi-slit pattern projected onto the sample is focused by the detection lens 215 on the two-dimensional image sensor 214 such as a CCD. Assuming that m is the magnification of the detection system, then when the height of the sample is changed by z, the slit image is shifted by 2 mz·sin θ. Since this shift amount reflects a height of a point at which the slit irradiates the sample, by using this shift amount, it becomes possible to detect the height distribution of the sample 106 in the irradiated range of the slit.

Figure 30:
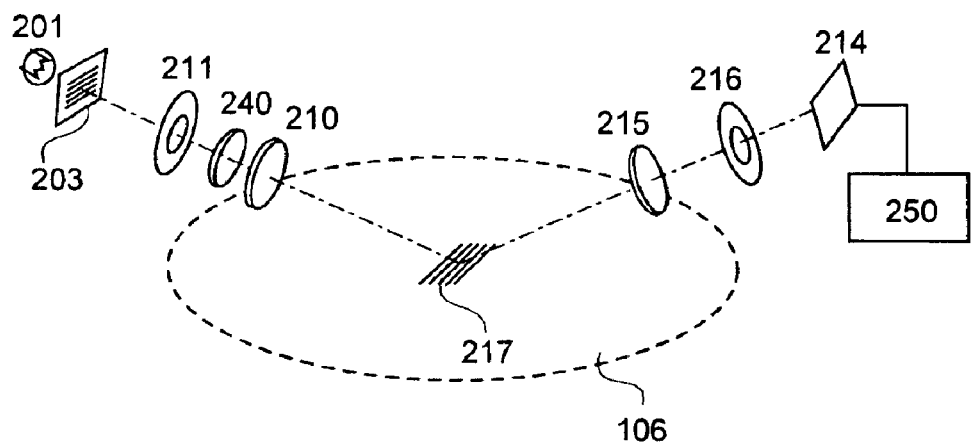
FIG. 30 shows an example of an arrangement in which a height distribution on a surface is measured in a height detection optical apparatus according to the present invention.

In the embodiment shown in FIG. 30, the stop 211 is disposed at the front focus position of the projection lens 210, and the stop 216 is disposed at the rear focus position of the detection lens 215. The reason for this is that a magnification fluctuation caused when the sample 106 is elevated and lowered can be eliminated by disposing the lenses 210 and 215 in a sample-side tele-centric fashion. Consequently, the magnification fluctuation caused by the change of the height of the sample surface 106 can be suppressed, and a detection linearity can be improved.

Moreover, as in the embodiment shown in FIG. 30, the polarizing filter 240 is disposed at the front of the projection lens 210 to selectively project S-polarized light. The reason for this is that, when a pattern formed on an insulating film or the like is inspected on the basis of the SEM image, the insulating film is a transparent film and therefore a multi-path reflection can be prevented in the transparent film, thereby making it possible to inspect the above-mentioned pattern while a difference of reflectances between the materials is suppressed. The polarizing filter 240 is not always disposed in front of the projection lens, and may be interposed between the light source 201 and the detector 214 with substantially similar effects being achieved.

Figure 31:
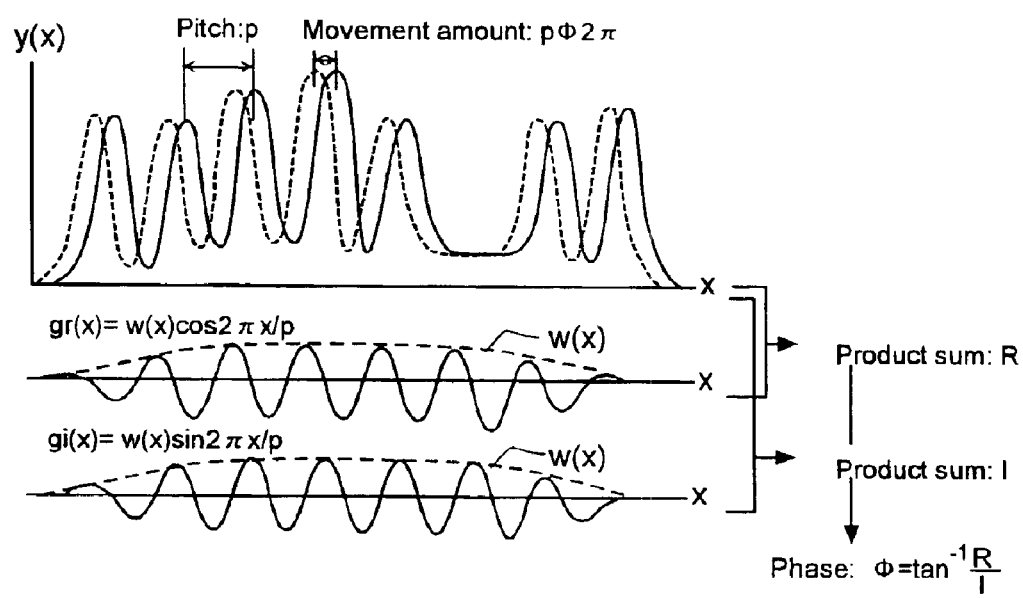
FIG. 31 shows waveforms used to explain the embodiment in which a position of a multi-slit pattern is detected by a Gabor filter which is a height detection algorithm processed by a height calculating means in a height detection apparatus according to the present invention.

With respect to a multi-slit shift amount detection algorithm executed by the height calculating unit 200b, an embodiment different from FIG. 14 will be described next. FIG. 31 shows a method of detecting a phase change φ of a cyclic waveform. Assuming that p is a pitch of a multi-slit shaped pattern, then the phase change φ(rad) corresponds to a shift amount pφ/2π. This shift amount corresponds to a height change pφ/(2πm·sin θ) so that the height detection is concluded as the detection of the phase change of the cyclic waveform. The height detection in the height calculating unit 200b can be realized by a product sum calculation. Specifically, the detection waveform is assumed to be y(x). Then, a product sum of the detection waveform and a function g(x)=w(x)exp(i2πx/p), and a resultant phase may be obtained where i is the imaginary number unit, and w(x) is the correlation function of a proper real number. When this correlation function is a Gaussian function, w(x) is, in particular, called a Gavore filter, and w(x) may be any function as long as the function may be smoothly lost at the respective ends. While the complex function is employed in the above description, it will be expressed by a real number as follows. Having calculated the product sum of gr(x)=w(x)·cos(i2πx/p) and gi(x)=w(x)·sin(i2πx/p) with y(x), results are set to R and I, respectively. Then, the phase of y(x) is represented as φ=arctan(I/R). However, since this phase is folded in a range of −π to π, phases may be coupled by searching the previous detection phases without a dropout or an approximate value of 2π-order of the phase is calculated by calculating the approximate position of the peak. Incidentally, while the weighting function w(x) and the width of the waveform y(x) are made substantially equal in this example, the portion which overlaps the weighting function w(x) is selected from the multi-slit image by reducing the width of the weighting function w(x) relative to the waveform y(x), and the shift amount of this portion can be calculated. Furthermore, by using a weighting function for selecting a right half portion from the multi-slit pattern existing range and a weighting function for selecting a left half portion from the multi-slit pattern existing range, the heights of the left half portion and the right half portion can be calculated with respect to the measurement position on the sample. Then, it is possible to obtain the height and the inclination of the sample by using such calculated results.

Furthermore, while the above-mentioned algorithm constructs the filter matched with the pitch p of the well-known multi-slit shaped pattern and uses this filter to detect the phase, the present invention is not limited thereto, and an FFT (Fast Fourier Transform) is effected on y(x) and a phase corresponding to a peak of a spectrum is obtained, thereby making it possible to detect the phase of the waveform y(x).

Figure 32:
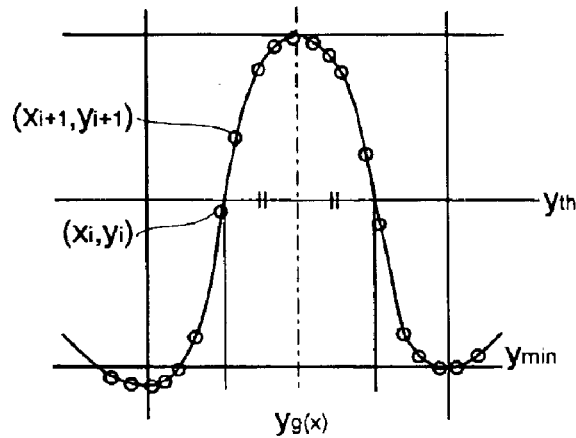
FIG. 32 is a graph in which a slit edge position which is a height detection algorithm processed by a height calculating means is measured in a height detection apparatus according to the present invention.

An embodiment of another slit shift amount measuring algorithm will be described next with reference to FIG. 32. In the embodiment shown in FIG. 14, the displacement of the slit image is measured by using the center of gravity. According to this method, such displacement is converted into a height on the basis of the position of the edge of the slit image. Initially, similarly to the embodiment shown in FIG. 14, the peak of each slit and the positions of troughs on the respective sides are calculated and a proper threshold value yth is calculated from the amplitude. Then, searching two points across this threshold value yth, resultant two points are set to (xi, yi) and (xi+1, yi+1). Then, x coordinates of a point at which the line connecting the above two points and threshold value cross each other are expressed by xi+(xi+1−xi) (yth−yi)/(yi+1−yi). This operation is effected on each of left and right inclined portions of the slit, the positions of the crossing points between the threshold values and this line are calculated, and then a middle point is determined as the position of the slit.

Moreover, the peak position of the slit can be determined as the position of the slit. The interpolation is executed in order to calculate the peak position with an accuracy below pixel. There are various interpolation methods. When a quadratic function interpolation, for example, is carried out, if three points before and after the maximal value are set to (x1−Δx, y0), (x1, y1) and (x1+Δx, y2), then the peak position is expressed by x1+Δx (y2−y0)/{2(2−y2−y2−y0)}.

While the above-mentioned methods have been described so far on the assumption that the position of the slit is calculated, the present invention is not limited thereto, and the position of the trough of the detection waveform is calculated and the shift of this position is detected, thereby making it possible to obtain the height of the sample. If so, the following effects can be achieved. The amount in which the waveform of the detection multi-slit pattern is fluctuated by the reflectance distribution on the surface of the sample increases much more when the reflectance boundary coincides with the peak portion of the multi-slit image as compared with the case in which the reflectance boundary coincides with the trough portion. The reason for this is that the detected light quantity distribution is determined based on a product of the light quantity distribution obtained when the reflectance of the sample is constant and the reflectance of the sample. Consequently, the bright portion tends to cause the change of the detected light quantity relative to the change of the same reflectance. Accordingly, if the position of the trough portion having the small fluctuation of the waveform is calculated, the position of the slit image can be detected and the height of the sample can be detected with a small error independently of the state of the reflectance of the sample. As the method of detecting the position of the trough portion, there may be used the algorithm for calculating a center of gravity relative to a code-inverted waveform −y(x) shown in FIG. 14 and the algorithm for calculating the point crossing the threshold value by the interpolation shown in FIG. 32.

Figure 33A:
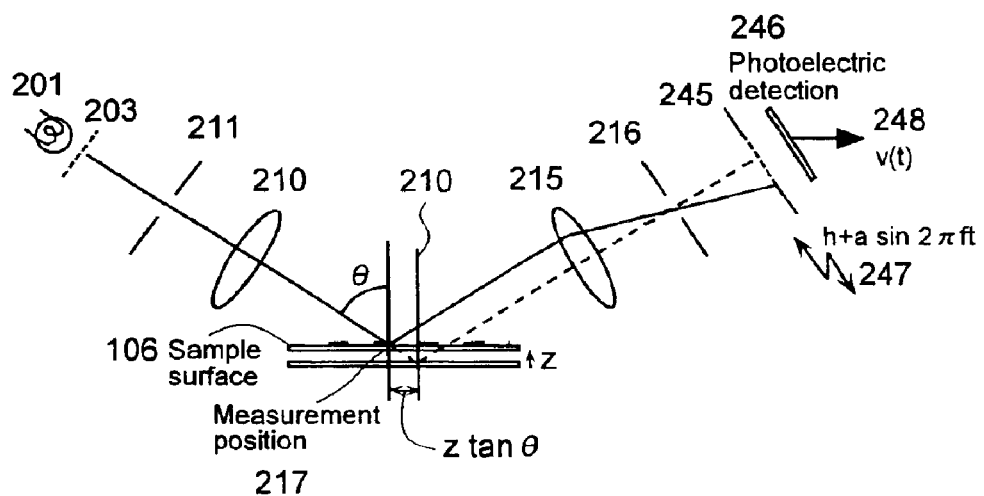
FIGS. 33(a) and 33(b) show an embodiment in which a position of a multi-slit image is measured by a vibrating mask in a height detection apparatus according to the present invention.
Figure 33B:
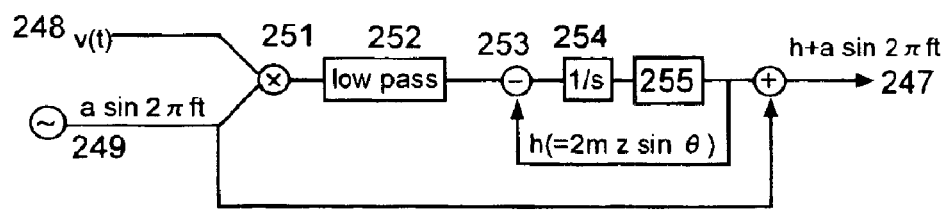

A method of detecting the position of the multi-slit image without the linear image sensor will be described next with reference to FIGS. 33(a)–33(b). As shown in FIG. 33(a), light emitted from a light source 201 illuminates a mask 203 on which the multi-slit shaped pattern is drawn. This multi-slit pattern is projected by a projection lens 210 at a position 217 on a sample 106. The multi-slit pattern projected onto the sample is focused by a detection lens 215 on a mask pattern 245. A quantity of light passed through this mask pattern 245 is detected by a photoelectric detector 246. The mask pattern 245 is the pattern having the same pitch as that of the mask 203, and is vibrated about h at a sin 2πft. In synchronism therewith, an output 248 of the photoelectric detector 246 is vibrated. If this is synchronizing-detected, then the direction of the positional displacement between the multi-slit image and the vibrating mask pattern 245 can be detected. If this detected positional displacement is fed back to the vibration center h of the pattern 245, then the position of the multi-slit image and the position of the vibrating mask pattern 245 can agree with each other constantly. Since the vibration center h of the pattern 245 obtained at that time is equal to 2 mz·sin θ, the height of the sample can be obtained from this fact. FIG. 33(b) is a block diagram showing this fact. An oscillator 249 supplies a signal of sine wave of a sin 2πft. This sine wave signal is supplied to a multiplier 251, in which it is multiplied with a signal v(t) (248) from the photoelectric detector 246 and supplied through a low-pass filter 252. Since this signal indicates the positional displacement from the multi-slit image of the mask 246, this signal is inputted to a temporary delay loop composed of a subtracter 253 (subtracts h (=2 mz·sin θ) obtained from a gain 255), an integrator 254, and the gain 255. This output becomes the vibration center h of the mask 245. The mask 245 is driven by a drive signal 247 which results from adding the signal a sin 2πft from the oscillator 249 to this signal. Thus, it is possible to maintain the multi-slit image and the vibration center position h of the mask pattern 245 coincident with each other.

Figure 34:
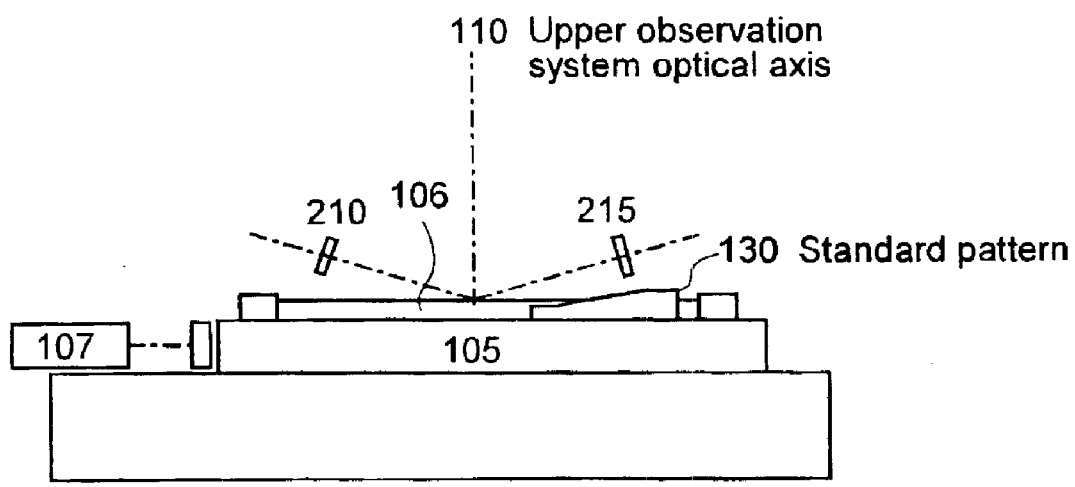
FIG. 34 shows an electron beam apparatus in which a standard pattern for correction is disposed on an X-Y stage.
Figure 35:
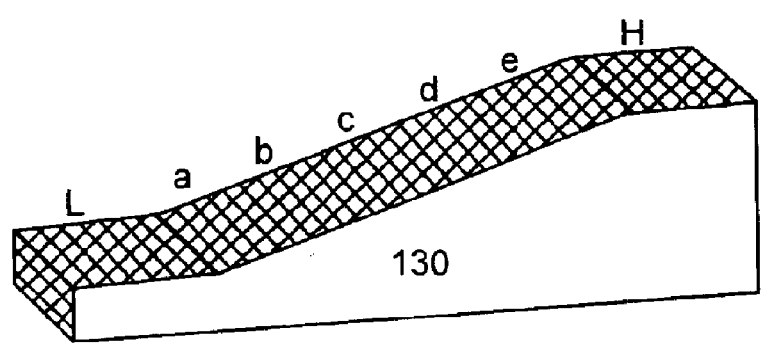
FIG. 35 shows in a perspective view a standard pattern for correction with an inclined portion.

An embodiment concerning a method of correcting a focus control current or a focus control voltage and a focus position of charged particle optical system (objective lens 103) in the observation SEM apparatus and the length measuring SEM apparatus including the appearance inspection SEM apparatus shown in FIG. 2 or 3 or 4 or 7 will be described. When a relationship between the control current and the focus position is nonlinear, a nonlinear correction is required. A method of evaluating a linearity and determining a correction value will be described. A correction standard pattern 130 shown in FIG. 35 is fixed to a sample holder on the stage 2 which holds the inspected object 106 and located as shown in FIG. 34. The correction standard pattern 130 is made of a conductive material so as to prevent the correction standard pattern from being charged when electron beams 112, which are charged particle beams, are scanned.

Figure 36A:
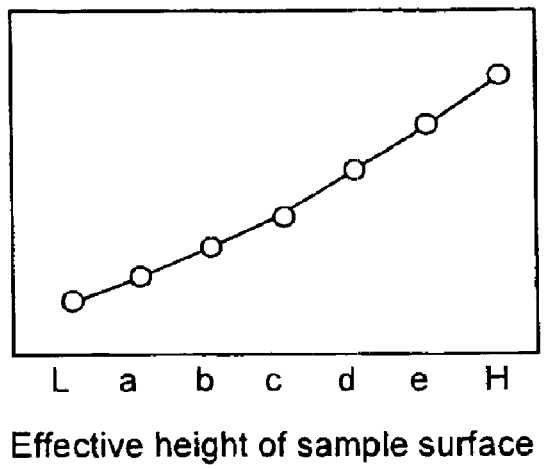
FIGS. 36(a)–36(c) are graphs used to explain a correction curve obtained by a standard pattern for correction in an electron beam apparatus according to the present invention.
Figure 36B:
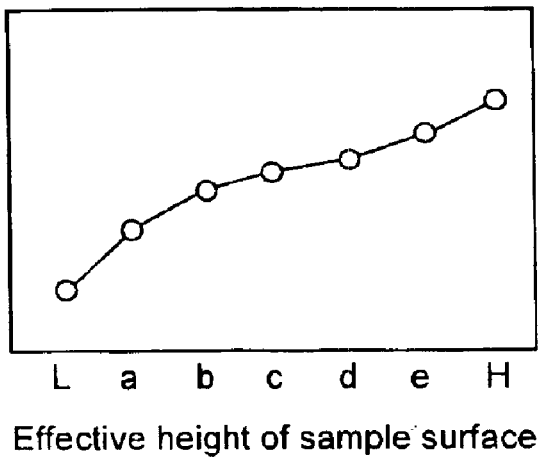
Figure 36C:
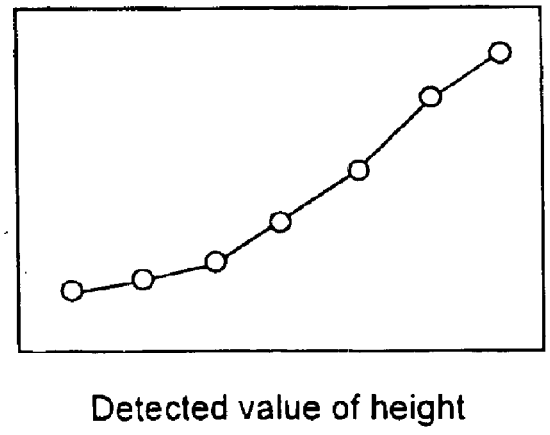

Upon correction, on the basis of the command from the entirety control unit 120, the stage control apparatus 126 is controlled in such a manner that this correction standard pattern 130 is moved about the upper observation system optical axis 110 in the observation area. The entirety control unit 120 uses this standard pattern 130 to obtain from the focus control apparatus 109 the focus control current or the focus control voltage under which the secondary electron image signal (SEM image signal) which is the charged particle beam image detected by the secondary electron detector 104 which is the charged particle detector becomes clearest at each point, and measures the same. At that time, the visibility of the secondary electron image (SEM image) which is the charged particle beam image is detected by the secondary electron detector 104. A digital SEM image signal converted by the A/D converter 39 (122) or the digital SEM image signal pre-processed by the pre-processing circuit 40 is inputted to the entirety control unit 120 and thereby displayed on the display 143 or stored in the image memory 47 and displayed on the display 50, thereby being visually confirmed or determined by the image processing for calculating a changing rate of an image at the edge portion of the SEM image inputted to the entirety control unit 120. Since the real height of the correction sample surface (correction standard pattern 130) is already known, if this height information is inputted by using an input (not shown), then the entirety control unit 120 is able to obtain a relationship between the real height of the sample surface and the optimum focus control current or focus control voltage by the above-mentioned measurement as shown in FIG. 36(a). Simultaneously, the height detection optical apparatus 200a and the height calculating unit 200b measure the height of the correction standard pattern 130, whereby the entirety control unit 120 obtains a correction curve indicative of a relationship between the real height of the sample surface and a measured height detection value measured by the height detection optical apparatus 200a and the height calculating unit 200b as shown in FIG. 36(b). A study of these two correction curves reveals that the entirety control unit 120 can detect, from the detection values obtained by the height detection optical apparatus 200a and the height calculating unit 200b, the optimum focus control current or focus control voltage under which a properly-focused charged particle beam image is picked up. Moreover, instead of obtaining separately two sets of correction curves of the height of the sample surface and the detection value obtained by the height detection optical apparatus 200a or the like and the real height of the sample surface and the focus control current or focus control voltage, the entirety control unit 120 may directly obtain a correction curve presented between the detection value obtained by the height detection optical apparatus 200a and the focus control current or focus control voltage as shown in FIG. 36(c). In this case, the real height of the correction standard pattern 130 need not be detected.

Figure 38:
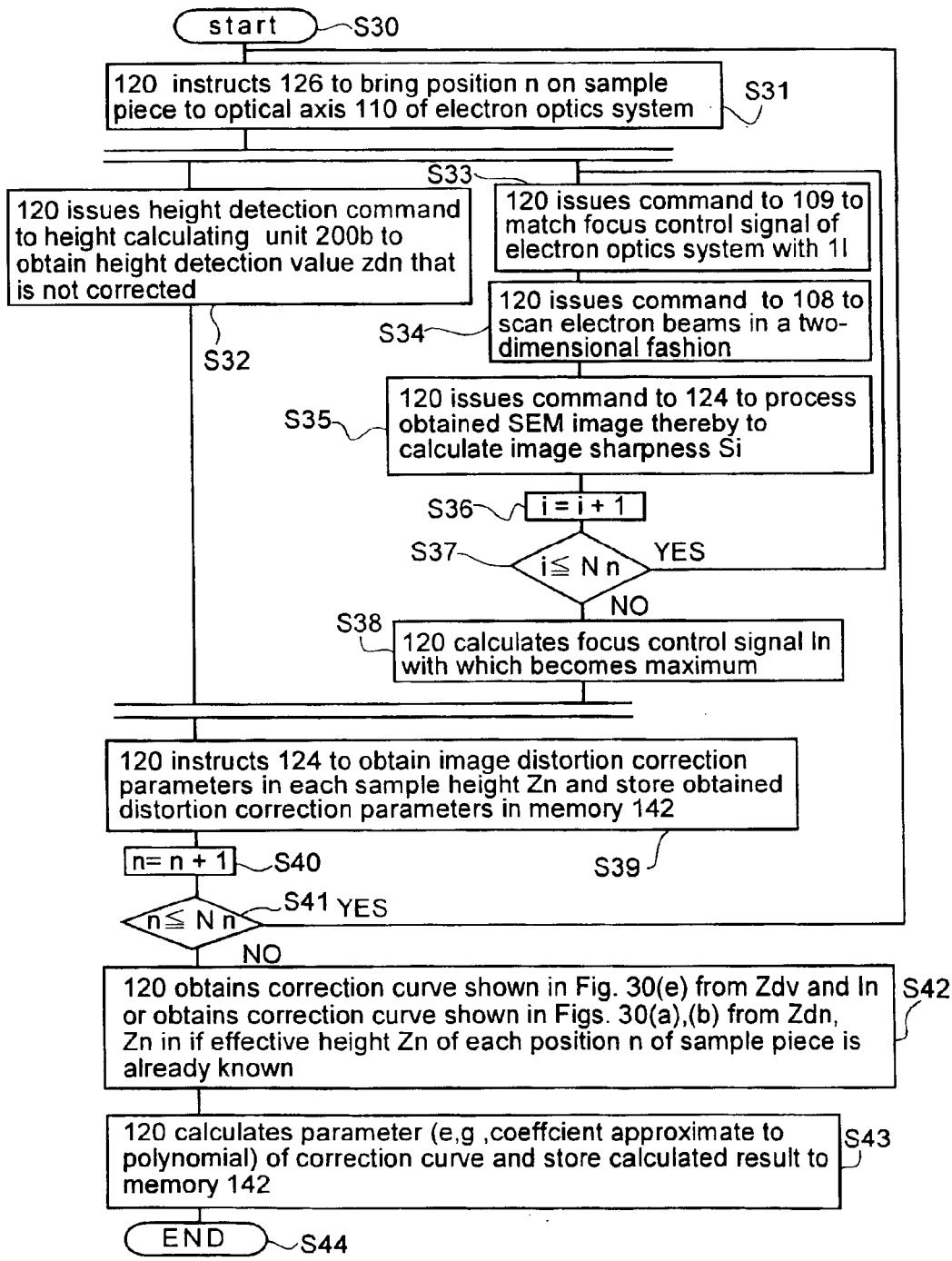
FIG. 38 is a flowchart showing a processing for calculating a parameter for correction.

Specifically, as shown in FIG. 38, the correction is made by using the correction standard pattern 130. In a step S30, a correction is started. In a step S31, the entirety control unit 120 issues a command to the stage control apparatus 126 in such a manner that the position n of the correction sample piece 130 is moved to the optical axis 110 of the electron optical system. Then, a step S32 and steps S33 to S38 are executed in parallel to each other.

In the step S32, the entirety control unit 120 issues a height detection command to the height calculating unit 200b to thereby obtain non-corrected height detection data Zdn. At the same time, in the steps 33, the entirety control unit 120 issues a command to the focus control apparatus 109 so that the focus control signal of the electron optical system (objective lens 103) matches Ii. Next, in the step S34, the entirety control unit 120 issues a command to the deflection control apparatus 108 so that electron beams are scanned in a one-dimensional or two-dimensional fashion. In the next step S35, the entirety control unit 120 issues a command to the image processing unit 124 so that the SEM image thus obtained is processed to calculate a visibility Si of an image. In the next step S36, i=i+1 is set in the focus control signal Ii of the electron optical system (objective lens 103). Until $i \leq Nn$ is satisfied in the step S37, the steps S33 to S35 are repeated to thereby obtain the visibility Si of the image in each focus control signal Ii.

If a NO is outputted in the inequality of $i \leq Nn$ in the step S37, then in the step S38, the entirety control unit 120 calculates the focus control signal In, in which the visibility Si of the image becomes maximum.

In the next step S39, the entirety control unit 120 issues a command to the image processing unit 124 in such a manner that the image processing unit obtains an image distortion parameter composed of an image magnification correction, an image rotation correction or the like in each height Zn in the correction sample piece 130 and stores the image distortion correction parameter thus obtained in the memory 142. In the next step S40, the position n on the sample piece 130 is set to n=n+1. Then, until $n \leq Nn$ is satisfied in a step S41, the steps S31 to S39 are repeated to thereby obtain the focus control signal In under which the visibility of the image in the height Zdn of each sample piece becomes maximum and the image distortion correction parameter composed of the image magnification correction, the image rotation correction or the like. If a NO is outputted in the inequality of $n \leq Nn$ at the step S41, then in a step S42, the entirety control unit 120 obtains a correction curve shown in FIG. 36(c) from the focus control signal In under which a visibility of an image in the non-corrected height detection value Zdn and the height Zdn of each sample piece becomes maximum or if the real height Zn of each position n of the sample piece 130 is already known, the entirety control unit obtains correction curves shown in FIGS. 36(a), (b) from Zdn, Zn, In. Then, in a step S43, the entirety control unit 120 obtains a parameter (e.g. coefficient approximate to polynomial) of the above-mentioned correction curve, and stores the parameter thus obtained in the memory 142. Then, the processing is ended (S44).

Figure 37A:
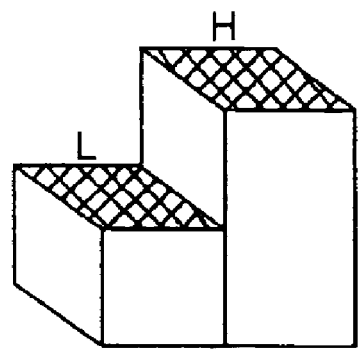
FIGS. 37(a) and 37(b) show in perspective view standard patterns for correction according to other embodiments of the present invention.
Figure 37B:
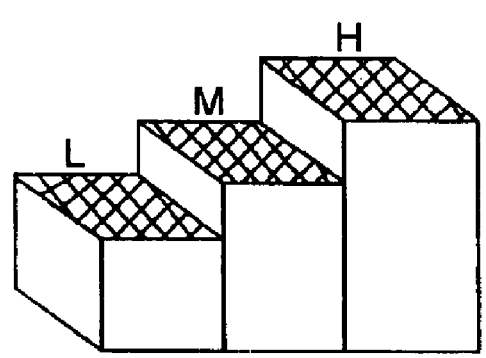

Incidentally, the correction standard pattern 130 shown in FIG. 35 has flat respective ends, and hence can correct a gain and an offset by effecting the correction in the above-mentioned two portions. While the correction standard pattern 130 has the correction curve of which the shape is stable, it is effective for executing a prompt correction when only a gain and an offset drift. When the shape of the correction curve is very stable and can be corrected by other methods, the gain and offset between the control currents to the optical system height detection optical apparatus 200a and the objective lens 103 may be corrected by the standard pattern having a one step difference as shown in FIG. 37(a). Moreover, when the shape of the correction curve is a simple shape that can be approximated by the quadratic function, there may be used the standard pattern having two step differences as shown in FIG. 37(b).

Furthermore, when the charged particle beam apparatus such as the SEM apparatus has the Z stage, the Z stage is moved and detected in height not by the standard pattern shown in FIG. 37, but by an ordinary pattern having no step difference, and the image is evaluated, thereby making it possible to correct the control currents to the height detection optical apparatus 200a and the objective lens 103. In this case, although the focus can be adjusted by the Z stage, if a responsive speed of the stage is not sufficient relative to a speed at which the observation portion is changed, then the stage is placed in the fixed state, and the focus can be adjusted by the control current to the objective lens 103.

Figure 39:
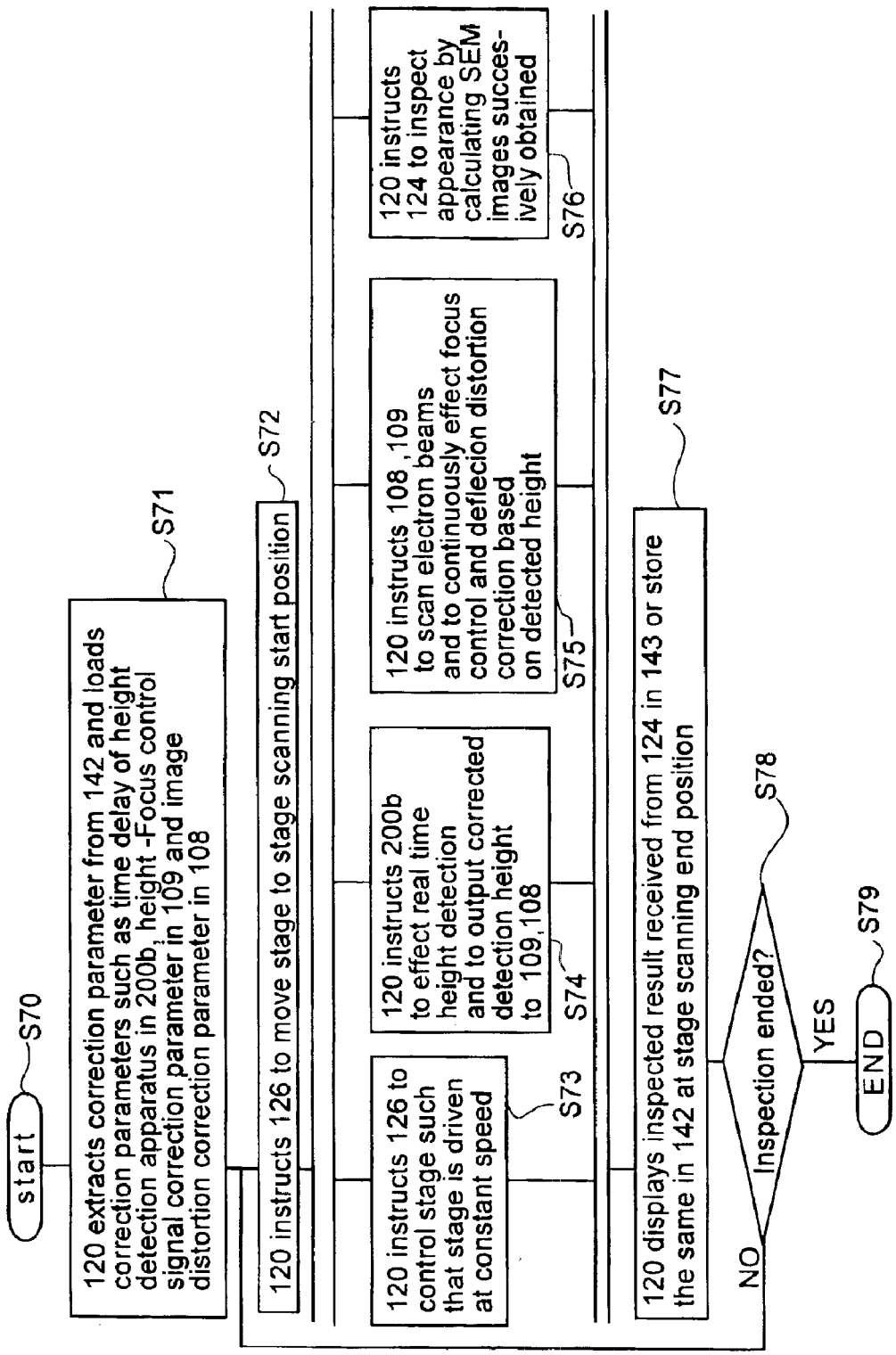
FIG. 39 is a flowchart in which a stage is driven at a constant speed and an appearance is inspected while an error is corrected by using a correction parameter in an electron beam inspection apparatus according to the present invention.

The manner in which the correction is executed by using the correction parameter thus obtained and an appearance is inspected on the basis of the SEM image in the SEM apparatus shown in FIG. 2 or 3 will be described with reference to a flowchart shown in FIG. 39. Specifically, in a step S70, the processing is started. In the next step S71, the entirety control unit 120 reads out the correction parameter from the memory 142, loads a height detection apparatus correction parameter to the height calculating unit 200b, loads a height-focus control signal correction parameter to the focus control apparatus 109, and loads an image distortion correction parameter such as an image magnification correction to the deflection control apparatus 108.

In the next step S72, the entirety control unit 120 issues a command to the stage control apparatus 126 so that the stage control apparatus moves the stage to a stage scanning start position. Then, steps S73, S74, S75, S76 are executed in parallel to each other. In the step S73, the entirety control unit 120 issues a command to the stage control apparatus 126 so that the stage control apparatus 126 drives the stage 2 with the inspected object 106 resting thereon at a constant speed. Simultaneously, in the step S74, the entirety control unit 120 issues a command to the height calculating unit 200b such that the height calculating unit 200b outputs correction detection height information 190 based on real time height detection and height detection apparatus correction parameters obtained from the height detection optical apparatus 200a to the focus control apparatus 109 and the deflection control apparatus 108. Further, at the same time, in the step S75, the entirety control apparatus 120 issues commands to the focus control apparatus 108 and the deflection control apparatus 109 such that the focus control apparatus 108 and the deflection control apparatus 109 continuously execute the focus control by using height-focus control signal correction parameters based on the scanning of electron beams and the corrected detection height and the deflection distortion correction by using the image distortion correction parameters such as image magnification correction based on the corrected detection height. Furthermore, at the same time, in the step S76, the entirety control unit 120 issues a command to the image processing unit 124 such that the appearance inspection is executed by obtaining SEM images continuously obtained from the image processing unit 124.

In the next step S77, at the stage scanning end position, the entirety control unit 120 displays the inspected result received from the image processing unit 124 on the display 143 or stores the above inspected result in the memory 142. If it is determined at the next step S78 that the inspection is not ended, then a control goes back to the step S72. If it is determined at the step S78 that the inspection is ended, the processing is ended (step S79).

While the SEM apparatus (electron beam apparatus) has been described so far in the above-mentioned embodiments, the present invention may be applied to other converging charged beam apparatus such a converging ion beam apparatus. In that case, the electron gun 101 may be replaced with an ion source. Then, in this case, while the secondary electron detector 104 is not always required, in order to monitor the state manufactured by the ion beams, a secondary electron detector or secondary ion detector may be disposed at the position of the secondary electron detector 104. Further, the present invention may also be applied to manufacturing apparatus of a wide sense which includes a pattern writing apparatus using electron beams. In this case, while the secondary electron detector 104 is not always required, because the main purpose is to utilize the electron beam for writing patterns on the sample 106, the secondary electron detector should preferably be used similarly in order to monitor the processing state or to align the position of the sample.

Figure 40:
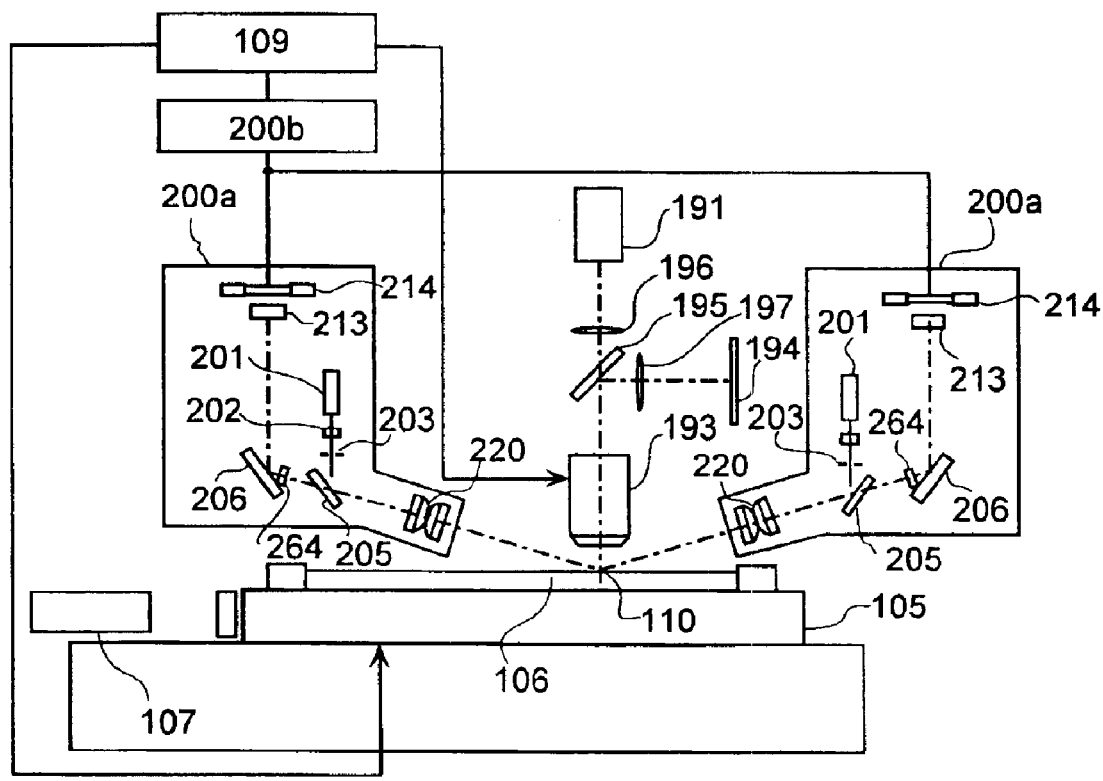
FIG. 40 is a schematic diagram showing an optical appearance inspection apparatus according to another embodiment of the present invention.

It is apparent that optical apparatus such as ordinary optical microscope, optical appearance inspection apparatus and optical exposure apparatus may similarly construct an automatic focus mechanism by using the present height detection apparatus if they have a mechanism for controlling a focus position. In the case of apparatus in which a sample is not elevated and lowered in order to achieve the properly-focused state but a focus position of an optical system is changed, such apparatus can receive particularly remarkable effects of characteristics of highly-accurate height detection of wide range achieved by the present height detection apparatus. FIG. 40 is a diagram showing the embodiment of this case. Only points different from those of FIG. 2 will be described. Reference numeral 191 denotes a light source from which illumination light is irradiated on the sample 106 through a lens 196, a half mirror 195, and an objective lens 193. This image is traveled through the objective lens 193, reflected by the half mirror 195, and focused on an image detector 194 through a lens 197. At that time, the focus of the objective lens 193 should be properly focused on the surface of the sample 106. At that time, light can be properly-focused at a high speed if the apparatus includes the height detector 200. In this embodiment shown in this sheet of drawing, light is properly-focused by elevating and lowering the objective lens 193 but instead light may be properly-focused by elevating and lowering the stage 105. However, if the objective lens 193 is elevated and lowered, then effects of characteristics in which the present height detector 200 can execute the highly-accurate height detection in a wide range can be demonstrated more remarkably. Alternatively, the properly-focused state may of course be established by elevating and lowering the whole of optical system comprising 191, 193, 195, 196, 197, 194. Further, an optical system appearance inspection apparatus may be arranged by adding the image processing unit 124 or the like shown in FIGS. 2 and 3 to the arrangement shown in FIG. 40. Furthermore, a laser material processing machine may be arranged by using the arrangement of the embodiment shown in FIG. 40.

According to the present invention, the image distortion caused by the deflection and the aberration of the electron optical system can be reduced, and the decrease of the resolution due to the de-focusing can be reduced so that the quality of the electron beam image (SEM image) can be improved. As a result, the inspection and the measurement of length based on the electron beam image (SEM image) can be executed with high accuracy and with high reliability.

Additionally, according to the present invention, if the height information of the surface of the inspected object detected by the optical height detection apparatus and the correction parameters between the focus control current or the focus control voltage of the electron optical system and the image distortion such as the image magnification error are obtained in advance, then the most clear electron beam image (SEM image) can be obtained from the inspected object without image distortion, and the inspection and the measurement of length based on the electron beam image (SEM image) can be executed with high accuracy and with high reliability.

Further, according to the present invention, in the electron beam system inspection apparatus, since the height of the surface of the inspected object can be detected real time and the electron optical system can be controlled real time, an electron beam image (SEM image) of high resolution without image distortion can be obtained by the continuous movement of the stage, and the inspection can be executed. Hence, an inspection efficiency and its stability can be improved. In addition, an inspection time can be reduced. In particular, the reduction of the inspection time is effective in increasing a diameter when the inspected object is the semiconductor wafer.

Furthermore, according to the present invention, similar effects can be achieved also in observation manufacturing apparatus using converging charged particle beams.

What is claimed is:

1. An electron beam apparatus, comprising:
  a table which mounts a specimen and is movable in three dimensional directions;
  an electron beam optical system including an electron beam source, an element for deflecting an electron beam emitted from the electron beam source, an objective lens for converging and irradiating the electron beam deflected by the deflection element onto a specimen, and a detector for detecting a secondary electron emanated from the specimen by the irradiation of the electron beam;
  a surface height detection system for detecting height of the surface of the specimen mounted on the table which includes a projection optical unit obliquely projecting a light onto a surface of the specimen, a detection optical unit for detecting light reflected from the surface of the specimen by the projection of the light, and a signal processing unit for calculating a height of the surface of the specimen by using signal outputted from the detection optical system;

a focus control system for controlling a relative position between a focus position of the electron beam optical system and the table in accordance with information of the height from the surface height detection unit; and an image processing system which obtains an image from the detected secondary electron and processes the obtained image to detect a defect on the surface of the specimen.

2. An electron beam apparatus according to the claim 1, wherein the focus control system controls a height of the table in accordance with height information from the surface height detection unit.

3. An electron beam apparatus according to the claim 1, wherein the focus control system controls a focus position of the electron beam optical system.

4. An electron beam apparatus according to the claim 1, wherein the focus control system controls the relative position between the focus position of the electron beam optical system and the table while the table is continuously moving.

5. A method of detecting a defect of a specimen, comprising the steps of:

projecting light onto a surface of a specimen mounted on a table from an oblique direction to the surface onto which an electron beam is converged and irradiated through an objective lens;

detecting with a sensor light reflected from the surface of the specimen by the projecting of the light;

calculating height of the surface of the specimen by using information of the reflected light obtained at the detecting step;

controlling a relative position between a focus position of an electron beam optical system and the surface of the specimen in accordance with information obtained at the calculating step;

obtaining an image of the surface of the specimen by irradiating and scanning a converged electron beam from the electron beam optical system, and detecting a secondary electron emanated from the surface of the specimen by the irradiation of the electron beam, the relative position between the focus position of the electron beam optical system and the surface of the specimen being controlled in the step of controlling; and processing the image obtained at the step of obtaining to detect a defect of the specimen.

6. A method according to claim 5, wherein the table is continuously moving at least in one direction while optically detecting height of the surface of the specimen mounted on the table.

7. A method according to the claim 5, wherein in the step of controlling, a height of the table is controlled by using calculated height information obtained at the step of calculating.

8. A method according to the claim 5, wherein in the step of controlling, a focus position of the electron beam optical system is controlled by using calculated height information obtained at the step of calculating.

9. A method of detecting a defect of a specimen, comprising the steps of:

irradiating and scanning an electron beam onto a specimen mounted on a table;

optically detecting height of a surface of the specimen mounted on the table by projecting light onto the surface of the specimen from an oblique direction of more than 60 degrees from a normal to the surface, and detecting light reflected from the specimen by the projected light;

controlling a relative position between a focused position of the electron beam and the surface of the specimen using optically detected height information obtained at the step of optically detecting;

obtaining an image of the surface of the specimen by detecting a secondary electron emanated from the surface by the irradiation of the electron beam focused on the surface of the specimen, the relative position of the forward position of the electron beam and the surface of the specimen being controlled by the step of controlling; and processing the image obtained at the step of obtaining to detect a defect of the specimen.

10. A method according to claim 9, further comprising the step of displaying the image of the surface of the specimen on a monitor screen.

11. A method according to claim 9, wherein the step of optically detecting height of the surface of the specimen includes projecting a light pattern onto the surface of the specimen from an oblique direction to the surface and detecting light reflected from the surface.

12. A method according to claim 9, wherein the step of processing includes comparing the obtained image with another obtained image to detect a defect.

13. A method according to claim 9, wherein the table continuously moves at least in one direction while optically detecting height of the surface of the specimen set on the table.

14. A method of inspecting a specimen, comprising the steps of:

irradiating and scanning an electron beam on a specimen mounted on a table;

optically detecting height of a surface of the specimen mounted on the table by projecting light onto the surface of the specimen from an oblique direction of more than 60 degrees from a normal to the surface and detecting light reflected from the specimen;

focusing the electron beam onto the surface of the specimen by controlling a relative position of a height direction between a focus position of an electron optical system from which the electron beam is launched and the table in accordance with information of the optically detected height;

obtaining an image of the surface of the specimen by detecting a secondary electron emanated from the surface of the specimen by the irradiation of the electron beam focused on the surface; and processing the obtained image to detect a defect of the specimen.

15. A method according to claim 14, wherein the step of optically detecting height of the surface of the specimen includes projecting a light pattern onto the surface of the specimen from an oblique direction to the surface and detecting light reflected from the surface.

16. A method according to claim 14, wherein the step of processing includes comparing the obtained image with another obtained image to detect a defect.

17. A method according to claim 14, wherein the table continuously moves at least in one direction while optically detecting height of the surface of the specimen mounted on the table.

* * * * *